US009129857B2

(12) United States Patent
Kim et al.

(10) Patent No.: US 9,129,857 B2
(45) Date of Patent: Sep. 8, 2015

(54) SEMICONDUCTOR DEVICE INCLUDING A FIRST CORE PATTERN UNDER A SECOND CORE PATTERN

(75) Inventors: Bi-O Kim, Seoul (KR); Byong-Ju Kim, Seoul (KR); Jung-Geun Jee, Seoul (KR); Jin-Gyun Kim, Yongin-si (KR); Jae-Young Ahn, Seongnam-si (KR); Ki-Hyun Hwang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 356 days.

(21) Appl. No.: 13/560,022

(22) Filed: Jul. 27, 2012

(65) Prior Publication Data
US 2013/0032878 A1  Feb. 7, 2013

(30) Foreign Application Priority Data

Aug. 3, 2011  (KR) .................. 10-2011-0077412

(51) Int. Cl.
*H01L 29/792* (2006.01)
*H01L 27/115* (2006.01)
*H01L 21/336* (2006.01)

(52) U.S. Cl.
CPC ...... *H01L 27/1157* (2013.01); *H01L 27/11582* (2013.01)

(58) Field of Classification Search
CPC .................. H01L 27/11582; H01L 27/11556; H01L 27/1157; H01L 27/11568
See application file for complete search history.

(56) References Cited

U.S. PATENT DOCUMENTS

| 8,247,863 | B2 * | 8/2012 | Fukuzumi et al. | 257/324 |
| 8,450,176 | B2 * | 5/2013 | Son et al. | 438/261 |
| 2005/0079721 | A1 * | 4/2005 | Buerger et al. | 438/696 |
| 2009/0090959 | A1 * | 4/2009 | Nishihara et al. | 257/324 |
| 2009/0090960 | A1 * | 4/2009 | Izumi et al. | 257/324 |
| 2009/0108333 | A1 * | 4/2009 | Kito et al. | 257/324 |
| 2009/0173981 | A1 * | 7/2009 | Nitta | 257/302 |
| 2009/0180324 | A1 * | 7/2009 | Ramaswamy et al. | 365/185.17 |
| 2010/0117137 | A1 * | 5/2010 | Fukuzumi et al. | 257/324 |
| 2010/0224929 | A1 | 9/2010 | Jeong et al. | |
| 2010/0244119 | A1 * | 9/2010 | Fukuzumi et al. | 257/324 |
| 2010/0314678 | A1 * | 12/2010 | Lim et al. | 257/324 |
| 2011/0013454 | A1 * | 1/2011 | Hishida et al. | 365/185.11 |
| 2011/0062510 | A1 * | 3/2011 | Joo | 257/324 |
| 2011/0147824 | A1 * | 6/2011 | Son et al. | 257/324 |
| 2011/0156132 | A1 * | 6/2011 | Kiyotoshi | 257/326 |

(Continued)

FOREIGN PATENT DOCUMENTS

JP  2010-114370 A  5/2010
KR  2010-0034612 A  4/2010

(Continued)

*Primary Examiner* — Laura Menz
*Assistant Examiner* — Maliheh Malek
(74) *Attorney, Agent, or Firm* — Harness, Dickey & Pierce, P.L.C.

(57) ABSTRACT

According to example embodiments, a semiconductor device includes horizontal patterns stacked on a substrate. The horizontal patterns define an opening through the horizontal patterns. A first core pattern is in the opening. A second core pattern is in the opening on the first core pattern. A first active pattern is between the first core pattern and the horizontal patterns. A second active pattern containing a first element is between the second core pattern and the horizontal patterns. The second active pattern contains the first element at a higher concentration than a concentration of the first element in the second core pattern.

20 Claims, 67 Drawing Sheets

(56) References Cited

U.S. PATENT DOCUMENTS

| | | | |
|---|---|---|---|
| 2011/0193153 A1* | 8/2011 | Higuchi et al. | 257/324 |
| 2011/0316069 A1* | 12/2011 | Tanaka et al. | 257/324 |
| 2012/0001250 A1* | 1/2012 | Alsmeier | 257/319 |
| 2012/0039130 A1* | 2/2012 | Yoon et al. | 365/185.18 |
| 2012/0051137 A1* | 3/2012 | Hung et al. | 365/185.17 |
| 2012/0083077 A1* | 4/2012 | Yang et al. | 438/156 |
| 2012/0156848 A1* | 6/2012 | Yang et al. | 438/287 |
| 2012/0181596 A1* | 7/2012 | Liu | 257/316 |
| 2012/0228697 A1* | 9/2012 | Youm et al. | 257/329 |
| 2012/0231593 A1* | 9/2012 | Joo et al. | 438/264 |
| 2012/0256247 A1* | 10/2012 | Alsmeier | 257/319 |
| 2012/0299005 A1* | 11/2012 | Lee | 257/66 |
| 2012/0299076 A1* | 11/2012 | Yoo et al. | 257/314 |
| 2013/0069141 A1* | 3/2013 | Pan et al. | 257/324 |
| 2013/0264626 A1* | 10/2013 | Sawa | 257/316 |
| 2014/0070302 A1* | 3/2014 | Yoo et al. | 257/324 |
| 2014/0117434 A1* | 5/2014 | Fukuzumi et al. | 257/326 |
| 2014/0252452 A1* | 9/2014 | Alsmeier | 257/324 |
| 2014/0264548 A1* | 9/2014 | Lee et al. | 257/324 |

FOREIGN PATENT DOCUMENTS

| | | |
|---|---|---|
| KR | 2010-0052416 A | 5/2010 |
| KR | 2010-0100396 A | 9/2010 |

* cited by examiner

SEMICONDUCTOR DEVICE INCLUDING A FIRST CORE PATTERN UNDER A SECOND CORE PATTERN

CROSS-REFERENCE TO RELATED APPLICATION

This application claims priority under 35 U.S.C. §119 to Korean Patent Application No. 10-2011-0077412 filed on Aug. 3, 2011, the disclosure of which is hereby incorporated by reference in its entirety.

BACKGROUND

1. Field

Example embodiments of inventive concepts relate to a semiconductor device, a method of fabricating the same, and/or an electronic device and electronic system adopting the semiconductor device.

2. Description of Related Art

Research on how to reduce planar areas occupied by components of a semiconductor device is being conducted.

SUMMARY

Example embodiments of inventive concepts relate to 3-dimensional semiconductor devices.

Example embodiments of inventive concepts relate to semiconductor devices including first and second active patterns formed within an opening penetrating horizontal patterns.

Example embodiments of inventive concepts relate to methods of fabricating semiconductor devices.

Example embodiments of inventive concepts relate to an electronic device and electronic system including semiconductor devices.

Example embodiments of inventive concepts are not be limited by the above description, and other unmentioned aspects will be understood by one of ordinary skill in the art from the description herein.

According to example embodiments of inventive concepts, a semiconductor device includes horizontal patterns stacked on a substrate. The horizontal patterns define at least one opening through the horizontal patterns. A first core pattern is in the opening. A second core pattern is in the opening on the first core pattern. A first active pattern is between the first core pattern and the horizontal patterns. A second active pattern containing a first element is between the second core pattern and the horizontal patterns. The second active pattern contains the first element at a higher concentration than a concentration of the first element in the second core pattern.

The first element may be a Group-III element.

The second active pattern may contain the first element at a higher concentration than a concentration of the first element in the first active pattern.

The second active pattern may include a portion doped with the first element, and the second core pattern may not be doped with the first element.

The first and second active patterns may be crystalline semiconductor patterns.

The semiconductor device may further include pad patterns on the second core pattern. Each of the pad patterns may be electrically connected to the second active pattern and each of the pad patterns may have an N conductivity type. A first portion of the second active pattern adjacent to the pad pattern may have an N conductivity type. A second portion of the second active pattern under the first portion of the second active thereof may have a P conductivity type.

The first and second portions of the second active pattern may form a PN junction at a lower level than the pad pattern.

A vertical thickness of the first core pattern may be greater than a vertical thickness of the second core pattern.

The second active pattern may further include a portion between the first and second core patterns.

According to example embodiments of inventive concepts, a semiconductor device includes horizontal patterns stacked on a substrate. The horizontal patterns define at least one opening through the horizontal patterns. A core pattern is in the opening. The core pattern includes a first core pattern under a second core pattern. The first and second core patterns have non-equal horizontal widths. First and second active patterns are between the horizontal patterns and the core pattern. The second active pattern is on the first active pattern and has a different horizontal width than the first active pattern.

The horizontal patterns may include an interlayer pattern and a first conductive pattern alternately stacked on the substrate, a middle insulating pattern and a second conductive pattern alternately stacked on the first conductive pattern, and an upper insulating pattern on the second conductive pattern. The middle insulating pattern may include a vertical thickness that is greater than a vertical thickness of the interlayer pattern. A vertical level of an interface between the first and second active patterns is between vertical levels of the first and second conductive patterns.

The semiconductor device may further include a dielectric material between the first active pattern and the first conductive pattern. The dielectric material may include a tunnel oxide and a data storage material.

A vertical thickness of the first core pattern may be greater than a vertical thickness of the second core pattern.

A horizontal width of the second active pattern may be smaller than a horizontal width of the first active pattern.

A horizontal width of the second active pattern may be greater than a horizontal width of the first active pattern.

According to example embodiments, a semiconductor device includes at least one pillar extending through an opening defined by horizontal patterns on a substrate. Each pillar may include a first core pattern, a first active pattern surrounding the first core pattern, a second core pattern on the first core pattern, a second active pattern surrounding the second core pattern, and a gate dielectric pattern between at least part of the horizontal patterns and the first and second active patterns. The second active pattern may contain a first element at a higher concentration than the second core pattern.

The horizontal patterns may include alternating conductive and interlayer patterns stacked on the substrate. Each pillar may further include a pad on the second core pattern.

A horizontal width of the first active pattern may be different than a horizontal width of the second active pattern.

Each pillar may be a cylindrical shape that extends in a vertical direction from the substrate.

According to example embodiments, a semiconductor system includes one of a processor and a controller, and at least one of the foregoing semiconductor devices connected to the one of the processor and the controller.

BRIEF DESCRIPTION OF THE DRAWINGS

The foregoing and other features and advantages of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION OF THE EMBODIMENTS

Figure 1A:
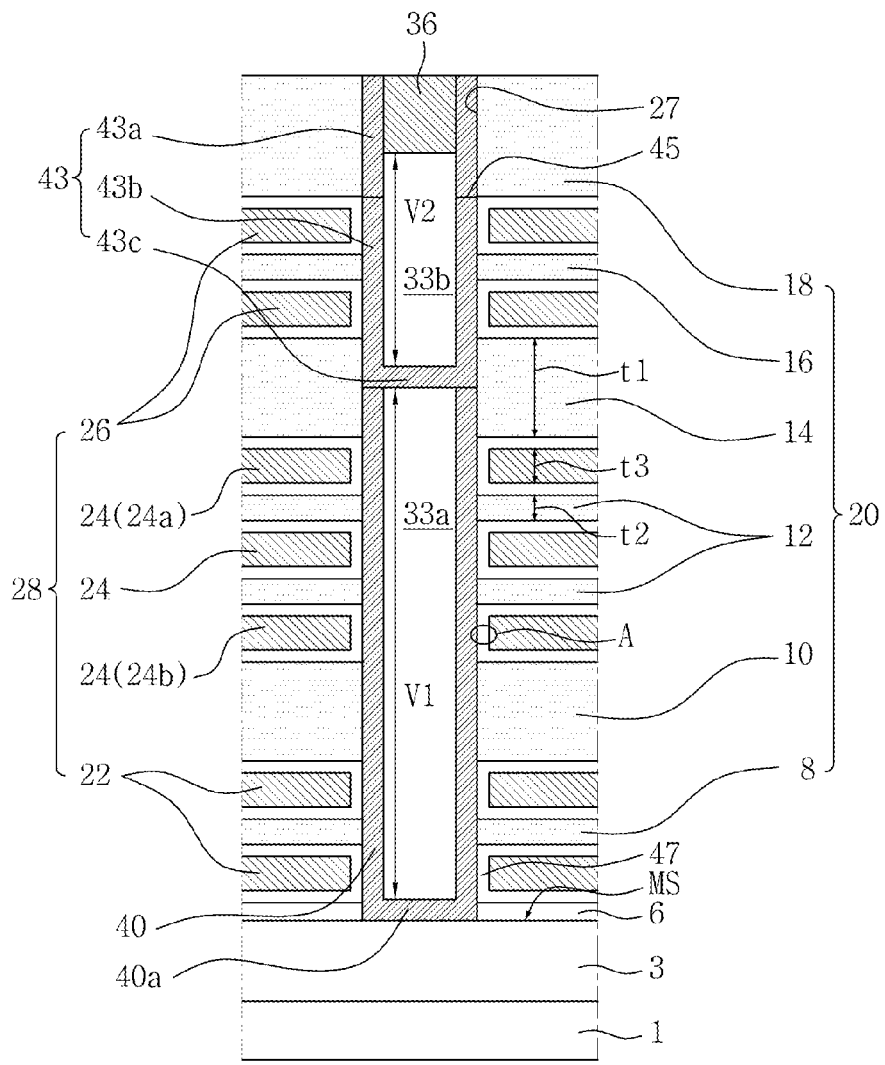
FIG. 1A is a cross-sectional view of a semiconductor device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-section, plan, and block illustrations that are schematic illustrations of idealized embodiments of the inventive concept. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of inventive concepts.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

To begin with, semiconductor devices according to example embodiments of inventive concepts will now be described with reference to FIGS. 1 through 15.

Figure 1B:
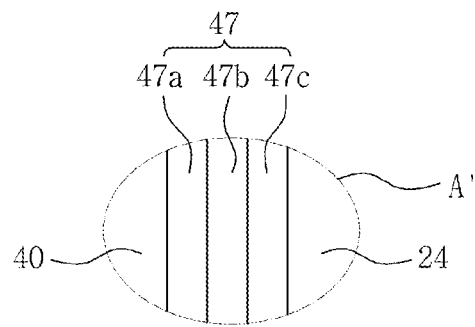
FIG. 1B is an enlarged view of a portion A of FIG. 1A.

FIGS. 1A and 1B illustrate a semiconductor device according to example embodiments of inventive concepts.

Referring to FIGS. 1A and 1B, a substrate 1 may be provided. The substrate 1 may be a semiconductor substrate. For example, the substrate 1 may be a silicon (Si) substrate, a germanium (Ge) substrate, or a SiGe substrate. The substrate 1 may be a semiconductor-on-insulator substrate, for example a silicon-on-insulator (SOI) layer. However, example embodiments are not limited thereto.

The substrate 1 may include a memory cell array region where memory cells are formed and a peripheral circuit region where peripheral circuits configured to operate the memory cells are formed. An impurity region 3 may be provided in the substrate 1. The impurity region 3 may include a well region, for example a p-type well region.

Horizontal patterns 20 and 28 may be stacked on the substrate 1. Each of the horizontal patterns 20 and 28 may be horizontal with respect to a main surface of the substrate 1. The horizontal patterns 20 and 28 may include conductive patterns 28 and interlayer insulating patterns 20.

The conductive patterns 28 may be spaced apart from one another by the interlayer insulating patterns 20. The conductive patterns 20 may include at least one lower conductive pattern 22, at least one middle conductive pattern 24, and at least one upper conductive pattern 26. The middle conductive patterns 24 may be disposed at a higher level than the lower conductive patterns 22, while the at least one upper conductive pattern 26 may be disposed at a higher level than the middle conductive patterns 24.

According to example embodiments, the conductive patterns 28 may be used as gate electrodes and/or gate interconnection lines of a semiconductor memory device. The at least one lower conductive pattern 22 interposed between a lowermost cell gate electrode 24b of the cell gate electrodes and the substrate 1 may be used as a ground selection gate electrode, while the at least one upper conductive pattern 26 disposed on an uppermost cell gate electrode 24a of the cell electrodes 24 may be used as a string selection gate electrode 26.

The conductive patterns 28 may include at least one of a doped semiconductor (e.g., doped silicon), a metal (e.g., tungsten (W), copper (Cu), or aluminum (Al)), a conductive metal nitride (e.g., titanium nitride (TiN), tantalum nitride (TaN), or tungsten nitride (WN)), a conductive metal-semiconductor compound (e.g., a metal silicide), and a transitional metal (e.g., Ti or Ta). The interlayer insulating patterns 20 may be formed of an insulating material, such as silicon oxide or silicon oxynitride, but example embodiments are not limited thereto.

A buffer insulating pattern 6 may be provided between the lower conductive pattern 22 and the substrate 1. The buffer insulating pattern 6 may include an insulating oxide. For example, the buffer insulating pattern 6 may be formed of an insulating material, such as silicon oxide (SiO) or silicon oxynitride (SiON), but example embodiments are not limited thereto. Alternatively, the buffer insulating pattern 6 may be omitted.

The interlayer insulating patterns 20 may include a lower interlayer pattern 8, a lower insulating pattern 10, a middle interlayer pattern 12, a middle insulating pattern 14, an upper interlayer pattern 16, and an upper insulating pattern 18.

When a plurality of lower conductive patterns 22 are provided, the lower interlayer pattern 8 may be provided between the lower conductive patterns 22. When a plurality of upper conductive patterns 26 are provided, the upper interlayer pattern 16 may be provided between the upper conductive patterns 26. The middle interlayer pattern 12 may be provided between the middle conductive patterns 24.

The lower insulating pattern 10 may be provided between the lower middle conductive pattern 24b of the middle conductive patterns 24 and the lower conductive pattern 22. The middle insulating pattern 14 may be provided between the upper middle conductive pattern 24a of the middle conductive patterns 24 and the upper conductive pattern 26. The upper insulating pattern 18 may be provided on the upper conductive pattern 26.

A vertical thickness t1 of the middle insulating pattern 14 may be greater than a vertical thickness t2 of the middle interlayer pattern 12. Similarly, a vertical thickness of the lower insulating pattern 10 may be greater than a vertical thickness of the middle interlayer insulating pattern 12. The vertical thickness t1 of the middle insulating pattern 14 may be greater than a vertical thickness t3 of the middle conductive pattern 24.

The term "vertical thickness" may refer to a thickness measured in a vertical direction, and the term "horizontal width" may refer to a width measured in a horizontal direction. Here, the vertical direction may refer to a direction perpendicular to a main surface MS, while the horizontal direction may refer to a direction horizontal with respect to the main surface MS.

An opening 27 may penetrate the horizontal patterns 20 and 28 and the buffer insulating pattern 6. The opening 27 may penetrate the horizontal patterns 20 and 28 and the buffer insulating pattern 6 and expose the impurity region 3 of the substrate 1.

A pad pattern 36 may be provided in an upper region of the opening 27. The pad pattern 36 may include crystalline silicon. For example, the pad pattern 36 may be formed of polysilicon (poly-Si). However, example embodiments are not limited thereto. The pad pattern 36 may be electrically connected to an interconnection line (e.g., bitline, not shown) over the pad pattern 36.

Core patterns 33a and 33b may be provided within the opening 27 between the substrate 1 and the pad pattern 36. The core pattern 33a and 33b may include a first core pattern 33a and a second core pattern 33b. The second core pattern 33b may be provided on the first core pattern 33a. The first core pattern 33a may be adjacent to the substrate 1, while the second core pattern 33b may be provided between the pad pattern 36 and the first core pattern 33a. A vertical thickness V1 of the first core pattern 33a may be greater than a vertical thickness V2 of the second core pattern 33b.

The first and second core patterns 33a and 33b may be formed of the same insulating material, for example, silicon oxide; however, example embodiments are not limited thereto.

Alternatively, the first and second core patterns 33a and 33b may be formed of insulating materials having an etch selectivity with respect to each other. The second core pattern 33b may be formed of an oxide having a different etch rate to an oxide etchant from the first core pattern 33a. The first core pattern 33a may include a first oxide, while the second core pattern 33b may include a second oxide formed using a different method from a method of forming the first oxide. The first core pattern 33a may be formed of a first oxide having a first density, while the second core pattern 33b may be formed of a second oxide having a second density lower than the first density. Here, the second oxide having the second density lower than the first density of the first oxide may have a higher etch rate to the oxide etchant than the first oxide.

First and second active patterns 40 and 43 may be provided within the opening 27. The first active pattern 40 may be provided between the first core pattern 33a and the horizontal patterns 20 and 28. The first active pattern 40 may surround sidewalls of the first core pattern 33a. Furthermore, the first active pattern 40 may further include a bottom portion 40a extending between the first core pattern 33a and the substrate 1. That is, the first active pattern 40 may surround the sidewalls of the first core pattern 33a and cover the bottom of the first core pattern 33a.

The second active pattern 43 may be provided over the first active pattern 40 between the second core pattern 33b and the horizontal patterns 20 and 28. That is, the second active pattern 43 may surround sidewalls of the second core pattern 33b. The second active pattern 43 may include a portion extending between the pad pattern 36 and the horizontal patterns 20 and 28. That is, the second active pattern 43 may be interposed between the pad pattern 36 and the horizontal patterns 20 and 28 and interposed between the second core pattern 33b and the horizontal patterns 20 and 28. The first and second core patterns 33a and 33b may be spaced apart from each other. The second active pattern 43 may include a bottom portion 43c extending between the first and second core patterns 33a and 33b. That is, the second active pattern 43 may surround the sidewalls of the second core pattern 33b and cover the bottom of the second core pattern 33b.

An interface between the first and second active patterns 40 and 43 may be interposed between the uppermost middle conductive pattern 24a of the middle conductive patterns 24 and the upper conductive pattern 26. That is, an interface between the first and second active patterns 40 and 43 may be adjacent to the middle insulating pattern 14.

The first and second active patterns 40 and 43 may be crystalline semiconductor patterns. The first and second active patterns 40 and 43 may be formed of a crystalline semiconductor material. For example, the first and second active patterns 40 and 43 may be formed of a single crystalline silicon layer or a poly-Si layer.

A PN junction 45 may be provided within the second active pattern 43. On the basis of the PN junction 45, the second active pattern 43 may include a first portion 43a disposed adjacent to the pad pattern 36 and a second portion 43b disposed adjacent to the first active pattern 40. The first portion 43a of the second active pattern 43 may have an N conductivity type, while the second portion 43b of the second active pattern 43 may have a P conductivity type. Also, the pad pattern 36 may have an N conductivity type. The PN junction 45 may be provided within the second active pattern 43 disposed at a lower level than the pad pattern 36.

According to example embodiments, the PN junction 45 may be provided within the second active pattern 43 between the pad pattern 36 and the upper conductive pattern 26. For example, the PN junction 45 may be provided within the second active pattern 43 between an uppermost upper conductive pattern of the upper conductive pattern 26 and the pad pattern 36.

The PN junction 45 may be provided within the second active pattern 43 adjacent to a top surface of the uppermost upper conductive pattern of the upper conductive pattern 26. For example, the PN junction 45 may be provided within the second active pattern 43 disposed at substantially the same level as the top surface of the uppermost upper conductive pattern of the upper conductive pattern 26.

The first active pattern 40 may include an intrinsic semiconductor, while the bottom portion 43c of the second portion 43b of the second active pattern 43 may include a p-type semiconductor. For example, the first active pattern 40 may be formed of an undoped silicon layer, while the bottom portion 43c of the second portion 43b of the second active pattern 43 may be formed of a doped silicon layer including a Group-III element. The Group-III element may be, for example, boron (B) or aluminum (Al). Thus, the first and second active patterns 40 and 43 may be formed of poly-Si layers having different electrical properties.

Alternatively, the first active pattern 40 may include an N-type semiconductor, while the second portion 43b of the second active pattern 43 may include a P-type semiconductor.

According to example embodiments, the second portion 43b of the second active pattern 43 and the first active pattern 40 may include p-type semiconductors having different dopant concentrations. For example, the second portion 43b of the second active pattern 43 may include a Group-III element at a higher concentration than the first active pattern 40. For instance, a concentration of the Group-III element (e.g., B) contained in the second portion 43b of the second active pattern 43 may be higher than a concentration of the Group-III element (e.g., B) contained in the first active pattern 40. That is, a Group-III dopant concentration of the second portion 43b of the second active pattern 43 may be higher than a Group-III dopant concentration of the first active pattern 40.

A concentration of a first element of the second active pattern 43 may be higher than a concentration of the first element of the second core pattern 33b. Also, the concentration of the first element of the second active pattern 43 may be higher than the concentration of the first element of the first core pattern 33a. Furthermore, the concentration of the first element of the second active pattern 43 may be higher than the concentration of the first element of the first active pattern 40. The first element may be a Group-III element of the Periodic Table of the elements. For example, the first element may be B. The second active pattern 43 may contain a portion doped with the first element. For example, the second portion 43b of the second active pattern 43 may be doped with the first element (e.g., a Group-III element such as B) and exhibit P-type semiconductor characteristics. Since the second core pattern 33b is formed after the second active pattern 43 is doped with the first element, the second core pattern 33b may not be doped with the first element. Accordingly, the second core pattern 33b may not include the first element. For example, a middle portion of the second core pattern 33b may not include the first element.

A gate dielectric 47 may be provided between the first and second active patterns 40 and 43 and the conductive patterns 28. That is, the gate dielectric 47 may be provided between the conductive patterns 28 and the first active pattern 40 and provided between the conductive patterns 28 and the second active pattern 43. Furthermore, the gate dielectric 47 may extend to cover top and bottom surfaces of the conductive pattern 28 disposed adjacent thereto. That is, the gate dielectric 47 may be interposed between the first and second active patterns 40 and 43 and the conductive patterns 28 and also interposed between the conductive patterns 28 and the interlayer insulating patterns 20.

As shown in FIG. 1B, the gate dielectric 47 may include a tunnel dielectric material 47a, a data storage layer 47b, and a blocking layer 47c. The data storage layer 47b may be interposed between the tunnel dielectric material 47a and the blocking layer 47c. The tunnel dielectric material 47a may be disposed adjacent to the first and second active patterns 40 and 43, and the blocking layer 47c may be disposed adjacent to the conductive patterns 28. The tunnel dielectric material 47a may include at least one of a silicon oxide layer and a nitrogen (N)-doped silicon oxide layer. The data storage layer 47b may be configured to store data in a nonvolatile memory device, such as a flash memory device. For example, the data storage layer 47b may be a material layer capable of trapping charges to store data. The data storage layer 47b may be formed of a material capable of trapping electrons injected from the first active pattern 40 through the tunnel dielectric material 47a and retaining the trapped electrons according to operation conditions of a device or erasing the trapped electrons from the data storage layer 47b. For example, the data storage layer 47b may include at least one of silicon nitride and a high-k dielectric material. The high-k dielectric material may include a dielectric material (e.g., aluminum oxide (AlO), zirconium oxide (ZrO), hafnium oxide (HfO), or lanthanum oxide (LaO)), which has a higher dielectric constant than silicon oxide. The blocking layer 47c may include a high-k dielectric material (e.g., a metal oxide, such as HfO and/or AlO) having a higher dielectric constant than the tunnel dielectric material 47a. Furthermore, the blocking layer 47c may further include a barrier dielectric material (e.g., silicon oxide) having a higher energy bandgap than the high dielectric material. The barrier dielectric material may be interposed between the high-k dielectric material and the data storage layer 47b. In addition, the barrier dielectric material may be interposed between the data storage layer 47b and the conductive patterns 28.

The upper conductive pattern 26, the second portion 43b of the second active pattern 43, and the gate dielectric 47 interposed between the second portion 43b and the upper conductive pattern 26 may constitute a string selection transistor. The second portion 43b of the second active pattern 42 may be used as a channel region of the string selection transistor. According to example embodiments of inventive concepts, a structure selectively doped with a Group-III element may be provided in the second portion 43b of the second active pattern 43, which is used as the channel region of the string selection transistor. Thus, since impurities may be selectively doped in the channel region of the string selection transistor, a threshold voltage of the string selection transistor may be selectively controlled. Accordingly, dispersion of the threshold voltage of the string selection transistor may be improved.

In addition, the middle conductive patterns 28, the first active pattern 40, and the gate dielectric 40 interposed between the middle conductive patterns 28 and the first active pattern 40 may constitute memory cell transistors. Information (or data) may be stored in the data storage layer 40b of the gate dielectric 40 interposed between the middle conductive patterns 28 and the first active pattern 40. The number of the middle conductive patterns 28 may be appropriately selected according to the capacity of a nonvolatile memory device.

Furthermore, the lower conductive pattern 22, the first active pattern 40, and the gate dielectric 47 interposed between the lower conductive pattern 22 and the first active pattern 40 may constitute a ground selection transistor.

Semiconductor devices according to the embodiments of inventive concepts are not limited to the semiconductor device according to example embodiments described with reference to FIG. 1A and may be variously modified. Hereinafter, variously modified semiconductor devices will be described centering on modified portions of the semiconductor device according to example embodiments described with reference to FIG. 1A.

Figure 2:
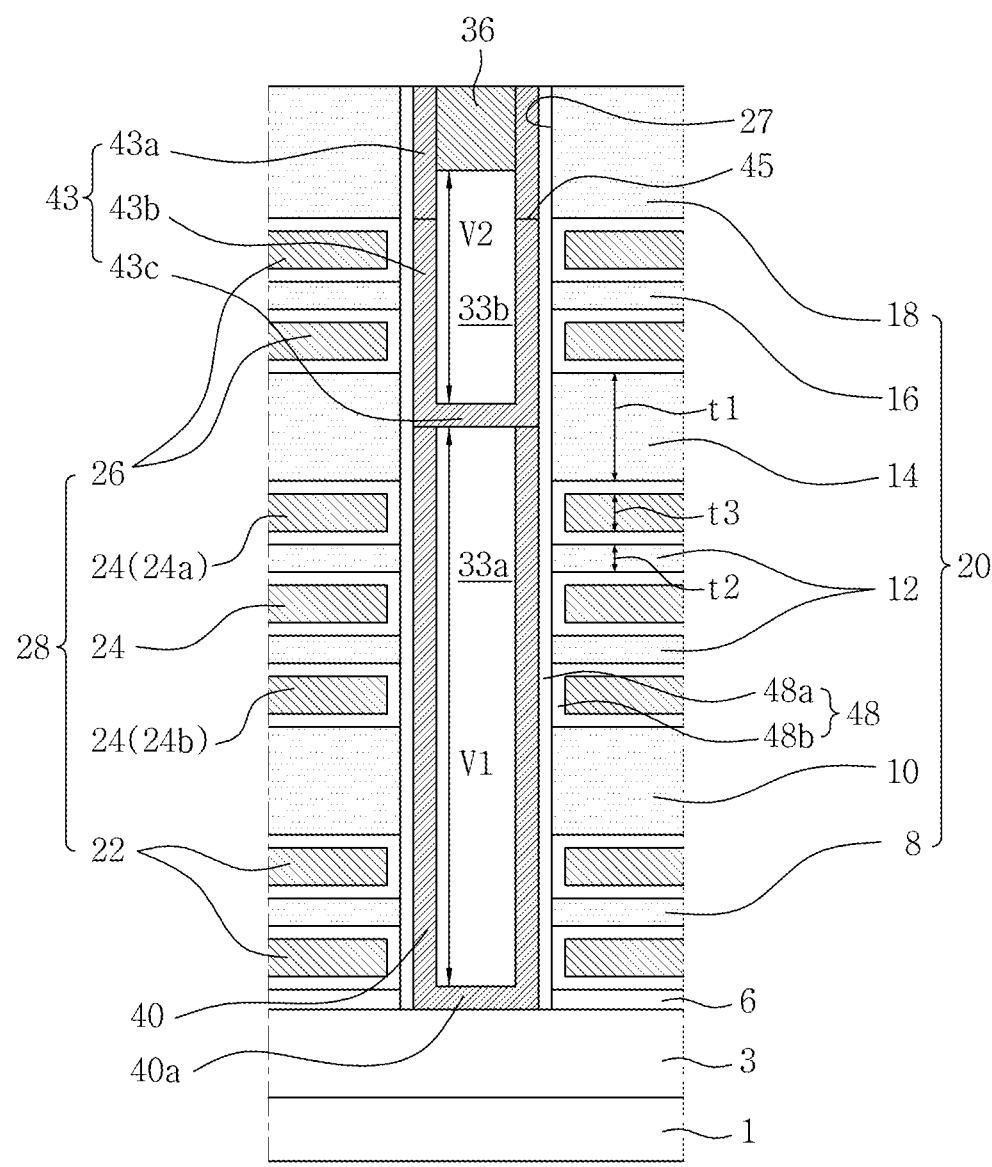
FIG. 2 is a cross-sectional view of a modified example of the semiconductor device shown in FIG. 1A.

FIG. 2 is a cross-sectional view of a modified example of the semiconductor device shown in FIG. 1A.

Referring to FIG. 2, the gate dielectric 47 described with reference to FIG. 1A may be modified into a gate dielectric 48 shown in FIG. 2. The modified gate dielectric 48 may include a first portion 48a and a second portion 48b. The first portion 48a of the gate dielectric 48 may be provided on sidewalls of the first and second active patterns 40 and 43 adjacent to the horizontal patterns 20 and 28. That is, the first portion 48a of the gate dielectric 48 may be interposed between the horizontal patterns 20 and 28 and the first and second active patterns 40 and 43.

The second portion 48b of the gate dielectric 48 may be interposed between the first portion 48a of the gate dielectric 48 and the conductive patterns 28 and also interposed between the conductive patterns 28 and the interlayer insulating patterns 20. That is, the second portion 48b of the gate dielectric 48 may cover sidewalls of the conductive patterns 28 adjacent to the first and second active patterns 40 and 43 and cover top and bottom surfaces of each of the conductive patterns 28.

The first portion 48a of the gate dielectric 48 may include at least a portion of the tunnel dielectric material 47a described with reference to FIG. 1B. The second portion 48b of the gate dielectric 48 may include at least a portion of the blocking layer 47c described with reference to FIG. 1B. Any one of the first and second portions 48a and 48b of the gate dielectric 48 may include the data storage layer 47b described with reference to FIG. 1B. For example, the first portion 48a may include the tunnel dielectric material 47a, the data storage layer 47b, and the blocking layer 47c described with reference to FIG. 1B, while the second portion 48b may include a high-k dielectric material of the blocking layer 47c described with reference to FIG. 1B. However, example embodiments are not limited thereto, and the first and second portions 48a and 48b may be configured as different types. For instance, the first portion 48a may include the tunnel dielectric material 47a described with reference to FIG. 1B, while the second portion 48b may include the data storage layer 47b and the blocking layer 47c described with reference to FIG. 1B.

Figure 3:
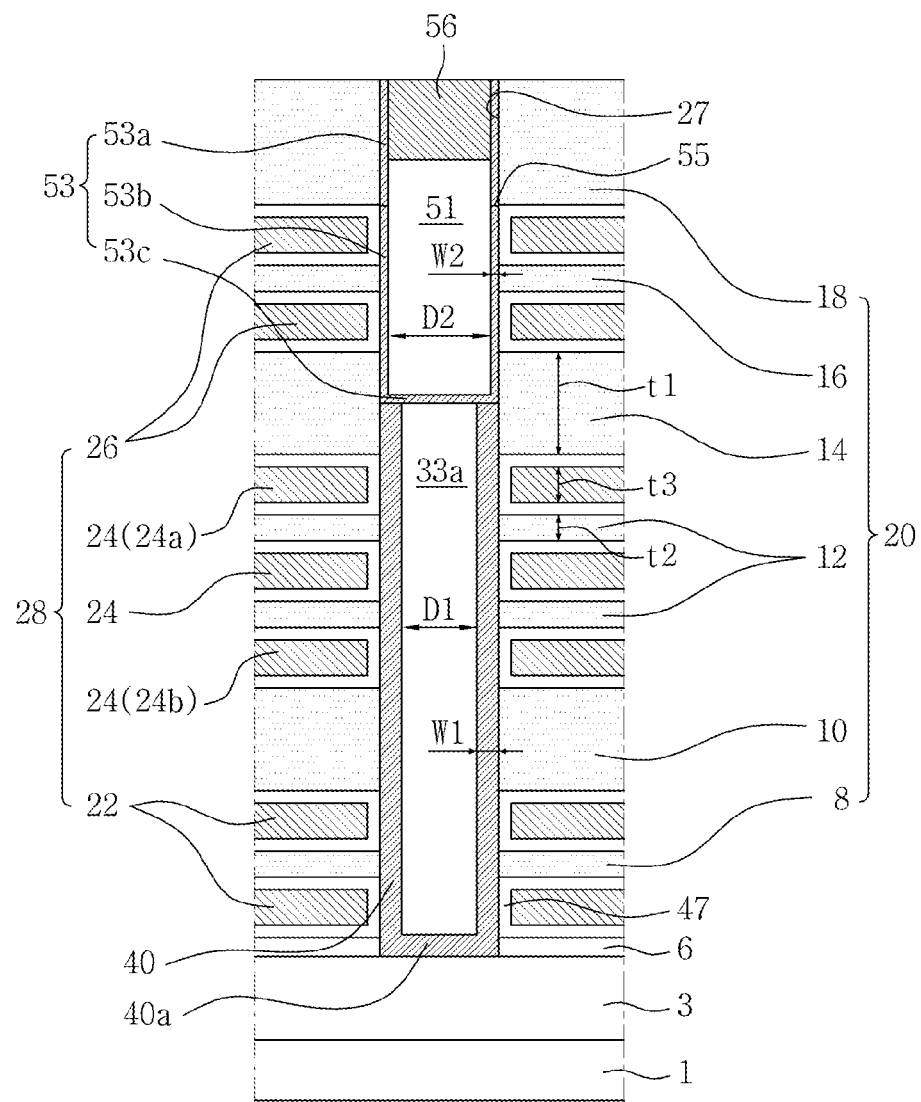
FIG. 3 is a cross-sectional view of a semiconductor device according to example embodiments of inventive concept.

FIG. 3 is a cross-sectional view of a semiconductor device according to example embodiments of inventive concepts.

Referring to FIG. 3, the second active pattern 43 and the second core pattern 33b, which are described with reference to FIG. 1A, may be respectively modified into a second active pattern 53 and a second core pattern 51 shown in FIG. 3. More specifically, a first core pattern 33a and the second core pattern 51 may be sequentially stacked within the opening 27. The first core pattern 33a may have a first horizontal width D1, while the second core pattern 51 may have a second horizontal width D2 greater than the first horizontal width D1.

First and second active patterns 40 and 53 may be provided within the opening 27. As described with reference to FIG. 1A, the first active pattern 40 may be provided between the first core pattern 33a and the horizontal patterns 20 and 28.

The second active pattern 53 may be provided between the second core pattern 51 and the horizontal patterns 20 and 28. That is, the second active pattern 53 may surround sidewalls of the second core pattern 51. Furthermore, the second active pattern 53 may further include a portion extending between the pad patterns 56 and the horizontal patterns 20 and 28. Also, the second active pattern 53 may further include a bottom portion 53c extending between the first and second core patterns 33a and 51. The pad pattern 56 may be electrically connected to an interconnection line (e.g., bitline, not shown) over the pad pattern 56.

As described with reference to FIG. 1A, a PN junction 55 may be provided within the second active pattern 53. On the basis of the PN junction 55, the second active pattern 53 may include a first portion 53a disposed adjacent to the pad pattern 36 and a second portion 53b disposed adjacent to the first active pattern 40.

The second active pattern 53 may be formed of a layer having a smaller thickness than the first active pattern 40. In other words, the first active pattern 40 may have a first horizontal width W1, while the second active pattern 53 may have a second horizontal width W2 smaller than the first horizontal width W1. Thus, in a transistor using the second portion 53b of the second active pattern 53 as a channel region, since the entire volume of the channel region may be reduced, charges trapped in the channel region may be reduced. Accordingly, dispersion of a threshold voltage of the transistor may be improved. Here, a gate electrode of the transistor may be the upper conductive pattern 26. For example, when a semiconductor device according to embodiments of the inventive concept is a nonvolatile memory device, middle conductive patterns 24 may be cell electrodes 24 of the nonvolatile memory device, at least one lower conductive pattern 22 interposed between a lowermost cell electrode 24b of the cell electrodes 24 and the substrate 1 may be a ground selection electrode, and at least one upper conductive pattern 26 disposed on an uppermost cell electrode 24a of the cell electrodes 24 may be a string selection electrode 26. A channel region of a transistor including the string selection electrode 26 may be disposed in the second portion 53b of the second active pattern 53. Thus, since the entire volume of the channel region may be reduced, charges trapped in the channel region may be reduced. As a result, dispersion of a threshold voltage of the transistor may be improved.

Figure 4:
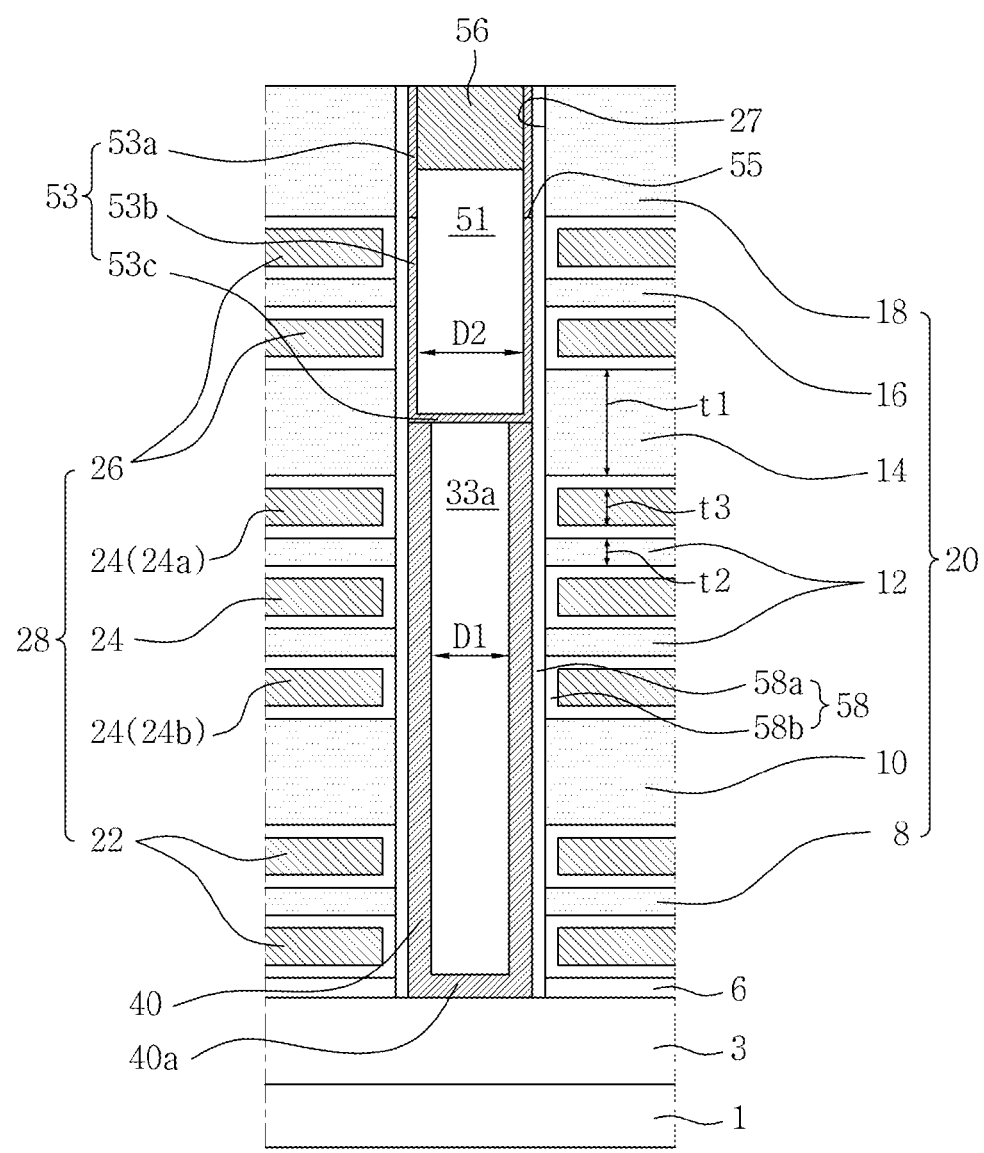
FIG. 4 is a cross-sectional view of a modified example of the semiconductor device shown in FIG. 3.

FIG. 4 is a cross-sectional view of a modified example of the semiconductor device shown in FIG. 3.

Referring to FIG. 4, the second active pattern 43, the second core pattern 33b, and the gate dielectric 47 described with reference to FIG. 1A may be respectively modified into a second active pattern 53, a second core pattern 51, and a gate dielectric 58 shown in FIG. 4. The second core pattern 33b and the second active pattern 43 described with reference to FIG. 1A may be respectively modified into the second core pattern 51 and the second active pattern 53 described with reference to FIG. 3.

A gate dielectric 58 may include a first portion 58a and a second portion 58b. The first portion 58a of the gate dielectric 58 may be provided on sidewalls of the first and second active patterns 40 and 53 adjacent to the horizontal patterns 20 and 28. The second portion 58b of the gate dielectric 58 may be interposed between the first portion 58a and the conductive patterns 28 and also interposed between the conductive patterns 28 and the interlayer insulating patterns 20.

The gate dielectric 58 may have substantially the same configuration as the gate dielectric 48 described with reference to FIG. 2. Thus, a detailed description of the gate dielectric 58 will be omitted.

Figure 5:
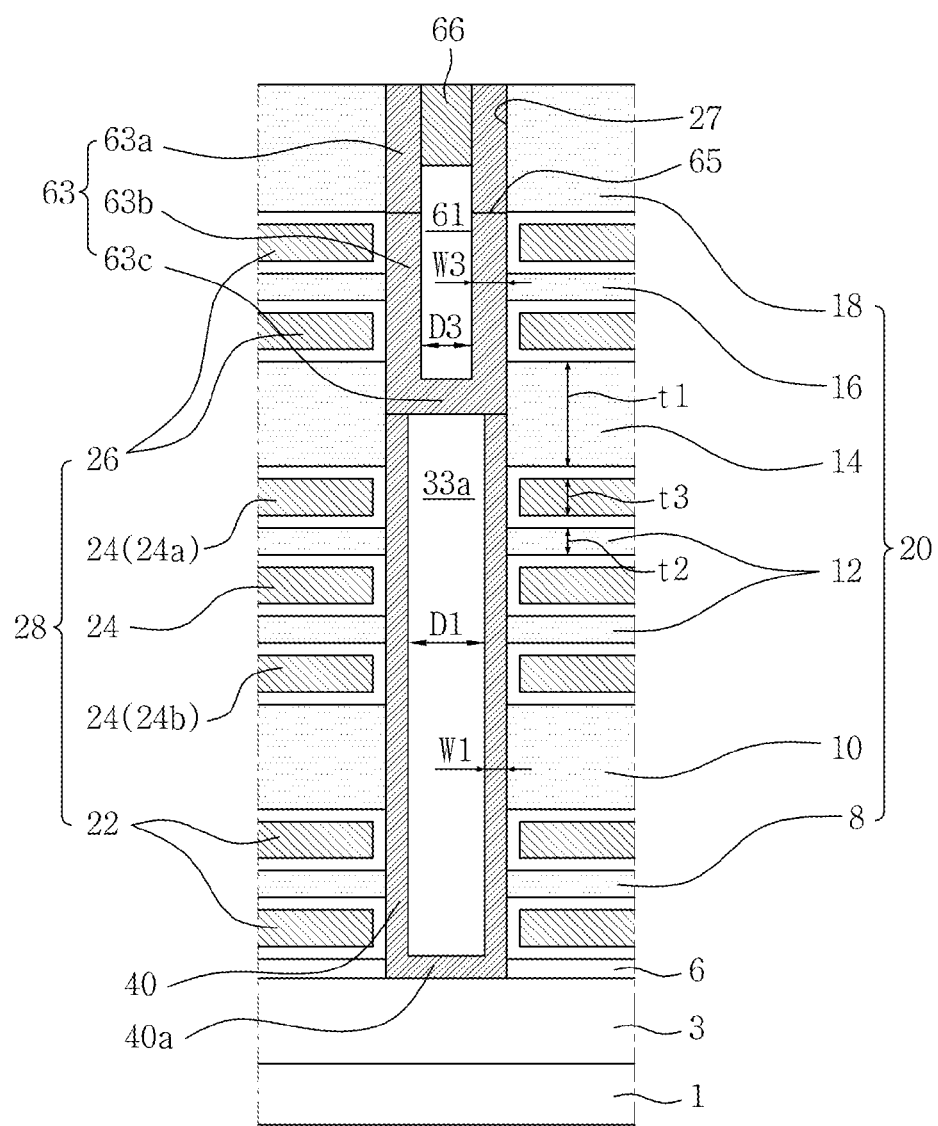
FIG. 5 is a cross-sectional view of a semiconductor device according to example embodiments of inventive concepts.

FIG. 5 is a cross-sectional view of a semiconductor device according to example embodiments of inventive concepts.

Referring to FIG. 5, the second active pattern 43 and the second core pattern 33b described with reference to FIG. 1A may be respectively modified into a second active pattern 53 and a second core pattern 51 shown in FIG. 5. As described with reference to FIG. 1A, a first core pattern 33a may be provided within the opening 27. Also, a first active pattern 40 described with reference to FIG. 1A may be provided. A second core pattern 61 may be provided on the first core pattern 33a. The second core pattern 61 may have a horizontal width D3 smaller than a horizontal width D1 of the first core pattern 33a.

A pad pattern 66 may be provided on the second core pattern 61. The pad pattern 66 may be formed of the same material as the pad pattern 36 described with reference to FIG. 1A. The pad pattern 66 may be electrically connected to an interconnection line (e.g., bitline, not shown) over the pad pattern 66.

A second active pattern 63 may be interposed between the second core pattern 51 and the horizontal patterns 20 and 28 and also interposed between the pad pattern 66 and the horizontal patterns 20 and 28. That is, the second active pattern 63 may surround sidewalls of the second core pattern 61. Furthermore, the second active pattern 63 may further include a bottom portion 63c extending between the first and second core patterns 33a and 61.

As described with reference to FIG. 1A, a PN junction 65 may be provided within the second active pattern 63. On the basis of the PN junction 65, the second active pattern 63 may include a first portion 63a disposed adjacent to the pad pattern 66 and a second portion 63b disposed adjacent to the first active pattern 40.

Each of the first and second portions 63a and 63b of the second active pattern 63 may have a horizontal width W3 greater than a horizontal width W1 of the first active pattern 40. Also, a vertical thickness of the bottom portion 63c of the second active pattern 63 may be greater than a vertical thickness of the bottom portion 40a of the first active pattern 40.

Thus, a horizontal width W3 of the second active pattern 63 disposed adjacent to the conductive patterns 28 may be greater than the horizontal width W1 of the first active pattern 40 disposed adjacent to the conductive patterns 28. Accordingly, in a transistor using the second portion 63b of the second active pattern 63 as a channel region, a current characteristic of the transistor may be improved. That is, an on-current characteristic of the transistor may be improved. Here, a gate electrode of the transistor may be the upper conductive pattern 26.

When a semiconductor device according to embodiments of the inventive concept is a nonvolatile memory device, middle conductive patterns 24 may be cell electrodes 24 of the nonvolatile memory device, at least one lower conductive pattern 22 interposed between a lowermost cell electrode 24b of the cell electrodes 24 and the substrate 1 may be a ground selection electrode, and at least one upper conductive pattern 26 disposed on an uppermost cell electrode 24a of the cell electrodes 24 may be a string selection electrode 26. A channel region of a transistor including the string selection electrode 26 may be disposed in the second portion 63b of the second active pattern 63, which has a relatively great width. Thus, in the transistor using the second portion 63b of the second active pattern 63 as the channel region, an on-current characteristic may be improved.

Figure 6:
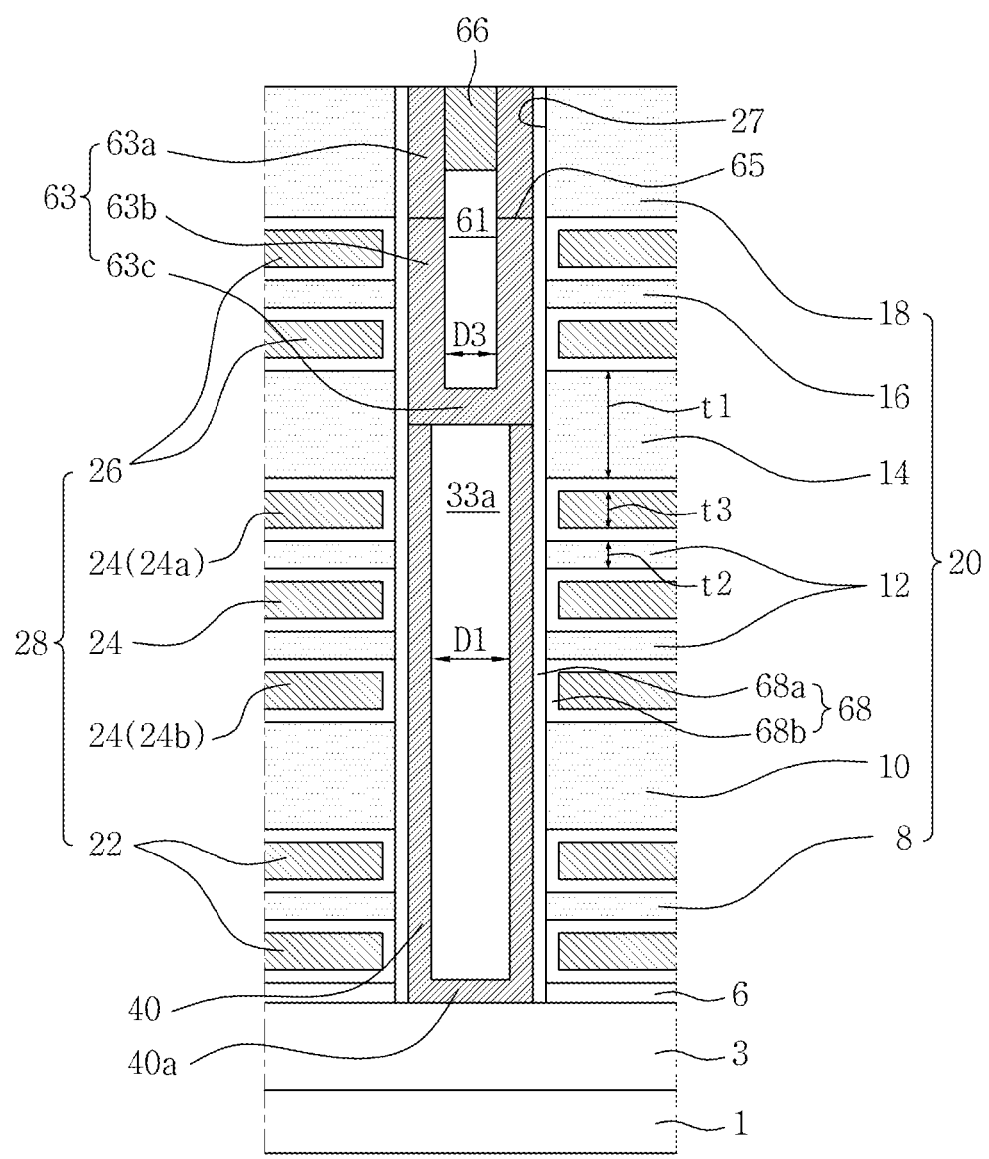
FIG. 6 is a cross-sectional view of a modified example of the semiconductor device shown in FIG. 5.

FIG. 6 is a cross-sectional view of a modified example of the semiconductor device shown in FIG. 5.

Referring to FIG. 6, the second active pattern 43, the second core pattern 33b, and the gate dielectric 47 described with reference to FIG. 1A may be respectively modified into a second active pattern 63, a second core pattern 61, and a gate dielectric 68 shown in FIG. 6. The second core pattern 33b and the second active pattern 43 described with reference to FIG. 1A may be respectively modified into the second core pattern 61 and the second active pattern 63 described with reference to FIG. 5. Also, the gate dielectric 47 described with reference to FIG. 1A may be modified into a gate dielectric 68 shown in FIG. 6. That is, the modified gate dielectric 68 may include a first portion 68a and a second portion 68b. The first portion 68a of the gate dielectric 68 may be provided on sidewalls of the first and second active patterns 40 and 63 adjacent to the horizontal patterns 20 and 28. Also, the second portion 68b may be interposed between the first portion 68a and the conductive patterns 28 and also interposed between the conductive patterns 28 and the interlayer insulating patterns 20. The gate dielectric 68 may have substantially the same configuration as the gate dielectric 48 described with reference to FIG. 2. Thus, a detailed description of the gate dielectric 68 will be omitted.

Figure 7:
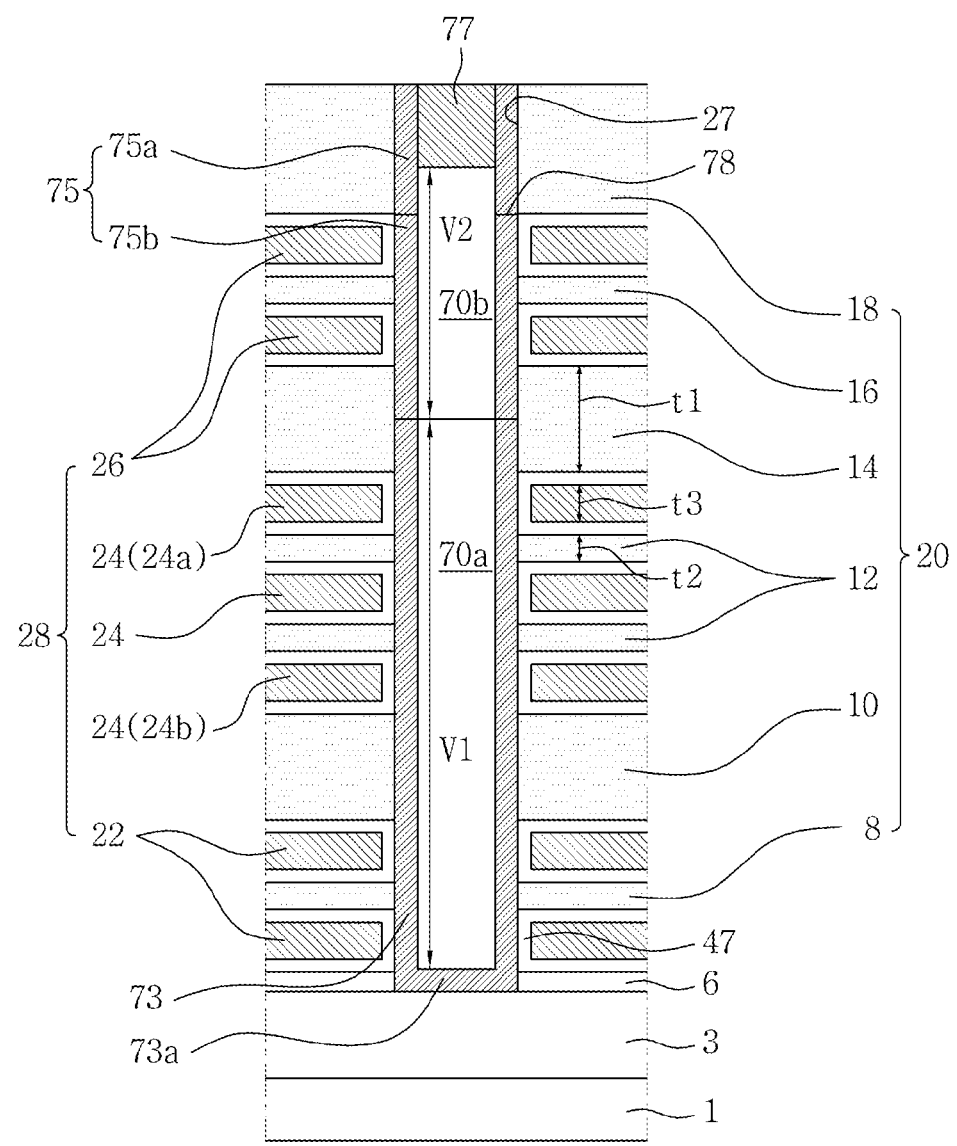
FIG. 7 is a cross-sectional view of a semiconductor device according to example embodiments of inventive concepts.

FIG. 7 is a cross-sectional view of a semiconductor device according to example embodiments of inventive concepts.

Referring to FIG. 7, the first and second active patterns 40 and 43 and the first and second core patterns 33a and 33b described with reference to FIG. 1A may be respectively modified into first and second active patterns 73 and 75 and first and second core patterns 70a and 70b shown in FIG. 7. The first and second core patterns 33a and 33b, which are spaced apart from each other as shown in FIG. 1A, may be modified into the first and second core patterns 33a and 33b, which are in contact with each other as shown in FIG. 7. That is, the first and second core patterns 70a and 70b that contact each other may be provided. The second core pattern 70b may be provided on the first core pattern 70a.

First and second active patterns 73 and 75 may be provided within an opening 27. As shown in FIG. 7, the first active pattern 73 may be interposed between the first core pattern 70a and the horizontal patterns 20 and 28. Furthermore, the first active pattern 73 may include a bottom portion 73a extending between the first core pattern 70a and the substrate 1.

The second active pattern 75 may be provided on the first active pattern 73. The second active pattern 75 may include a first portion disposed adjacent to a pad pattern 36 disposed within the opening 27 and a second portion 73b disposed adjacent to the first active pattern 73.

The first and second portions 75a and 75b of the second active pattern 75 may have substantially the same electrical properties as the first and second portions 43a and 43b of the second active pattern 43 described with reference to FIG. 1A.

The first and second active patterns 73 and 75 may constitute a continuous layer. Here, the second active pattern 75 may contain a Group-III element at a higher content than the first active pattern 73. The second portion 75b of the second active pattern 75 may have a higher P-type dopant concentration than the first active pattern 73. When the second portion 75b of the second active pattern 75 has a P conductivity type, the first portion 75a of the second active pattern 75 and the pad pattern 36 may have an N conductivity type. That is, the PN junction 78 described with reference to FIG. 1A may be formed between the first and second portions 75a and 75b of the second active pattern 75. The pad pattern 77 may be electrically connected to an interconnection line (e.g., bitline, not shown) over the pad pattern 77.

Figure 8:
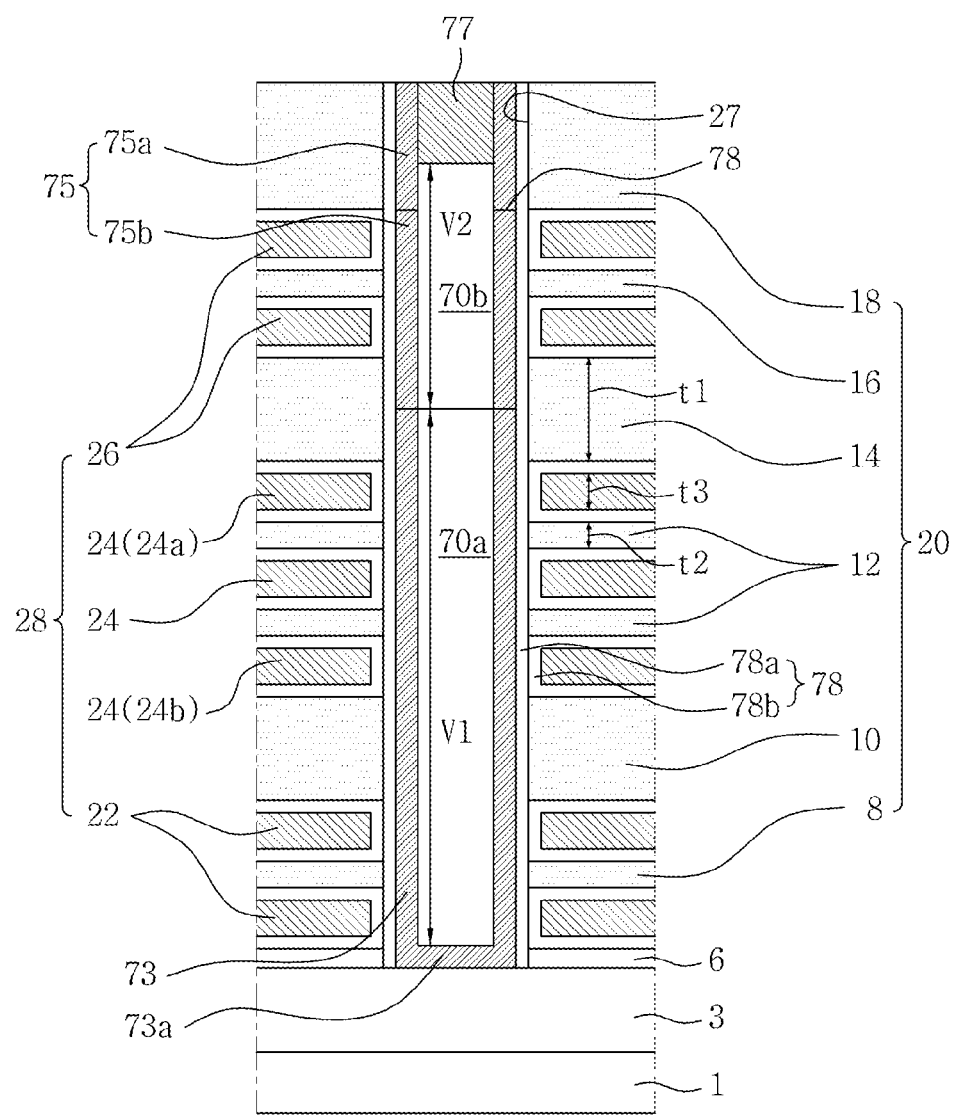
FIG. 8 is a cross-sectional view of a modified example of the semiconductor device shown in FIG. 7.

FIG. 8 is a cross-sectional view of a modified example of the semiconductor device shown in FIG. 7.

Referring to FIG. 8, the first and second active patterns 40 and 43, the first and second core patterns 33a and 33b, and the gate dielectric 47 described with reference to FIG. 1A may be respectively modified into first and second active patterns 73 and 75, first and second core patterns 70a and 70b, and a gate dielectric 78 shown in FIG. 8. The first and second active patterns 40 and 43 and the first and second core patterns 33a and 33b described with reference to FIG. 1A may be respectively modified into first and second active patterns 73 and 75 and first and second core patterns 70a and 70b described with reference to FIG. 7. The gate dielectric 47 described with reference to FIG. 1A may be modified into a gate dielectric 78 shown in FIG. 8. That is, the modified gate dielectric 78 may include a first portion 78a and a second portion 78b. The first portion 78a of the gate dielectric 78 may be provided on sidewalls of the first and second active patterns 73 and 75 adjacent to the horizontal patterns 20 and 28, and the second portion 78b thereof may be interposed between the first portion 78a and the conductive patterns 28 and also interposed between the conductive patterns 28 and the interlayer insulating patterns 20. Thus, the gate dielectric 78 may have substantially the same configuration as the gate dielectric described with reference to FIG. 2.

Figure 9:
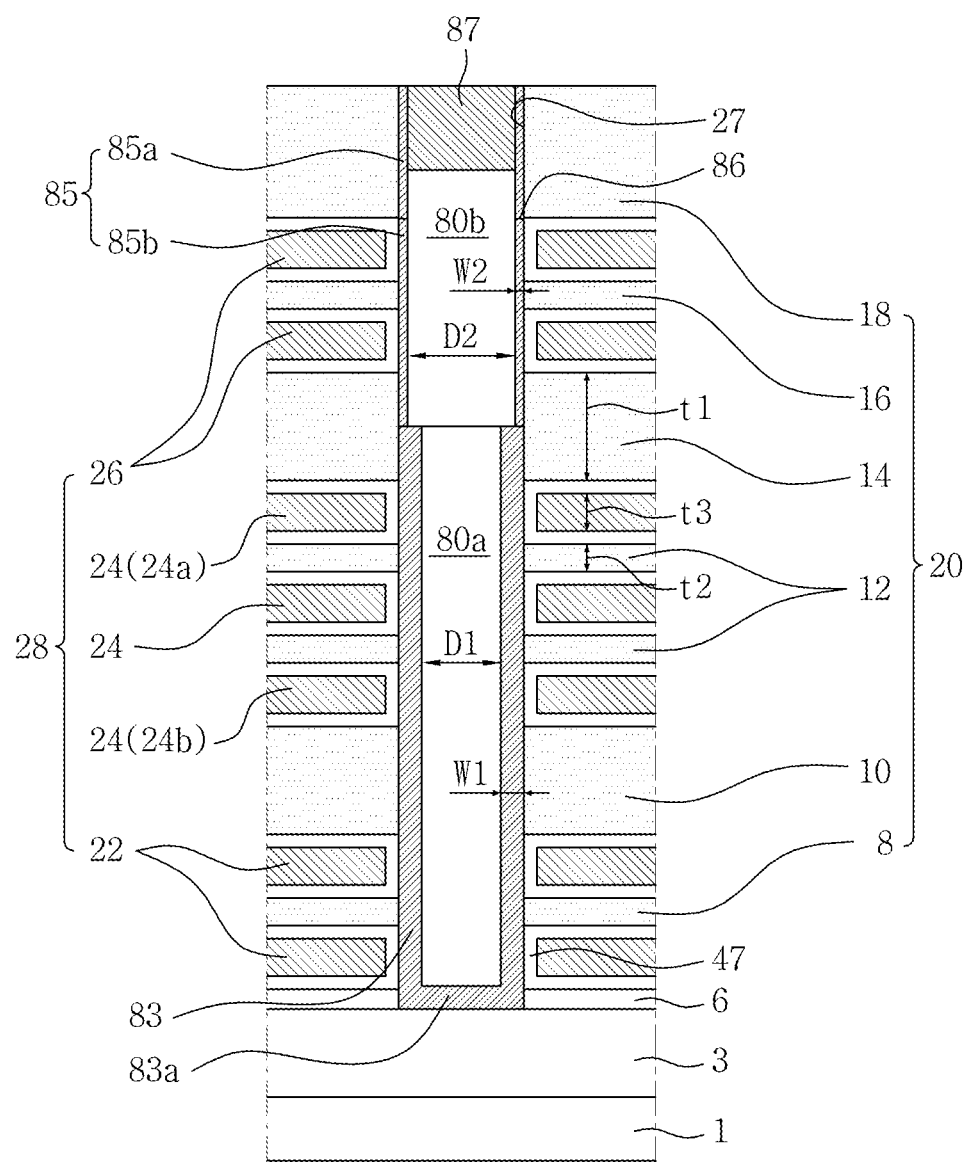
FIG. 9 is a cross-sectional view of a semiconductor device according to example embodiments of inventive concepts.

FIG. 9 is a cross-sectional view of a semiconductor device according to example embodiments of inventive concepts.

Referring to FIG. 9, the first and second active patterns 40 and 43 and the first and second core patterns 33a and 33b described with reference to FIG. 1A may be modified into first and second active patterns 83 and 85 and first and second core patterns 80a and 80b shown in FIG. 9. More specifically, a pad pattern 87 may be provided within the opening 27. A first core pattern 80a and a second core pattern 80b may be sequentially stacked within the opening 27. The first and second core patterns 80a and 80b may be disposed under the pad pattern 87. A horizontal width D1 of the first core pattern 80a may be smaller than a horizontal width D2 of the second core pattern 80b. The pad pattern 87 may be electrically connected to an interconnection line (e.g., bitline, not shown) over the pad pattern 87.

The first and second active patterns 83 and 85 may be provided within the opening 27. The first active pattern 83 may be interposed between the first core pattern 80a and the horizontal patterns 20 and 28. Furthermore, the first active pattern 83 may further include a bottom portion 83a extending between the first core pattern 80a and the substrate 1.

The second active pattern 85 may be provided on the first active pattern 83. The second active pattern 85 may be interposed between the second core pattern 80b and the horizontal patterns 20 and 28 and also interposed between the pad pattern 87 and the horizontal patterns 20 and 28.

As described with reference to FIG. 1A, a PN junction 86 may be provided within the second active pattern 85. On the basis of the PN junction 86, the second active pattern 85 may include a first portion 85a disposed adjacent to the pad pattern 87 and a second portion 85b disposed adjacent to the first active pattern 83.

Figure 10:
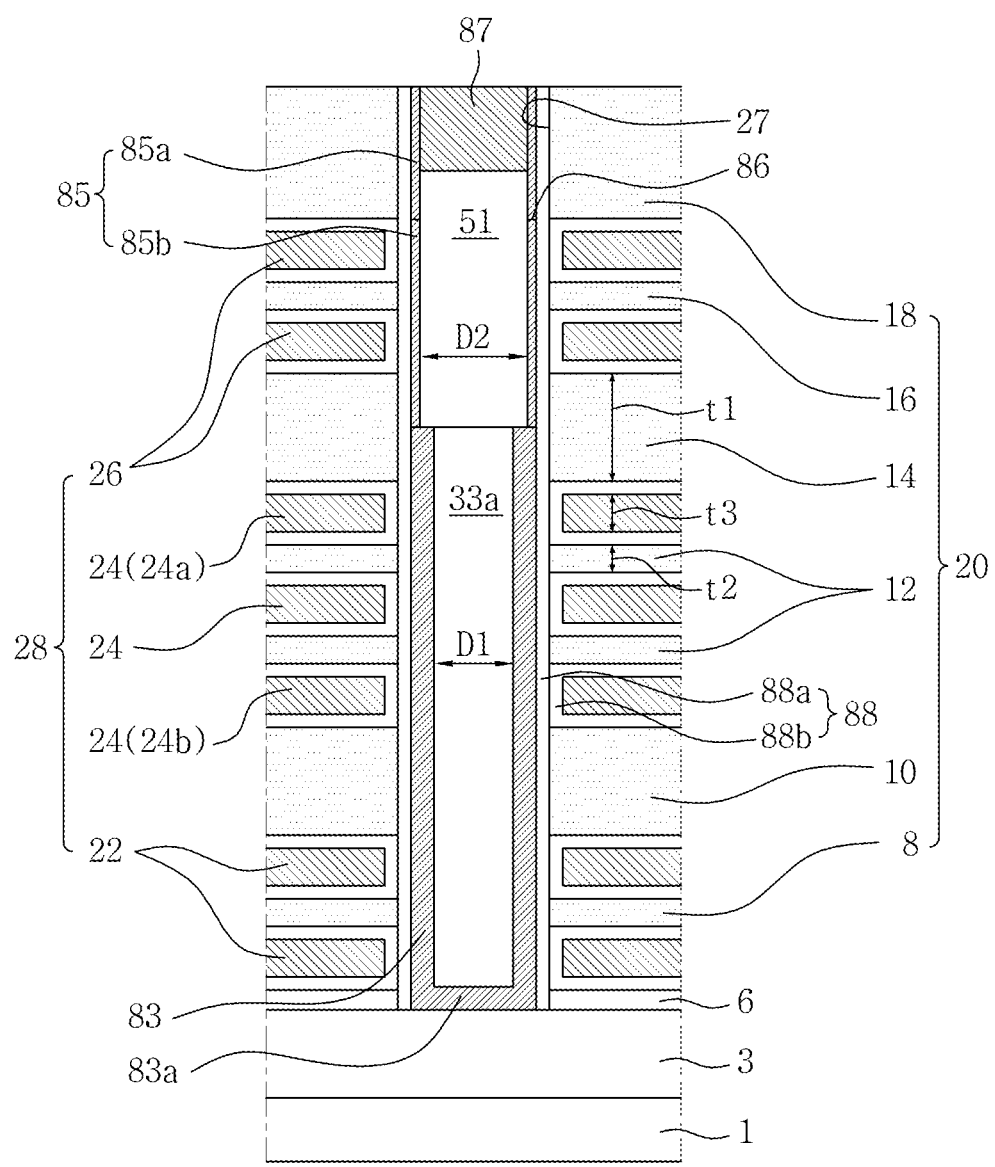
FIG. 10 is a cross-sectional view of a modified example of the semiconductor device shown in FIG. 9.

FIG. 10 is a cross-sectional view of a first modified example of the semiconductor device shown in FIG. 9.

Referring to FIG. 10, the first and second active patterns 40 and 43, the first and second core patterns 33a and 33b, and the gate dielectric 47 described with reference to FIG. 1A may be respectively modified into first and second active patterns 83 and 85, first and second core patterns 80a and 80b, and a gate dielectric 88 shown in FIG. 10. The first and second core patterns 33a and 33b and the first and second active patterns 40 and 43 described with reference to FIG. 1A may be respectively modified into the first and second core patterns 80a and 80b and the first and second active patterns 83 and 85 described with reference to FIG. 9. Also, the gate dielectric 47 described with reference to FIG. 1A may be modified into the gate dielectric 88. That is, the modified gate dielectric 88 may include a first portion 88a and a second portion 88b. The first portion 88a of the gate dielectric 88 may be provided on sidewalls of the first and second active patterns 83 and 85 adjacent to the horizontal patterns 20 and 28. The second portion 88b may be interposed between the first portion 88a and the conductive patterns 28 and also interposed between the conductive patterns 28 and the interlayer insulating patterns 20. Accordingly, the gate dielectric 88 may have substantially the same configuration as the gate dielectric 48 described with reference to FIG. 2.

Figure 11A:
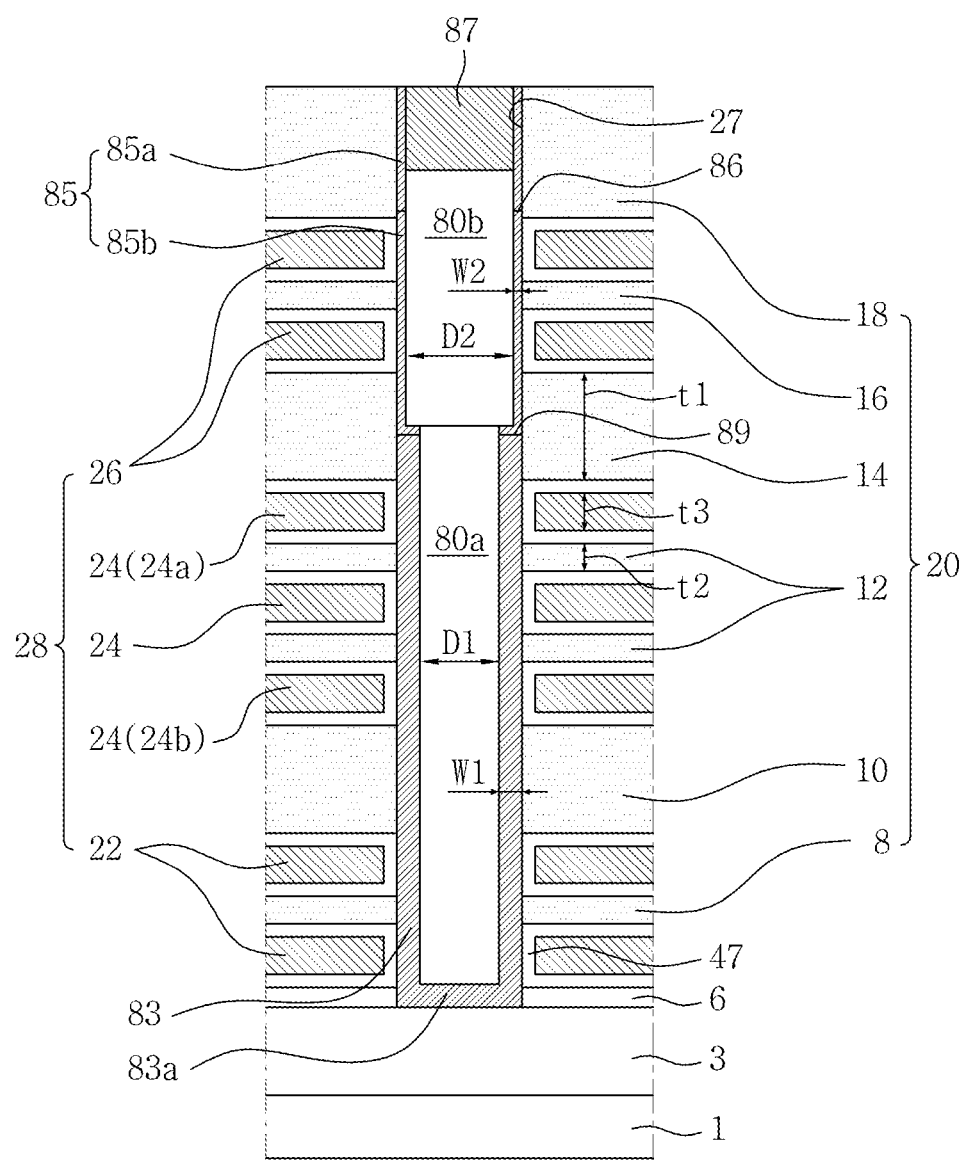
FIG. 11A is a cross-sectional view of a modified example of the semiconductor device shown in FIG. 9.

FIG. 11A is a cross-sectional view of a second modified example of the semiconductor device shown in FIG. 9.

Referring to FIG. 11A, an impurity region formed in the second portion 85b of the second active pattern 85 of the semiconductor device as described with reference to FIG. 9 may be modified as shown in FIG. 11A. That is, the impurity region formed in the second portion 85b of the second active pattern 85 may extend into the first active pattern 83. That is, an upper region of the first active pattern 83 adjacent to the second active pattern 85 may contain impurities of the same conductivity type as the second portion 85b of the second active pattern 85.

In some embodiments, when the second portion 85b of the second active pattern 85 includes a P-type semiconductor, the upper region of the first active pattern 83 may include a P-type semiconductor, and the remaining portion of the first active pattern 83 may include an intrinsic semiconductor. Accordingly, a junction 89 between the intrinsic semiconductor and the P-type semiconductor may be formed within the first active pattern 83.

In other embodiments, when the first and second active patterns 83 and 85 include P-type semiconductors, the upper region of the first active pattern 83 and the remaining region of the first active pattern 83 may have different P-type dopant concentrations. For example, the upper region of the first active pattern 83 may have a higher P-type dopant concentration than the remaining region thereof.

In other embodiments, when the second portion 85b of the second active pattern 85 includes a P-type semiconductor, the upper region of the first active pattern 83 may include a P-type semiconductor, and the remaining portion of the first active pattern 83 may include an N-type semiconductor. Accordingly, a junction 89 between the P- and N-type semiconductors may be formed within the first active pattern 83.

Figure 11B:
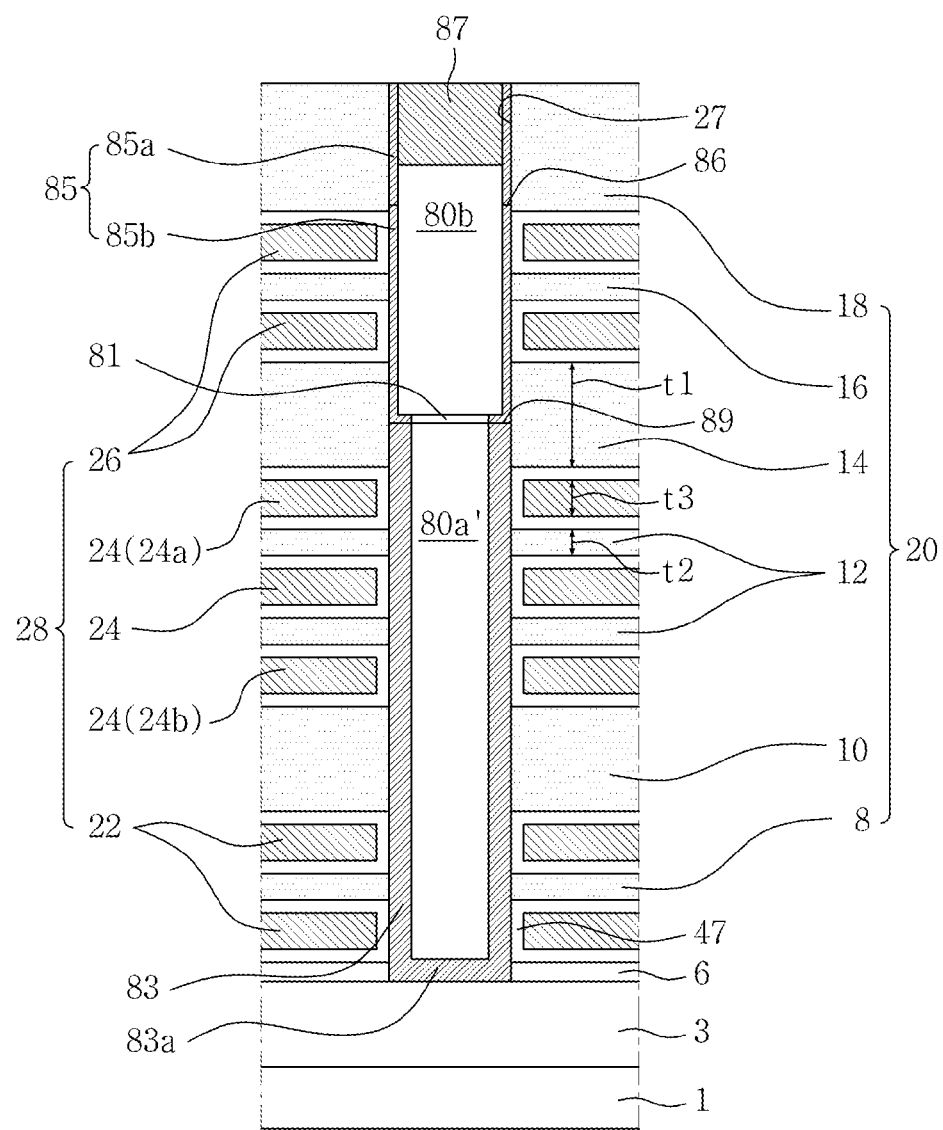
FIG. 11B is a cross-sectional view of a modified example of the semiconductor device shown in FIG. 10.

FIG. 11B is a cross-sectional view of a third modified example of the semiconductor device shown in FIG. 10.

Referring to FIG. 11B, the first core pattern 80a of the semiconductor device described with reference to FIG. 11A may be modified into a first core pattern 80a' shown in FIG. 11B. The modified first core pattern 80a' may further include an impurity-containing region 81 provided in an upper region thereof. For example, a Group-III element contained in the impurity-containing region 81 may have a higher concentration than a Group-III element contained in the first core pattern 80a' disposed under the impurity-containing region 81.

Figure 12:
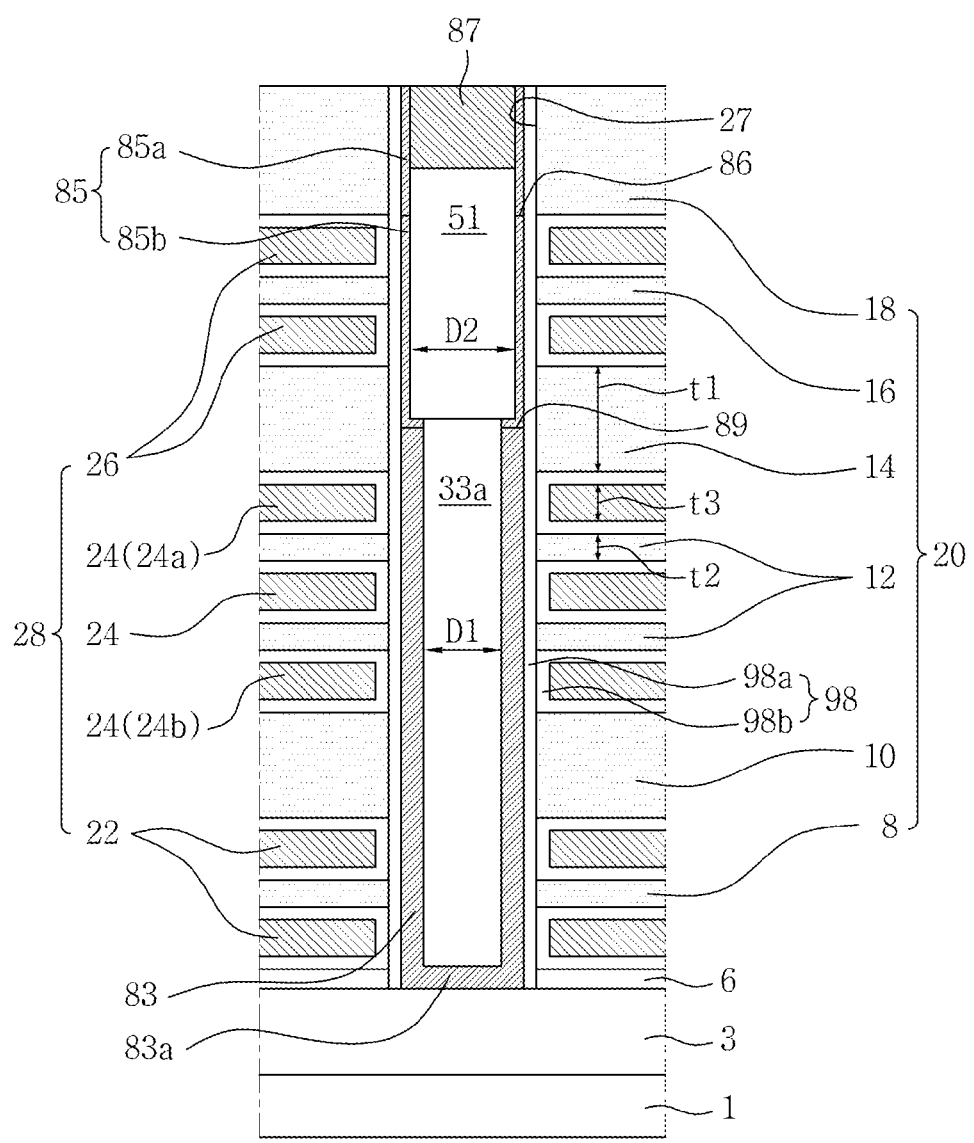
FIG. 12 is a cross-sectional view of a modified example of the semiconductor device shown in FIG. 10.

FIG. 12 is a cross-sectional view of a fourth modified example of the semiconductor device shown in FIG. 10.

Referring to FIG. 12, the gate dielectric 47 of the semiconductor device described with reference to FIG. 11 may be modified into a gate dielectric 98 shown in FIG. 12. The modified gate dielectric 98 may include a first portion 98a and a second portion 98b. The first portion 98a of the gate dielectric 98 may surround outer sidewalls of the first and second active patterns 83 and 85, and the second portion 98b thereof may be interposed between the conductive patterns 28 and also interposed between the conductive patterns 28 and the interlayer insulating patterns 20. Accordingly, the gate dielectric 98 may have substantially the same configuration as the gate dielectric 48 described with reference to FIG. 2.

Figure 13:
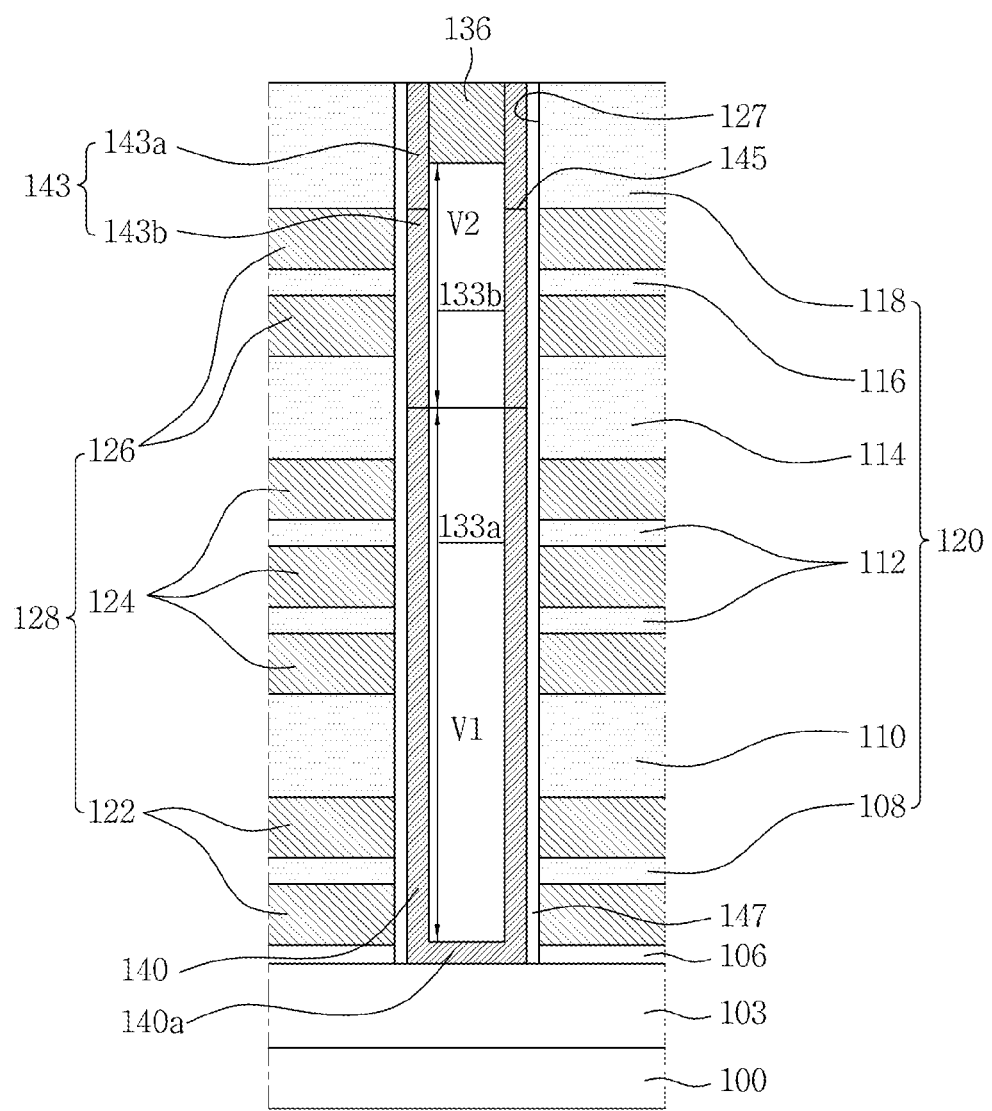
FIG. 13 is a cross-sectional view of a semiconductor device according to example embodiments of inventive concepts.

FIG. 13 is a cross-sectional view of a semiconductor device according to example embodiments of inventive concepts.

Referring to FIG. 13, a substrate 100 having an impurity region 103 may be provided as described with reference to FIG. 1A. Horizontal patterns 120 and 128 may be vertically stacked on the substrate 100.

The horizontal patterns 120 and 128 may include conductive patterns 128 and interlayer insulating patterns 120. The conductive patterns 128 may be spaced apart from one another by the interlayer insulating patterns 120 and vertically stacked. As described with reference to FIG. 1A, the conductive patterns 120 may include at least one lower conductive pattern 122, a plurality of middle conductive patterns 124, and at least one upper conductive pattern 126.

A buffer insulating pattern 106 may be provided between the lower conductive pattern 122 and the substrate 100. As described with reference to FIG. 1A, the interlayer insulating patterns 120 may include a lower interlayer pattern 108, a lower insulating pattern 110, a middle interlayer pattern 112, a middle insulating pattern 114, an upper interlayer pattern 116, and an upper insulating pattern 118.

An opening 127 may penetrate the horizontal patterns 120 and 128 and the buffer insulating pattern 106.

A pad pattern 136 may be provided in an upper region of the opening 127. The pad pattern 136 may include crystalline silicon. For example, the pad pattern 136 may be formed of poly-Si. The pad pattern 136 may be electrically connected to an interconnection line (e.g., bitline, not shown) over the pad pattern 136.

Core patterns 133a and 133b may be provided within the opening 127 between the substrate 100 and the pad pattern 136. The core pattern 133a and 133b may include a first core pattern 133a and a second core pattern 133b. The second core pattern 133b may be provided on the first core pattern 133a.

First and second active patterns 140 and 143 may be provided within the opening 127. The first active pattern 140 may be provided between the first core pattern 133a and the horizontal patterns 120 and 128. The first active pattern 140 may surround sidewalls of the first core pattern 133a. Furthermore, the first active pattern 140 may further include a portion 140a extending between the first core pattern 133a and the substrate 100.

The second active pattern 143 may be provided between the second core pattern 133b and the horizontal patterns 120 and 128. Furthermore, the second active pattern 143 may include a portion extending between the pad pattern 136 and the horizontal patterns 120 and 128.

A PN junction 145 may be provided within the second active pattern 143. On the basis of the PN junction 145, the second active pattern 143 may include a first portion 143a disposed adjacent to the pad pattern 136 and a second portion 143b disposed adjacent to the first active pattern 140. The first portion 143a of the second active pattern 143 may have a P conductivity type, and the second portion 143b thereof may have an N conductivity type. Also, the pad pattern 136 may have an N conductivity type.

A gate dielectric 147 may be provided between the first and second active patterns 140 and 143 and the horizontal patterns 120 and 128. As shown in FIG. 1B, the gate dielectric 147 may include a tunnel dielectric material 47a, a data storage layer 47b, and a blocking layer 47c.

Figure 14:
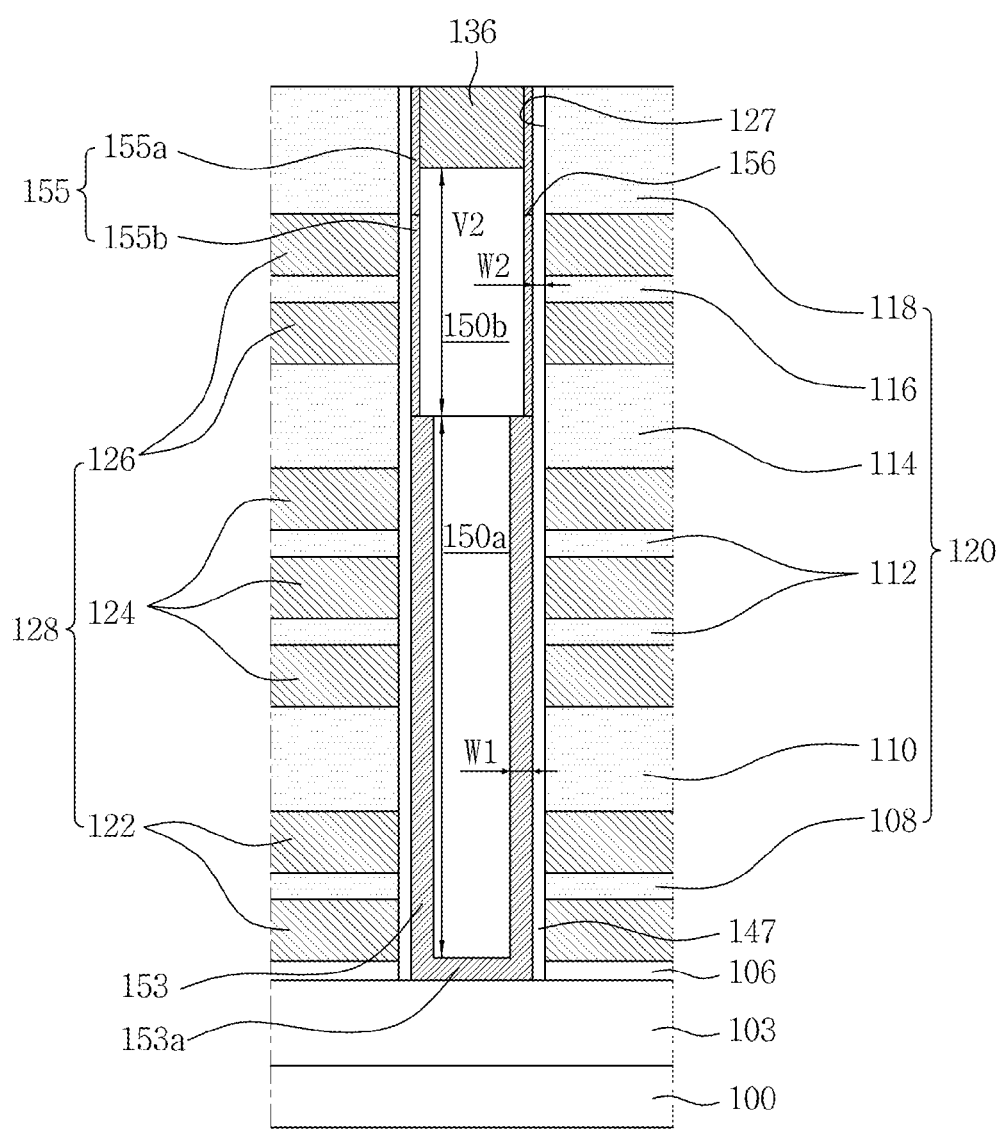
FIG. 14 is a cross-sectional view of a modified example of the semiconductor device shown in FIG. 13.

FIG. 14 is a cross-sectional view of a modified example of the semiconductor device shown in FIG. 13.

Referring to FIG. 14, the second active pattern 143 of the semiconductor device described with reference to FIG. 13 may be modified into a second active pattern 155 shown in FIG. 14. More specifically, a first core pattern 150a and a second core pattern 150b may be sequentially stacked within the opening 27. A horizontal width of the second core pattern 150b may be greater than a horizontal width of the first core pattern 150a. A first active pattern 153 may surround sidewalls of the first core pattern 150a. The first active pattern 153 may further include a bottom portion 150a configured to cover the bottom of the first core pattern 150a.

A second active pattern 155 may surround sidewalls of the second core pattern 150b. A horizontal width W2 of the second active pattern 155 may be smaller than a horizontal width W1 of the first active pattern 153. A PN junction 156 may be provided within the second active pattern 155 in the same manner as shown in FIG. 1A. On the basis of the PN junction 156, the second active pattern 155 may include a first portion 155a disposed adjacent to the pad pattern 136 and a second portion 155b disposed adjacent to the first active pattern 153.

Figure 15:
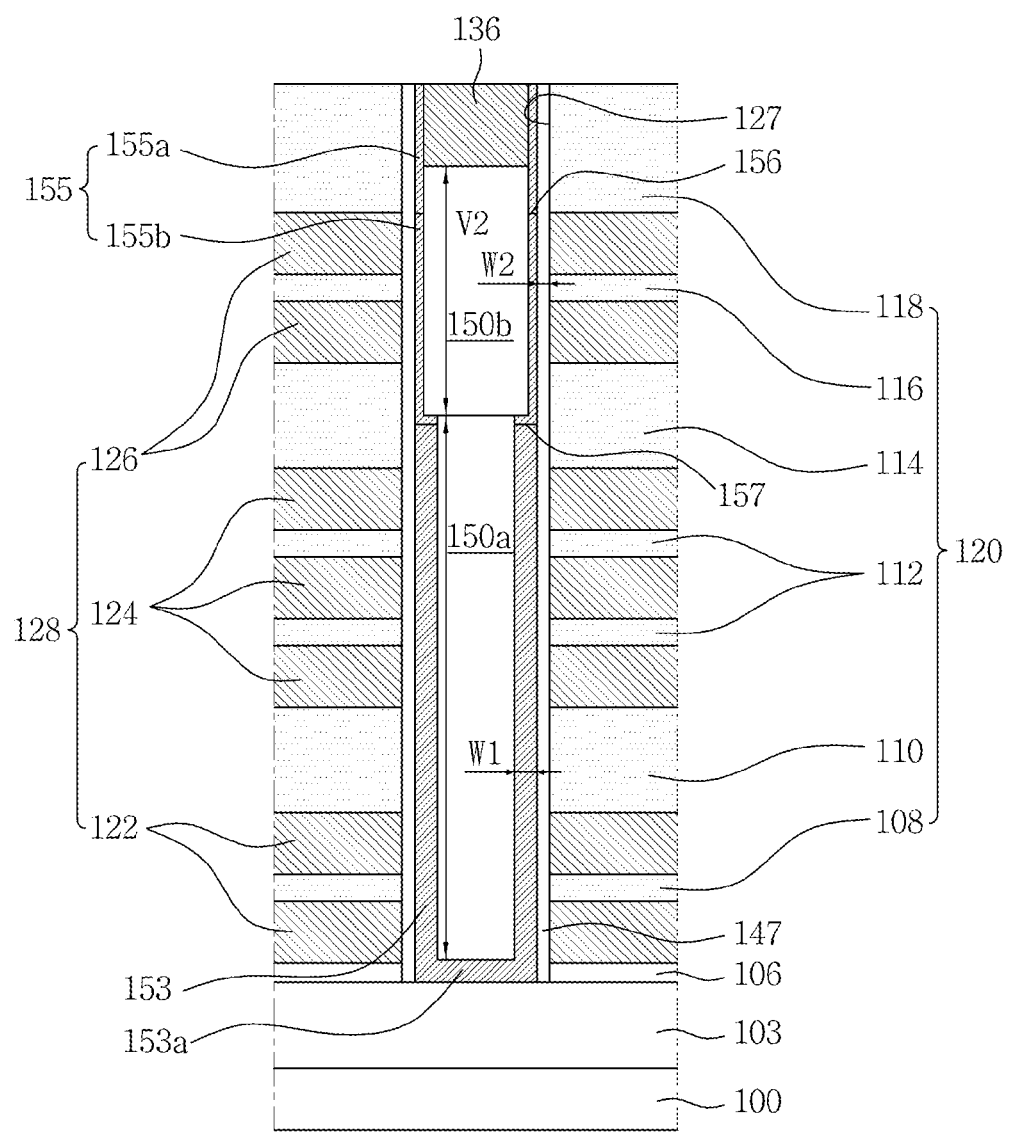
FIG. 15 is a cross-sectional view of a modified example of the semiconductor device shown in FIG. 13.

FIG. 15 is a cross-sectional view of another modified example of the semiconductor device shown in FIG. 13.

Referring to FIG. 15, an impurity region of the second portion 155b of the second active pattern 155 of the semiconductor device shown in FIG. 14 may be modified as shown in FIG. 11. That is, as shown in FIG. 11, the impurity region of the second portion 155b of the second active pattern 155 may extend into a desired (and/or alternatively predetermined) region 89 of the first active pattern 153. Thus, an upper region of the first active pattern 153 disposed adjacent to the second active pattern 155 may include impurities of the same conductivity type as the second portion 155b of the second active pattern 155.

Hereinafter, methods of fabricating semiconductor devices according to embodiments of the inventive concept will be described with reference to FIGS. 16 through 46.

Figure 16:
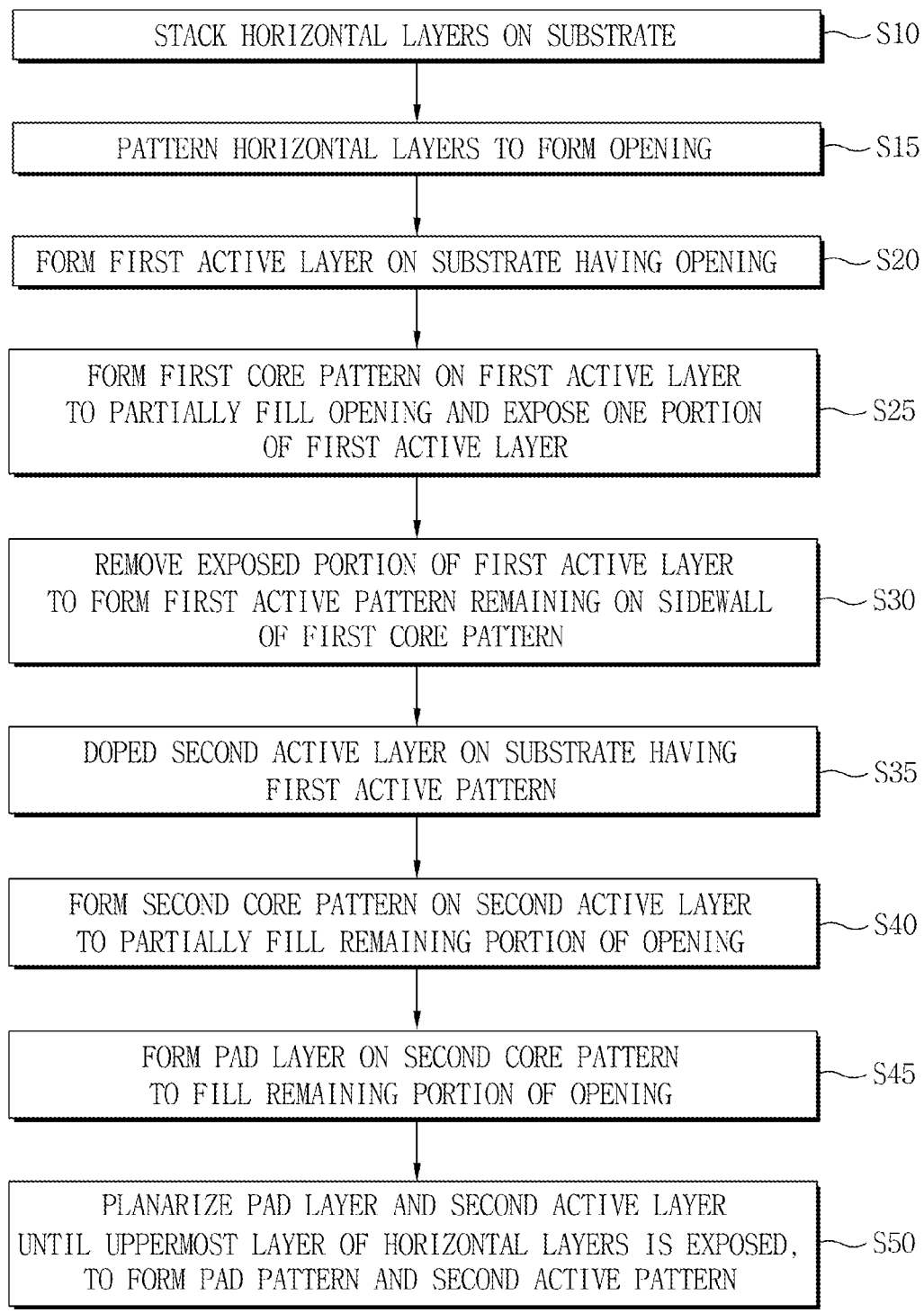
FIG. 16 is a flowchart illustrating a method of fabricating the semiconductor device according to the example embodiments of inventive concepts.
Figure 17A:
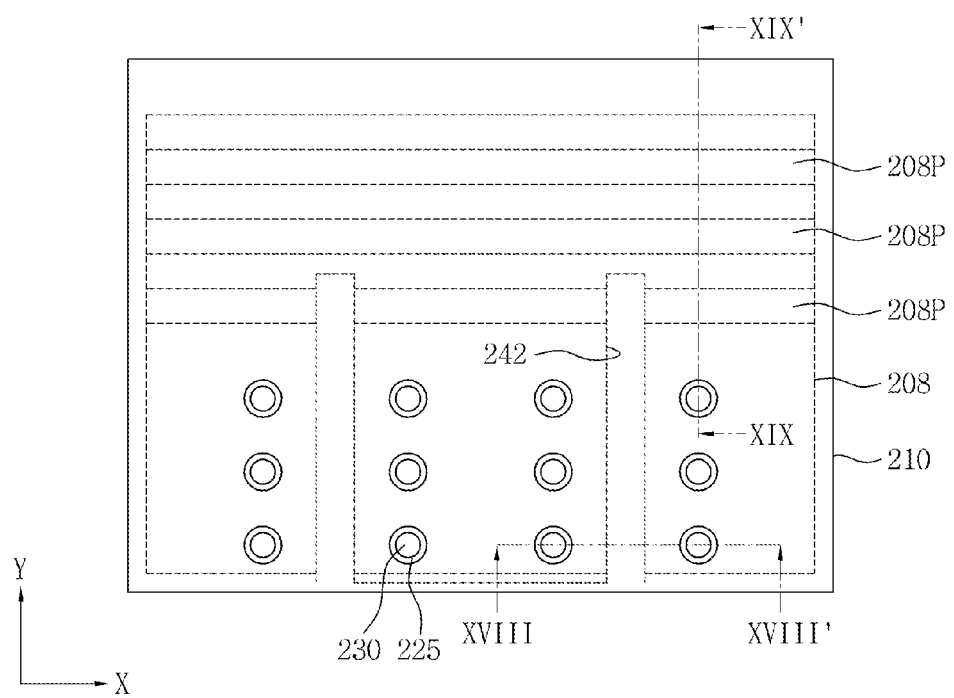
FIGS. 17A to 17C are plan views illustrating methods of fabricating a semiconductor device according to example embodiments of inventive concepts.
Figure 17B:
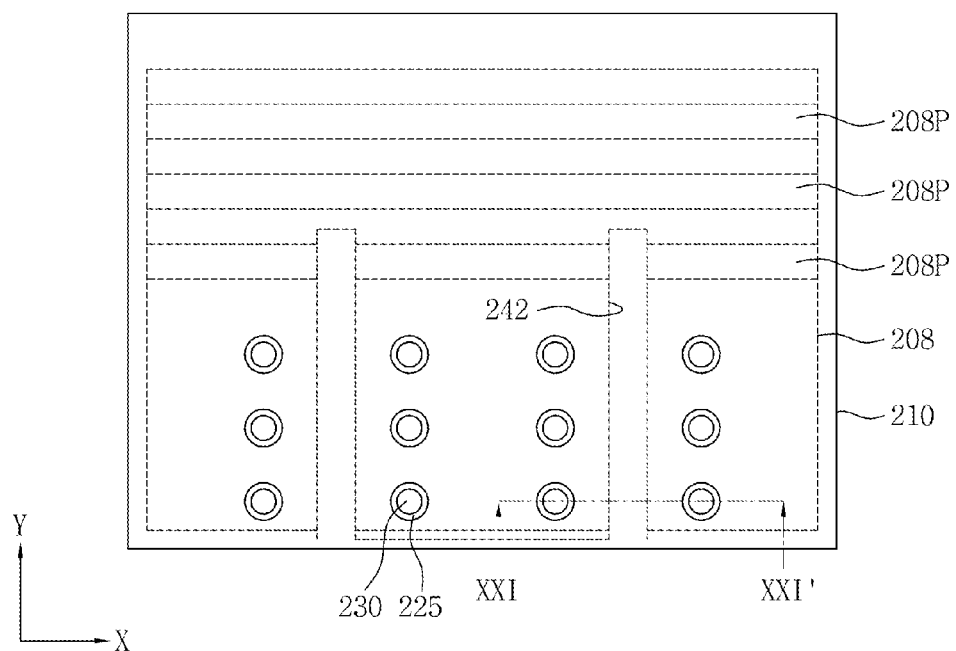
Figure 17C:
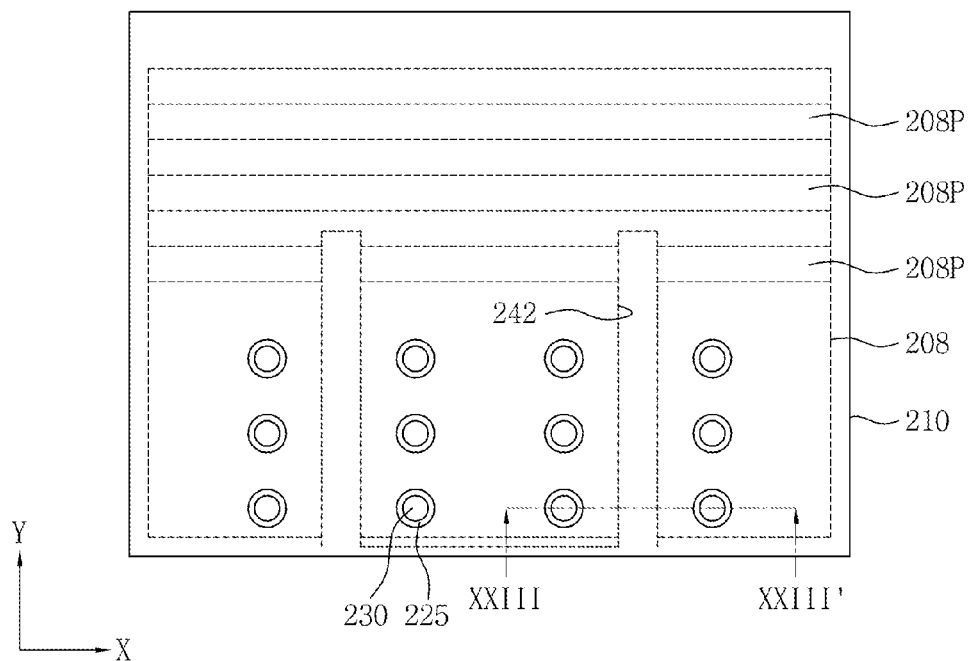

FIG. 16 is a flowchart illustrating a method of fabricating the semiconductor device shown in FIG. 1A. FIGS. 17A to 17C are plan views illustrating methods of fabricating a semiconductor device according to example embodiments of inventive concept. FIGS. 18A through 18G are cross-sectional views illustrating a method of fabricating the semiconductor device shown in FIG. 1A. FIG. 19 is a cross-sectional view of a sacrificial pad of a semiconductor device according to embodiments of the inventive concept. FIGS. 18A through 18G are cross-sectional views taken along line XVIII-XVIII' of FIG. 17A, and FIG. 19 is a cross-sectional view taken along line XIX-XIX' of FIG. 17A.

Figure 20:
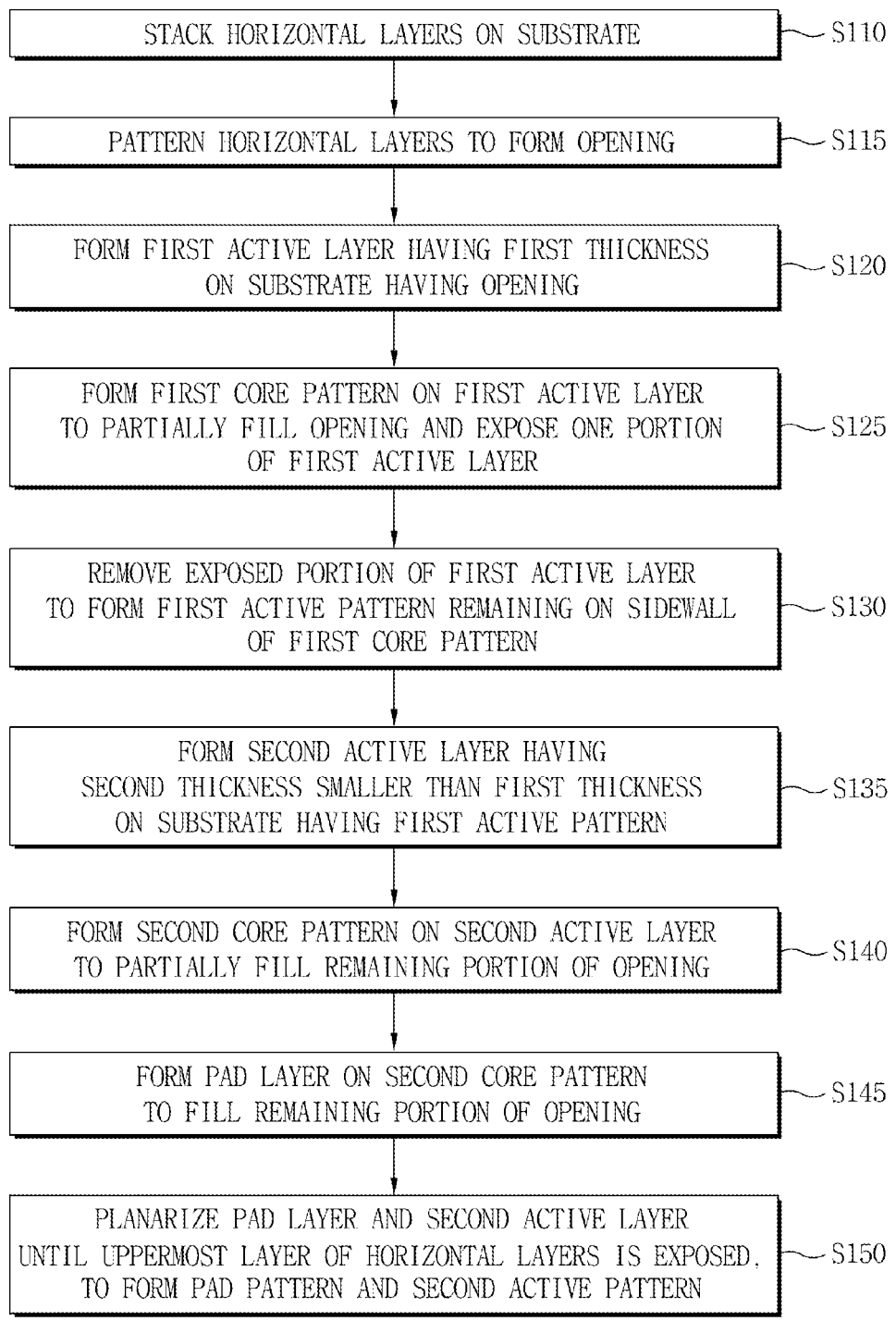
FIG. 20 is a flowchart illustrating a method of fabricating the semiconductor device according to example embodiments of inventive concepts.
Figure 21A:
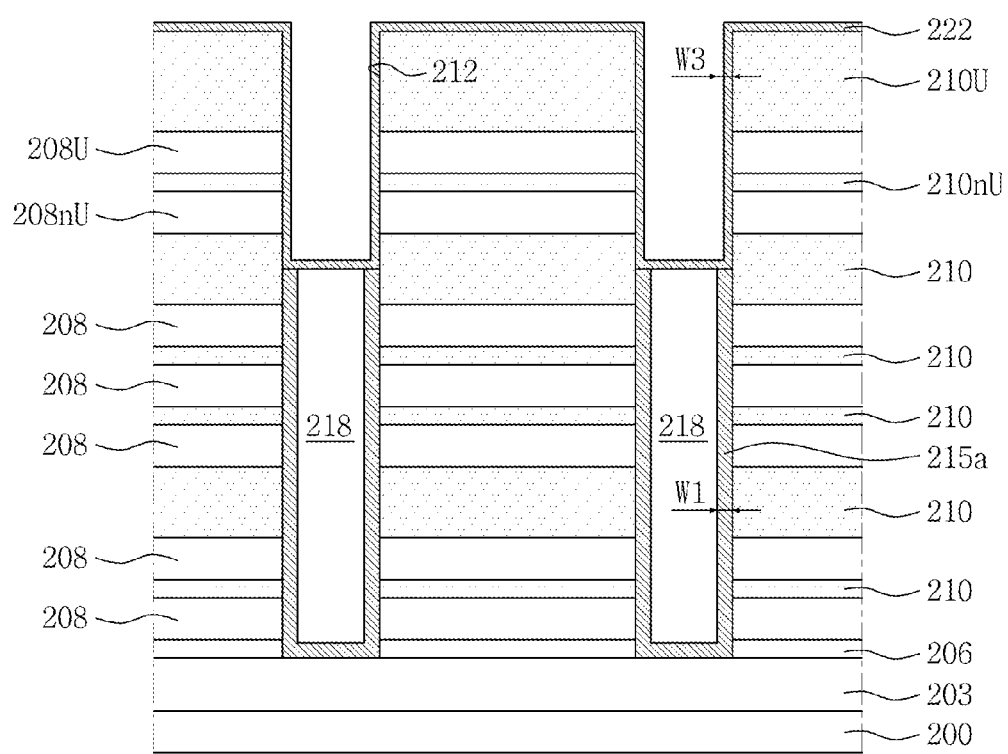
FIGS. 21A and 21B are cross-sectional views illustrating the method of fabricating the semiconductor device according to the example embodiments of inventive concepts.
Figure 21B:
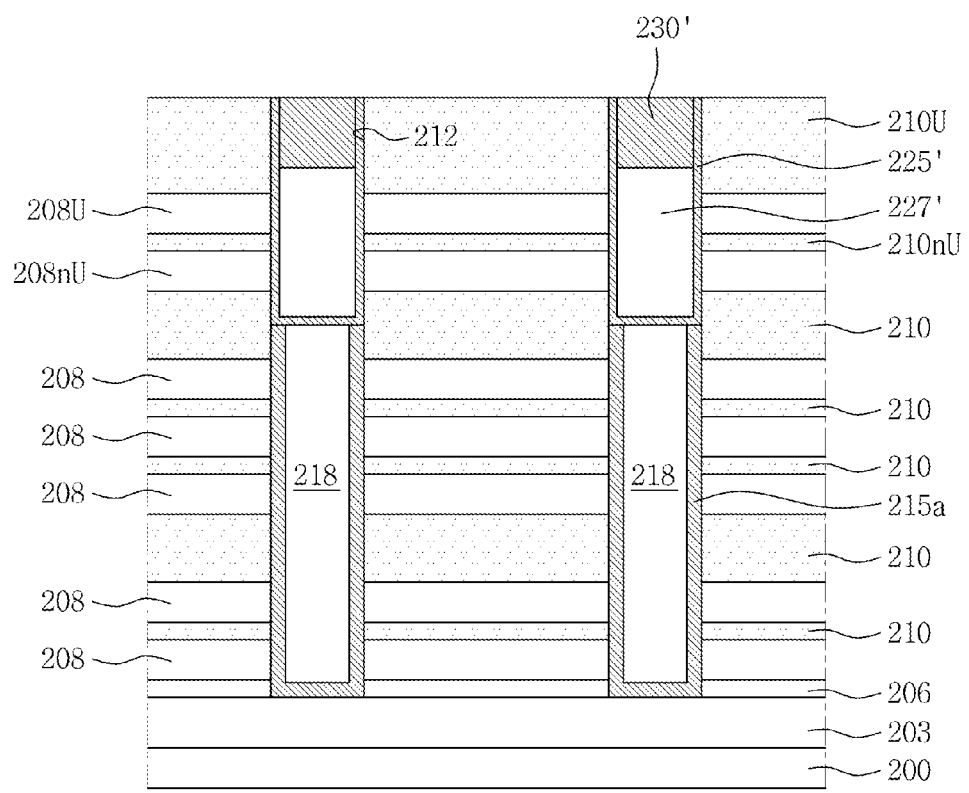

FIG. 20 is a flowchart illustrating a method of fabricating the semiconductor device shown in FIG. 3, and FIGS. 21A and 21B are cross-sectional views illustrating the method of fabricating the semiconductor device shown in FIG. 3. FIGS. 21A and 21B are cross-sectional views taken along line XXI-XXI' of FIG. 17B.

Figure 22:
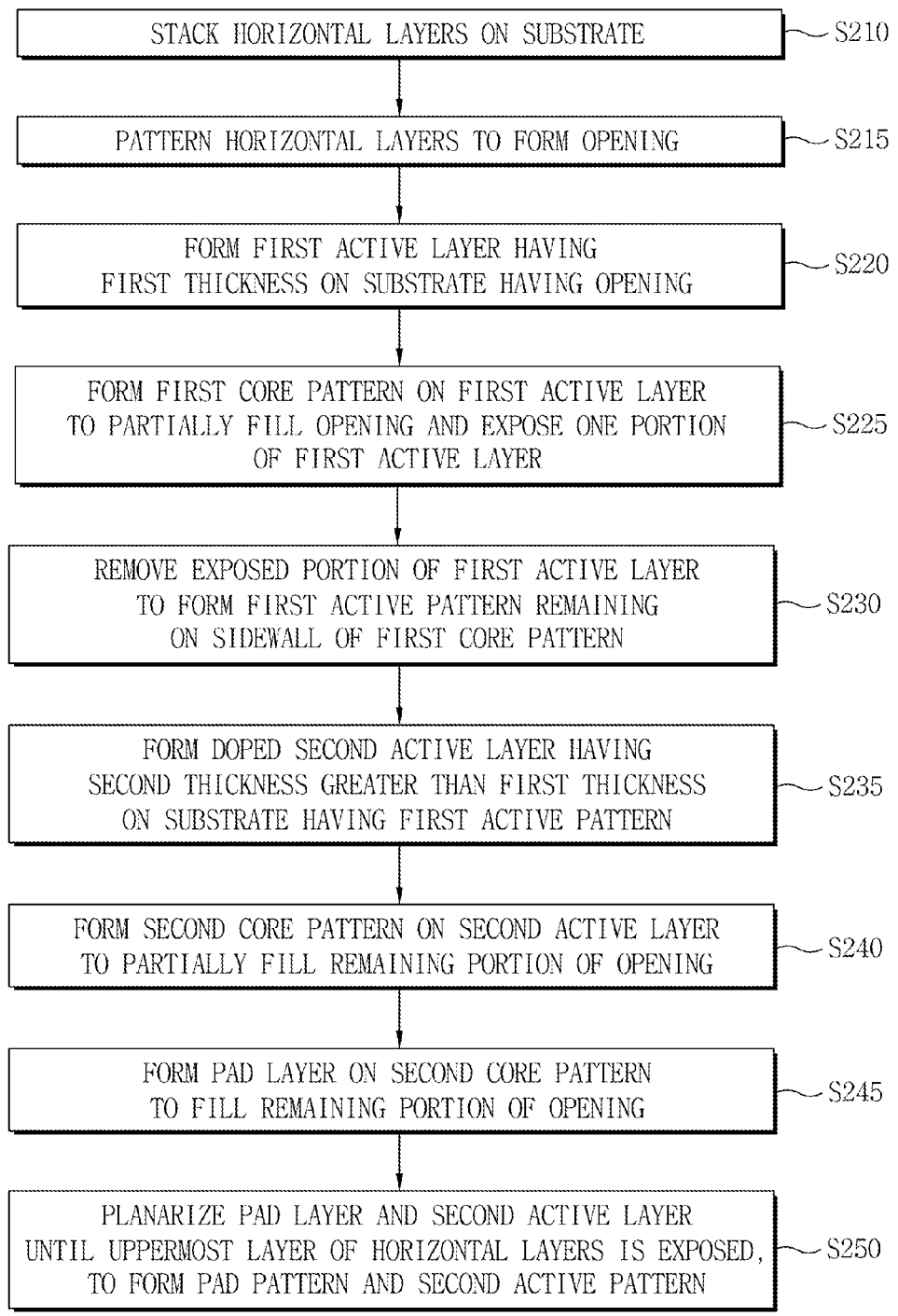
FIG. 22 is a flowchart illustrating a method of fabricating the semiconductor device according to the example embodiments of inventive concepts.
Figure 23A:
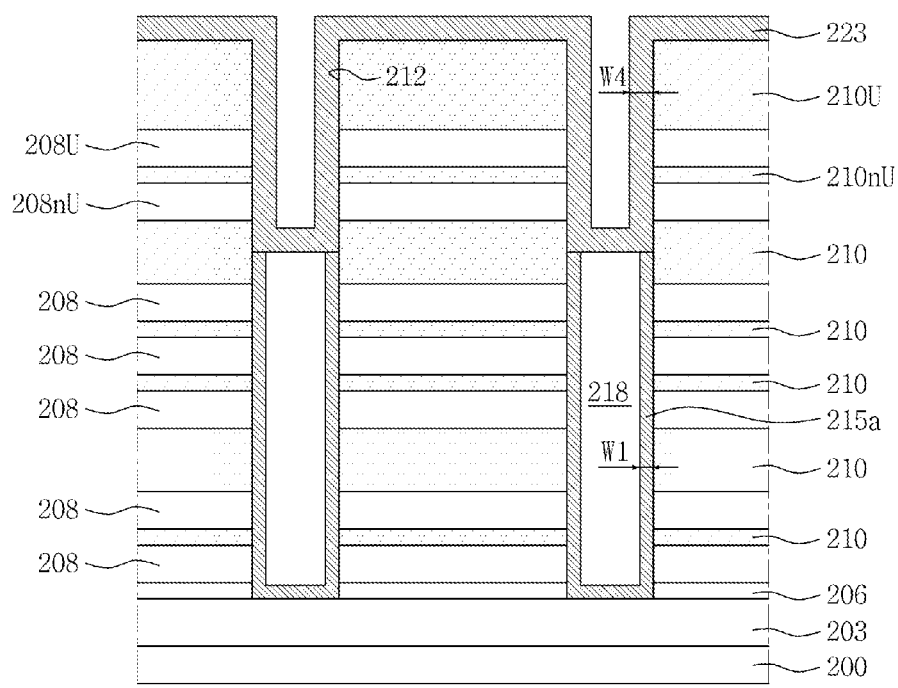
FIGS. 23A and 23B are cross-sectional views illustrating the method of fabricating the semiconductor device according to the example embodiments of inventive concepts.
Figure 23B:
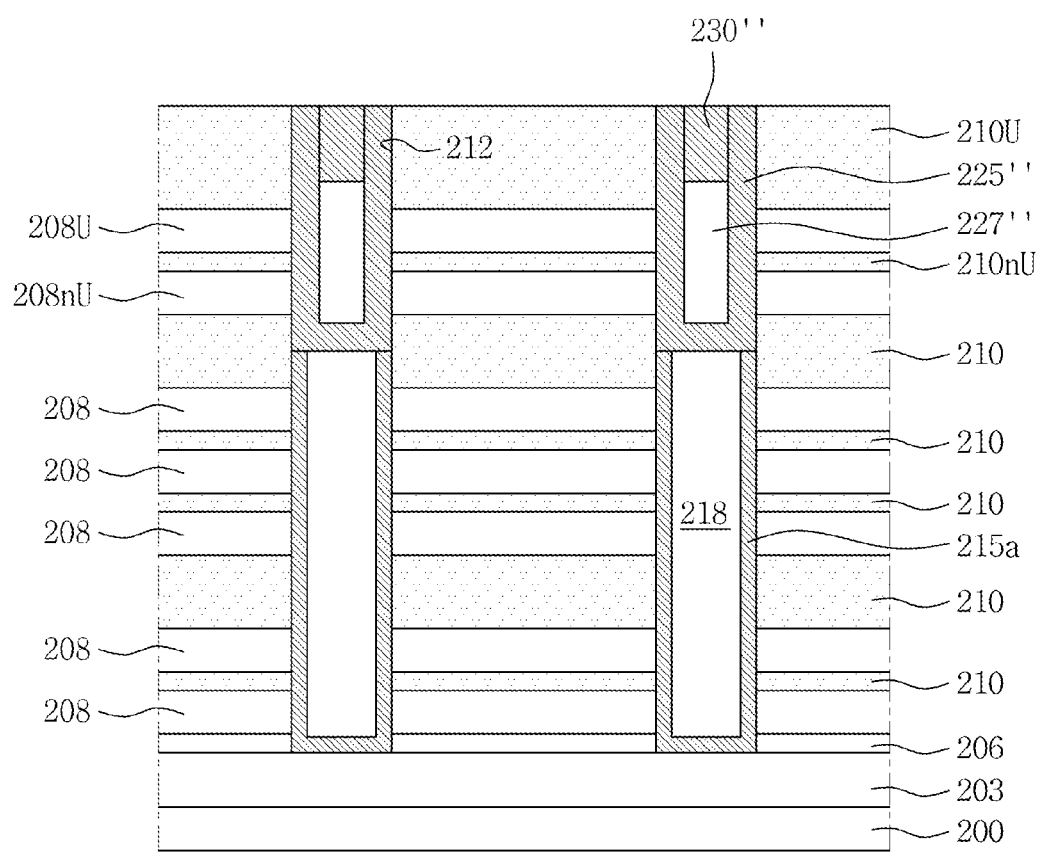

FIG. 22 is a flowchart illustrating a method of fabricating the semiconductor device shown in FIG. 5, and FIGS. 23A and 23B are cross-sectional views illustrating the method of fabricating the semiconductor device shown in FIG. 5. FIGS. 23A and 23B are cross-sectional views taken along line XXIII-XXIII' of FIG. 17C.

To begin with, the method of fabricating the semiconductor device shown in FIG. 1A will now be described with reference to FIG. 16.

Referring to FIG. 16, horizontal layers may be stacked on a substrate (operation S10). The horizontal layers may be formed by alternately and repeatedly stacking sacrificial layers and interlayer insulating layers. The horizontal layers may be patterned to form at least one opening (operation S15). The opening may penetrate the horizontal layers. A first active layer may be formed on the substrate having the opening (operation S20). The first active layer may be formed to a substantially uniform thickness on the substrate having the opening. Also, the first active layer may cover an inner wall of the opening to a substantially uniform thickness. The first active layer may be formed of a silicon layer.

A first core pattern may be formed on the first active layer to partially fill the opening (operation S25). The first core pattern may be formed of an insulating oxide. The first core pattern may expose a portion of the first active layer. The first active layer may be etched using the first core pattern and the horizontal layers as an etch mask. That is, the exposed first active layer may be etched to form a first active pattern (operation S30). A doped second active layer may be conformally formed on the substrate having the first active pattern and the first core pattern (operation S35). A second core pattern may be formed on the second active layer to partially fill the remaining portion of the opening (operation S40). The second core pattern may be formed of an insulating oxide. The second active layer may be formed of a doped silicon layer. A pad layer may be formed on the second core pattern to fill the remaining portion of the opening (operation S45). The pad layer may be formed of a silicon layer. Thereafter, the pad layer and the second active layer may be planarized until an uppermost layer of the horizontal layers is exposed, thereby forming a pad pattern and a second active pattern (operation S50).

The method of fabricating the semiconductor device described with reference to FIG. 16 will now be described in further detail with reference to FIGS. 17A and 18A through 18G.

Figure 18A:
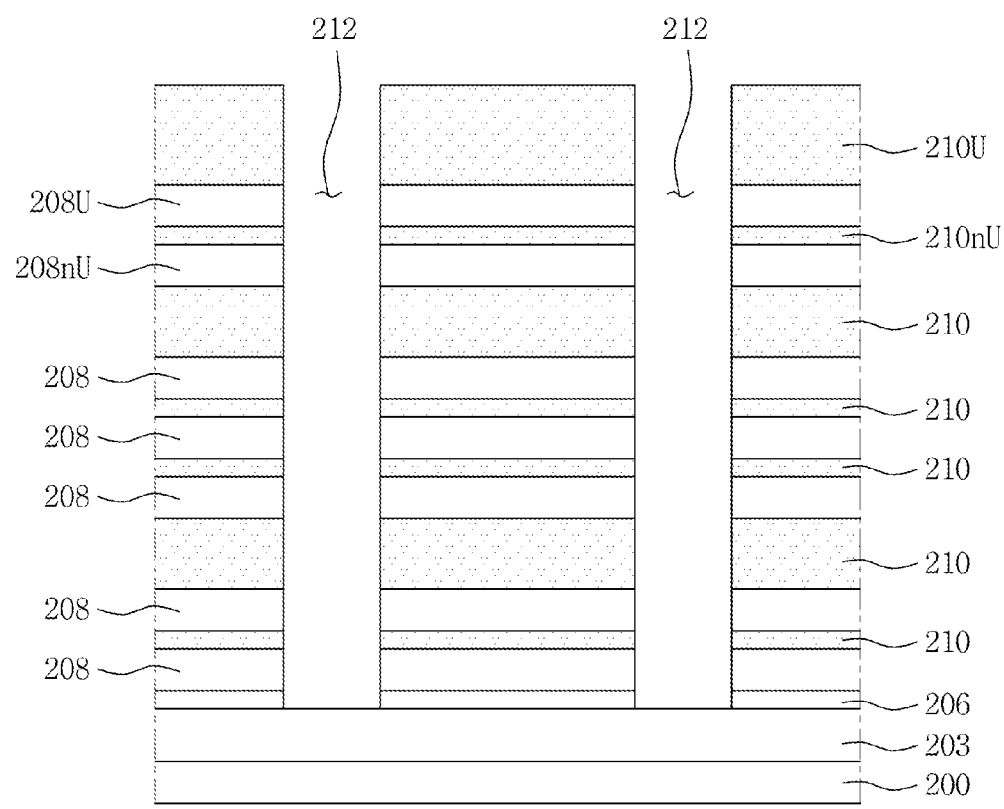
FIGS. 18A through 18G are cross-sectional views illustrating a method of fabricating the semiconductor device according to example embodiments of inventive concepts.
Figure 19:
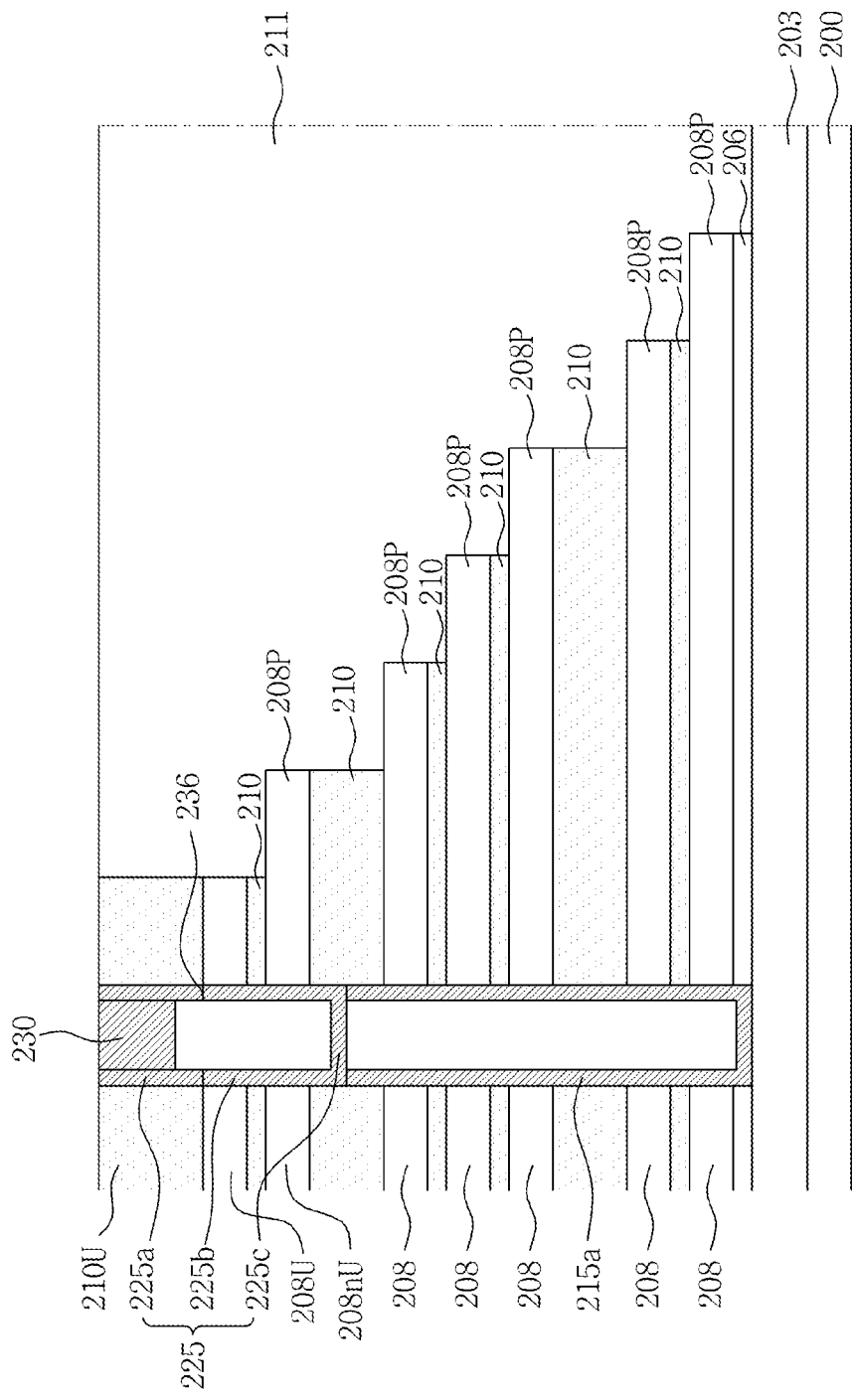
FIG. 19 is a cross-sectional view of a sacrificial pad of a semiconductor device according to example embodiments of inventive concepts.

Referring to FIGS. 16, 17A, and 18A, a substrate 200 having an impurity region 203 may be prepared. The substrate 200 may be a semiconductor substrate. The substrate 200 may include a memory cell region (or a cell array region) where memory cells are formed and a peripheral circuit region where peripheral circuits configured to operate the memory cells are formed. The substrate 200 may be a silicon substrate. The impurity region 203 may be a P-type well region.

A buffer insulating layer 206 may be formed on the substrate 200. For example, the buffer insulating layer 206 may be formed of silicon oxide or silicon oxynitride (SiON). In some embodiments, the buffer insulating layer 206 may be omitted.

Horizontal layers 208, 208$n$U, 208U, 210, 210$n$U, and 210U may be formed on the buffer insulating layer 206 of the substrate 200 (operation S10). The horizontal layers 208, 208$n$U, 208U, 210, 210$n$U, and 210U may include sacrificial layers 208, 208$n$U, and 208U and interlayer insulating layers 210, 210$n$U, and 210U, which are stacked alternately and repeatedly.

The sacrificial layers 208, 208$n$U, and 208U may be formed of a material having an etch selectivity with respect to the interlayer insulating layers 210, 210$n$U, and 210U. For example, each of the interlayer insulating layers 210, 210$n$U, and 210U may be formed of an insulating oxide (e.g., silicon oxide obtained using a chemical vapor deposition (CVD) method), while each of the sacrificial layers 208, 208$n$U, and 208U may be formed of an insulating nitride. For instance, the sacrificial layers 208, 208$n$U, and 208U may be formed of silicon nitride or silicon oxynitride (SiON). An uppermost layer of the horizontal layers 208, 208$n$U, 208U, 210, 210$n$U, and 210U including the sacrificial layers 208, 208$n$U, and 208U and the interlayer insulating layers 210, 210$n$U, and 210U that are stacked alternately may be the interlayer insulating layer 210U.

The thicknesses of the interlayer insulating layers 210, 210$n$U, and 210U may be substantially the same as the thicknesses of the interlayer insulating patterns 20 described with reference to FIG. 1A. Distances among the interlayer insulating layers 210, 210$n$U, and 210U may be substantially the same as distances among the interlayer insulating patterns 20 described with reference to FIG. 1A. Accordingly, since the interlayer insulating patterns 20 are described with reference to FIG. 1A, a detailed description of the thicknesses of and distances among the interlayer insulating layers 210, 210$n$U, and 210U will be omitted.

The interlayer insulating layers 210, 210$n$U, and 210U, the sacrificial layers 208, 208$n$U, and 208U and the buffer insulating layer 206 may be patterned to form at least one opening 212 (operation S15). The opening 212 may have a hole shape. The opening 212 may penetrate the interlayer insulating layers 210, 210$n$U, and 210U, the sacrificial layers 208, 208$n$U, and 208U and the buffer insulating layer 206 and expose a desired (and/or alternatively predetermined) region of the substrate 200.

Figure 18B:
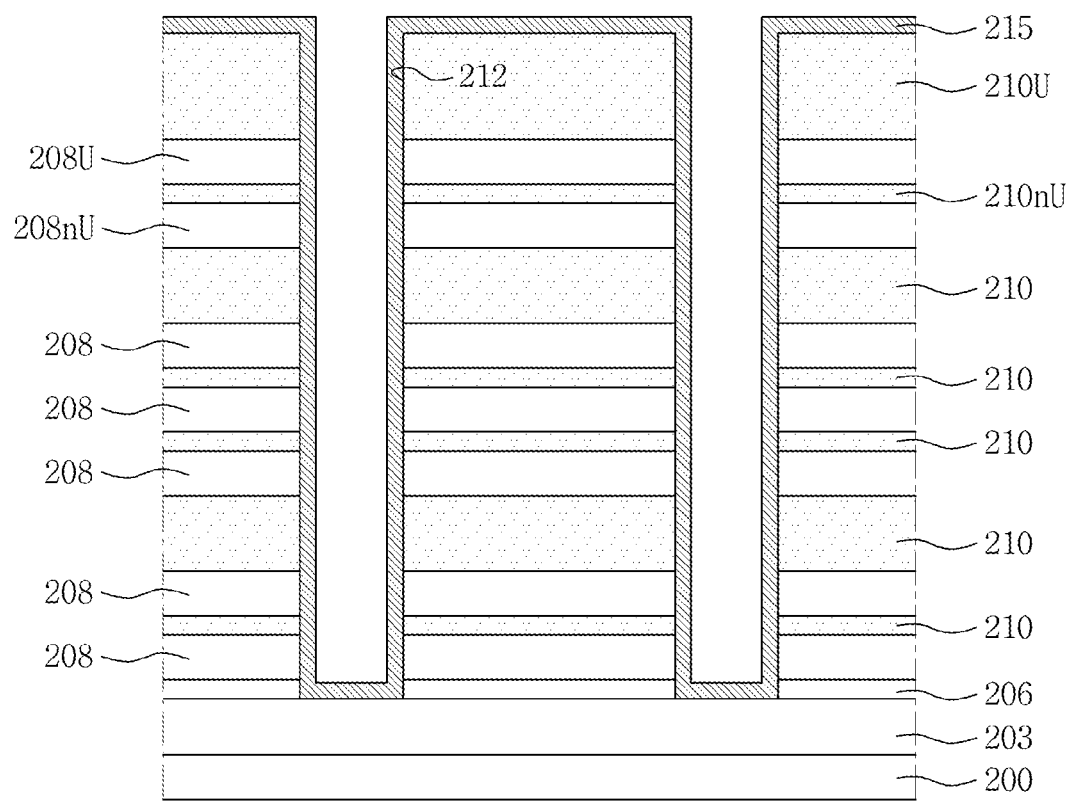

Referring to FIGS. 16, 17A, and 18B, a first active layer 215 may be formed on a substrate 200 having the opening 212 (operation S20). The formation of the first active layer 215 may include conformally forming a channel semiconductor layer on the substrate 200 having the opening 212. For example, the formation of the first active layer 215 may include conformally forming an amorphous silicon (a-Si) layer on the substrate 200 having the opening 212 and forming a crystalline silicon layer using an annealing process for crystallizing the a-Si layer. The annealing process may be performed at a temperature of about 500 to about 100° C. Thus, the first active layer 215 may be formed of a crystalline silicon layer. The crystalline silicon layer may be a poly-Si layer.

In some embodiments, the first active layer 215 may include an intrinsic semiconductor. For example, the first active layer 215 may be formed of an undoped poly-Si layer.

In other embodiments, the first active layer 215 may include an N-type semiconductor doped with a Group-V element, such as phosphorus (P) or arsenic (As).

In other embodiments, the first active layer 215 may include a P-type semiconductor doped with a Group-III element, such as B.

Figure 18C:
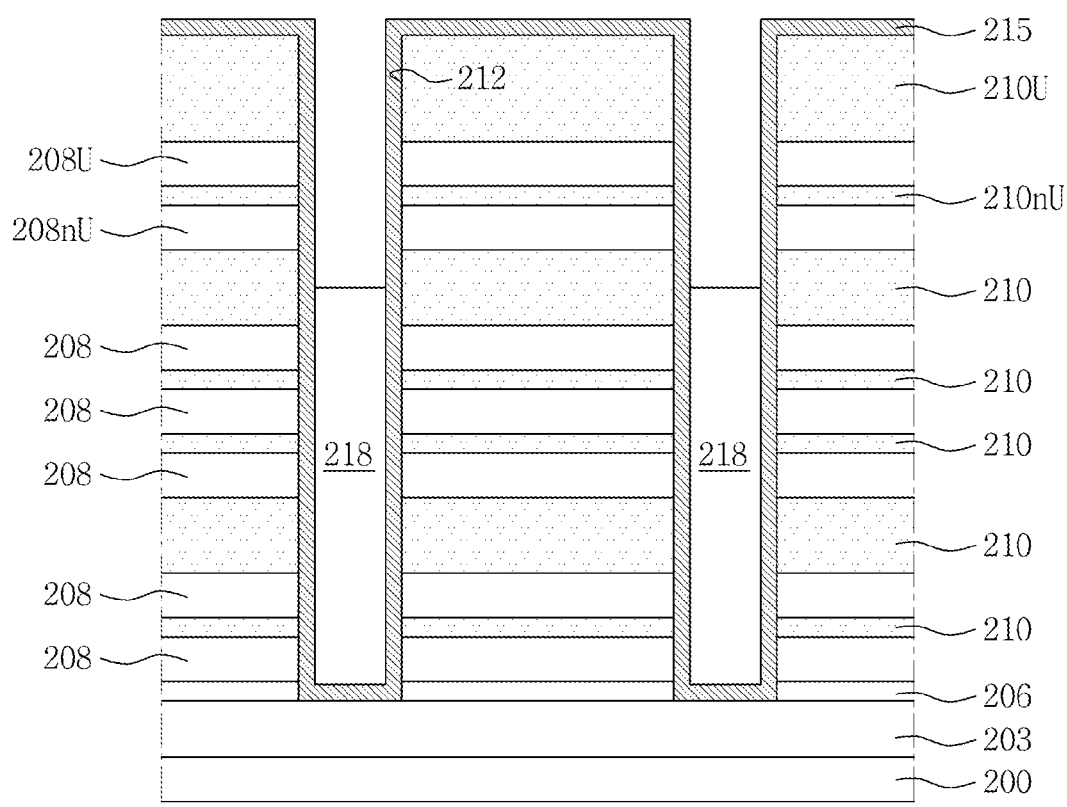

Referring to FIGS. 16, 17A, and 18C, a core layer may be formed on the first active layer 215 to fill the opening 212. The first core layer may be formed of an insulating oxide. For example, the first core layer may be formed of silicon oxide using an atomic layer deposition (ALD) process.

Thereafter, the first core layer may be partially etched to form a first core pattern 218 on the first active layer 215 to partially fill the opening 212. A portion of the first active layer 215 may be exposed by the first core pattern 218 (operation S25).

Figure 18D:
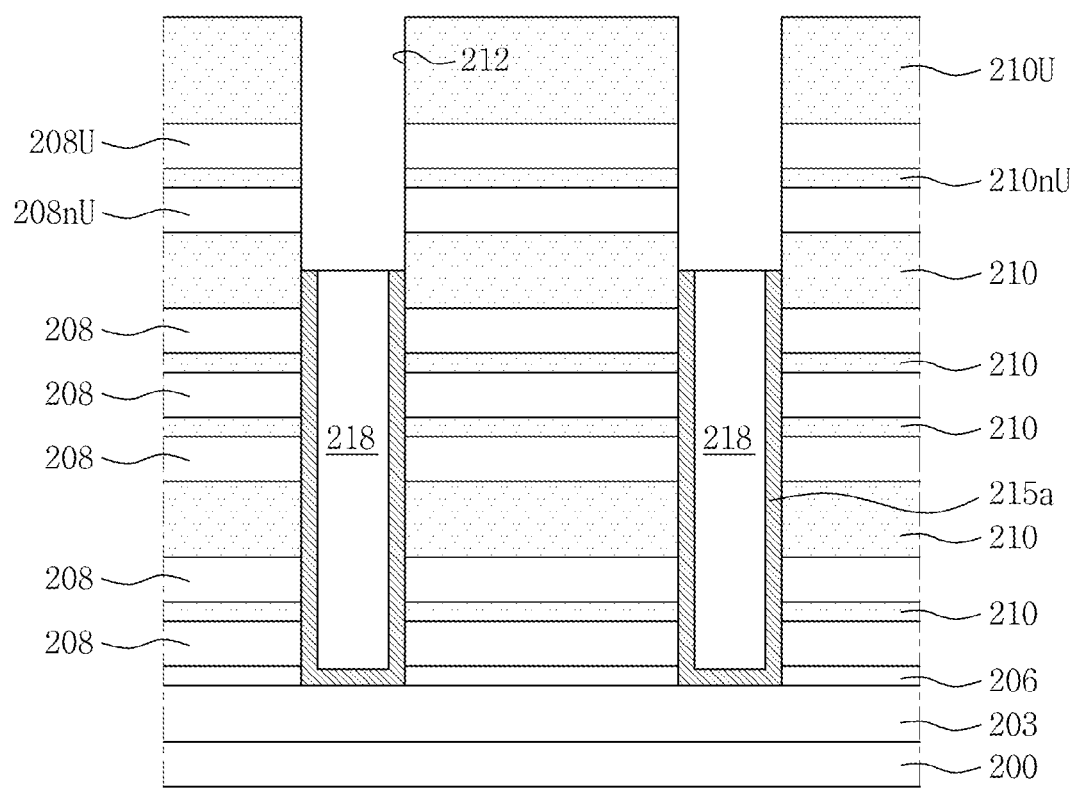

Referring to FIGS. 16, 17A, and 18D, the exposed first active layer 215 may be removed by etching using the first core pattern 218 as an etch mask. As a result, a first active pattern 215$a$ may remain on sidewalls of the first core pattern 218 (operation S30). The first active pattern 215$a$ may cover sidewalls and the bottom surface of the first core pattern 218.

Figure 18E:
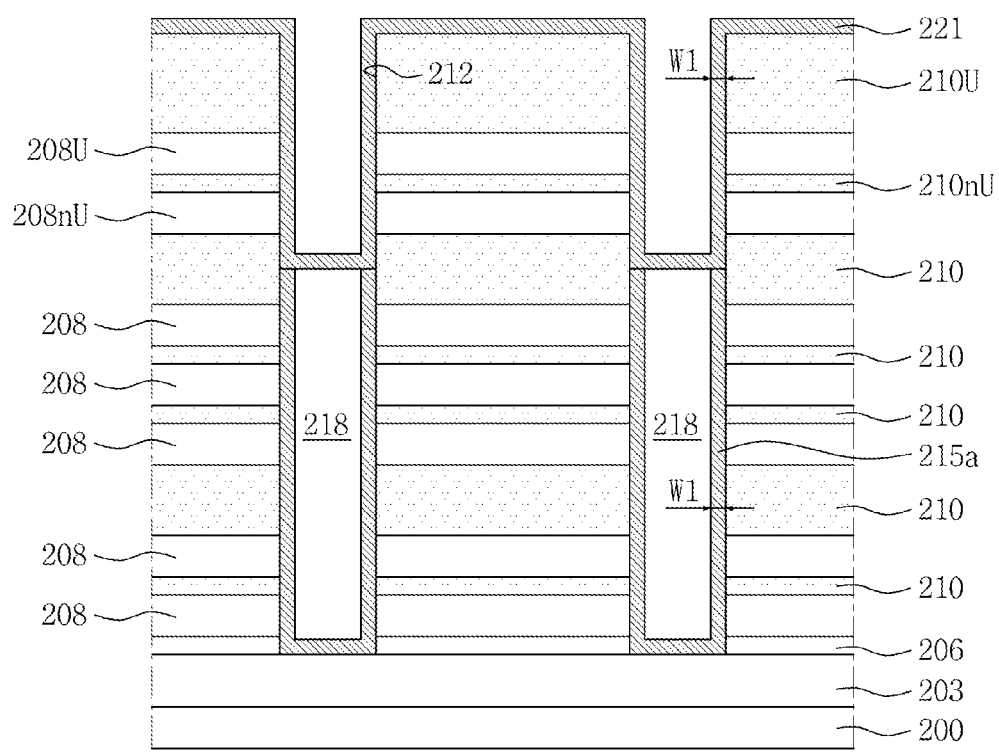

Referring to FIGS. 16, 17A, and 18E, a doped second active layer 221 may be conformally formed on the first core pattern 218 and a sidewall of the opening 212 (operation S35). The second active layer 221 may cover not only a top surface of the first core pattern 218 but also the sidewall of the opening 212 disposed on the first core pattern 218. A horizontal width W1 of the second active layer 221 may be substantially the same as a horizontal width W1 of the first active pattern 215$a$. The second active layer 221 may be formed of a doped crystalline silicon layer. For example, the second active layer 221 may be formed of a doped poly-Si layer.

The second active layer 221 may be formed of a doped poly-Si layer containing Group-III impurities, such as B. For example, the formation of the second active layer 221 may include forming a doped a-Si layer to conformally cover the substrate 200 having the first active pattern 215$a$ and forming a doped poly-Si layer using an annealing process for crystallizing the doped a-Si layer. In another case, the formation of the second active layer 221 may include forming an undoped a-Si layer to conformally cover the substrate 200 having the first active pattern 215$a$, doping Group-III impurities, such as B, into the undoped a-Si layer using a gas-phase doping process, and forming a doped poly-Si layer using an annealing process for crystallizing the doped a-Si layer.

Figure 18F:
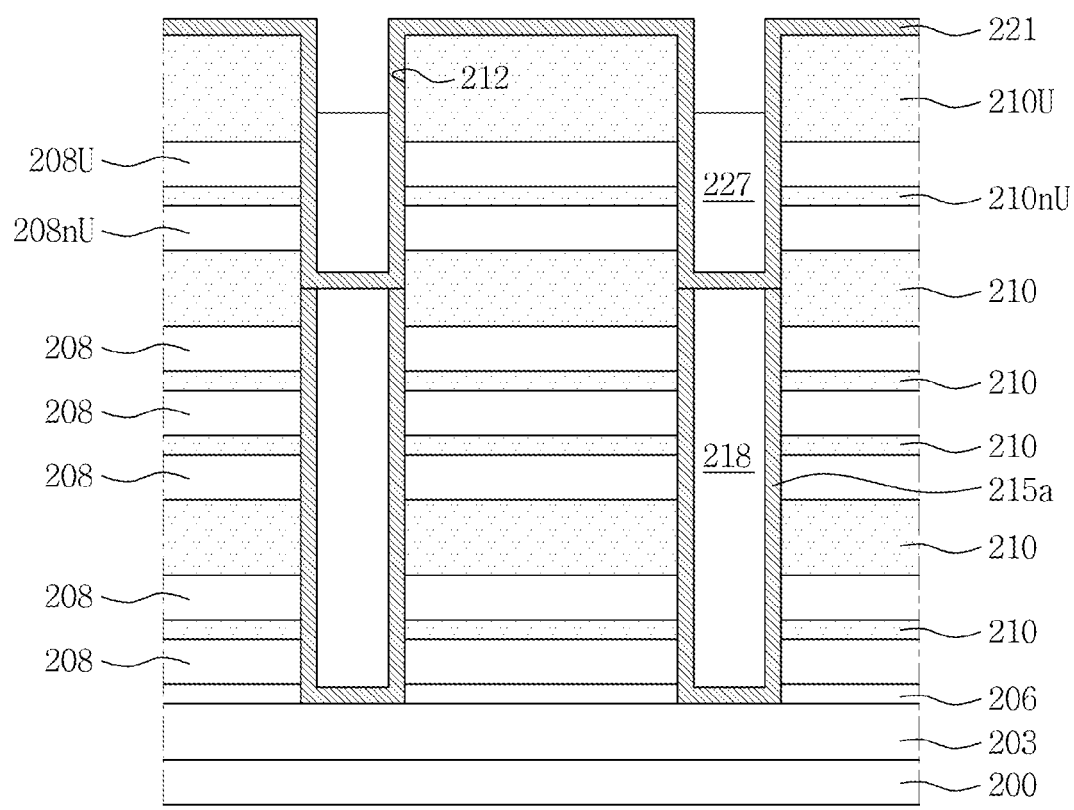

Referring to FIGS. 16, 17A, and 18F, a second core layer may be formed on the second active layer 221 to fill the opening 212. The second core layer may be formed of silicon oxide. The second core layer may be partially etched to form a second core pattern 227 on the second active layer 221 to partially fill the remaining portion of the opening 212 (operation S45).

In some embodiments, the first and second core patterns 218 and 227 may be formed of an insulating material. For example, the first and second core patterns 218 and 227 may be formed of silicon oxide using an ALD process.

In other embodiments, the first and second core patterns 218 and 227 may be formed of insulating materials having an etch selectivity with respect to each other. The first core pattern 218 may include a first oxide, while the second core pattern 227 may include a second oxide formed using a different method or under different process conditions from the first oxide. The first core pattern 33*a* may include an oxide formed at a first temperature, while the second core pattern 33*b* may include an oxide formed at a second temperature lower than the first temperature. The first core pattern 218 may be formed of a first oxide having a first density, while the second core pattern 227 may be formed of a second oxide having a second density lower than the first density. Here, the second oxide having the second density lower than the first density of the first oxide may have a higher etch rate than the first oxide with respect to an oxide etchant. For example, the first core pattern 218 may include the first oxide formed using a deposition process, such as an ALD process or a CVD process, while the second core pattern 227 may include the second oxide formed using a flowable oxide. Here, the flowable oxide may be a flowable CVD (F-CVD) oxide obtained using an F-CVD process or a Tonen SilaZene (TOSZ) obtained using a spin coating process.

Figure 18G:
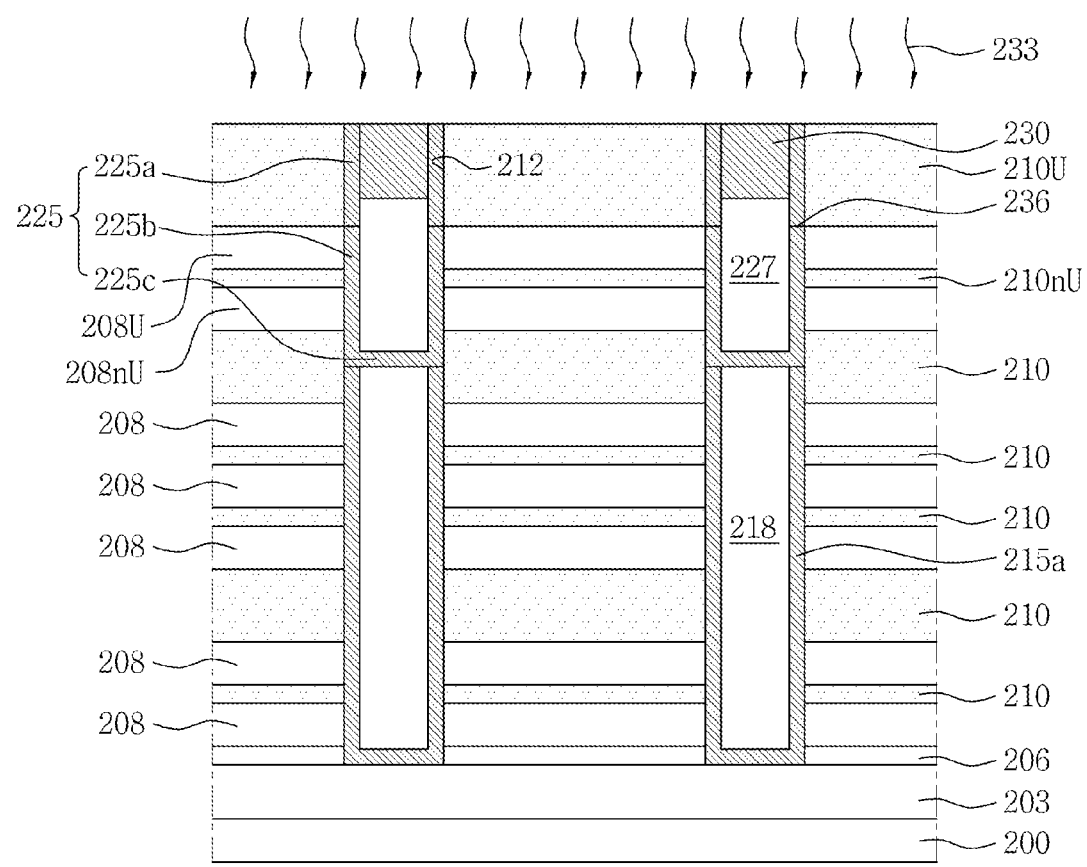

Referring to FIGS. 16, 17A, and 18G, a pad layer may be formed on the substrate 200 having the second core pattern 227 to fill the remaining portion of the opening 212 (operation S50). Thereafter, the pad layer and the second active layer 223 may be planarized until an uppermost interlayer insulating layer 210U of the horizontal layers 208, 208*n*U, 208U, 210, 210*n*U, and 210U is exposed, thereby forming a pad pattern 230 and a second active pattern 225 (operation S55). The planarization process may be performed using a chemical mechanical polishing (CMP) process and/or an etchback process. The pad pattern 230 may be formed of a poly-Si layer. Thus, the first and second active patterns 215*a* and 225, the first and second core patterns 218 and 227, and the pad pattern 230 may be formed within the opening 212. The pad pattern 230 may be electrically connected to an interconnection line (e.g., bitline, not shown) over the pad pattern 230.

The second active pattern 225 may include a bottom portion 225*c* extending between the first and second core patterns 218 and 227. The first and second core patterns 218 and 227 may be spaced apart from each other by the bottom portion 225*c* of the second active pattern 225.

An ion implantation process 233 may be performed on the substrate 200 having the pad pattern 230 and the second active pattern 225 so that impurities can be implanted into a portion of the second active pattern 225 and the pad pattern 230. For example, a Group-V element, such as P or As, may be implanted into the pad pattern 230 and the second active pattern 225 so that the portion of the second active pattern 225 and the pad pattern 230 can have an N conductivity type. Thus, a PN junction 236 may be formed within the second active pattern 225.

On the basis of the PN junction 236, the second active pattern 225 may include a first portion 225*a* disposed adjacent to the pad pattern 230 and a second portion 225*b* disposed adjacent to the first active pattern 215*a*. The first portion 225*a* of the second active pattern 225 may have an N conductivity type, while the second portion 225*b* thereof may have a P conductivity type. Also, the pad pattern 230 may have an N conductivity type. Since the PN junction 236 is substantially the same as the PN junction 45 described with reference to FIG. 1A, a detailed description thereof will be omitted.

Before the second core pattern (refer to 227 in FIG. 18F) is formed, the second active layer (refer to 221 in FIG. 18E) may be formed in a doped state. Thus, before the second core pattern 227 is formed, the second portion 225*b* of the finally formed second active pattern 225 may be formed in a doped state. The second portion 225*b* of the second active pattern 225 may correspond to the second portion 43*b* of the second active pattern 43 described with reference to FIG. 1A, while the second core pattern 227 may correspond to the second core pattern 33*b* described with reference to FIG. 1A. Accordingly, before the second core pattern 227 is formed, impurities may be doped into the second portion 225*b*, which corresponds to the channel region of the string selection transistor described with reference to FIG. 1A. As a result, without hindrance of the second core pattern 227, impurities, such as B, may be stably and uniformly optionally doped into the second portion 225*b* of the second active pattern 225.

Next, the process of forming sacrificial pads 208P in the method of fabricating the semiconductor device according to the embodiments of the inventive concept will be described with reference to FIGS. 17A and 19.

Referring to FIGS. 17A and 19, the interlayer insulating layers 210, 210*n*U, and 210U and the sacrificial layers 208, 208*n*U, and 208U may be patterned to form the sacrificial pads 208P. The sacrificial pads 208P may have a stepped shape. The interlayer insulating layers 210, 210*n*U, and 210U and the sacrificial layers 208, 208*n*U, and 208U may be etched using a mask pattern as a consumptive etch mask. For example, a mask pattern may be formed to define the sacrificial pad 208P of a lowermost sacrificial layer of the sacrificial layers 208, 208*n*U, and 208U, and the interlayer insulating layers 210, 210*n*U, and 210U and the sacrificial layers 208, 208*n*U, and 208U may be etched using the mask pattern as an etch mask. As a result, the sacrificial pad 208P of the lowermost sacrificial layer may be formed. Thereafter, the mask pattern may be recessed using an isotropic etching process, thereby reducing the width of the mask pattern. The sacrificial layers 208 disposed on the lowermost sacrificial layer and the interlayer insulating layers 210 may be etched using the mask pattern with the reduced width as an etch mask. Thus, the sacrificial pad 208P of the second lowermost sacrificial layer 208 stacked on the substrate 200 may be formed, and the sacrificial pad 208P of the lowermost sacrificial layer may be exposed. The process of recessing the mask pattern and the process of etching the interlayer insulating layers 210, 210*n*U, and 210U and the sacrificial layers 208, 208*n*U, and 208U may be repeatedly performed, thereby forming the sacrificial pads 208P having a stepped shape. Subsequently, the recessed mask pattern may be removed by etching. In another case, the recessed mask pattern may be remained.

The formation of the stepped sacrificial pads 208P is not limited to the above-described embodiments. The stepped sacrificial pads 208P may be embodied using another method. For example, by use of a consumptive mask pattern, the uppermost interlayer insulating layer and sacrificial layers are patterned, and the remaining interlayer insulating layers and sacrificial layers may be sequentially patterned downward from above, thereby forming stepped sacrificial pads containing a Group-III element.

A capping insulating layer 211 may be formed to cover the stepped sacrificial pads 208P. The capping insulating layer 211 may be formed of an insulating material having an etch selectivity with respect to the sacrificial layers 208, 208$n$U, and 208U. For example, when the sacrificial layers 208, 208$n$U, and 208U are formed of silicon nitride, the capping insulating layer 211 may be formed of silicon oxide. The capping insulating layer 211 may fill an etched region for the stepped structure.

In some embodiments, after the first and second active patterns 215$a$ and 225, the first and second core patterns 218 and 227, and the pad pattern 230 are formed within the opening 212, the sacrificial pads 208P having the stepped structure may be formed. However, the inventive concept is not limited thereto. For example, after the sacrificial pads 208P having the stepped structure are formed, the capping insulating layer 211 may be formed, the opening 212 may be formed, and the first and second active patterns 215$a$ and 225, the first and second core patterns 218 and 227, and the pad pattern 230 may be formed within the opening 212.

Next, a method of fabricating the semiconductor device shown in FIG. 3 will be described with reference to FIG. 20.

Referring to FIG. 20, horizontal layers may be stacked on a substrate (operation S110). The horizontal layers may be patterned to form at least one opening (operation S115). The opening may penetrate the horizontal layers. A first active layer having a first thickness may be formed on the substrate having the opening (operation S120). The first active layer may be formed to a substantially uniform thickness on the substrate having the opening.

A first core pattern may be formed on the first active layer to partially fill the opening and expose a portion of the first active layer (operation S125).

The exposed portion of the first active layer may be removed to form a first active pattern (operation S130). The first active pattern may be formed to cover sidewalls and a bottom surface of the first core pattern.

A second active layer having a second thickness smaller than the first thickness may be conformally formed on the substrate having the first active pattern (operation S135). The second active layer may be formed of a doped silicon layer.

A second core pattern may be formed on the second active layer to partially fill the remaining portion of the opening (operation S140). The second core pattern may be formed of an insulating oxide.

A pad layer may be formed on the second core pattern to fill the remaining portion of the opening (operation S145). The pad layer may be formed of a silicon layer.

Thereafter, the pad layer and the second active layer may be planarized until the horizontal layers are exposed, thereby forming a pad pattern and a second active pattern (operation S150).

The method of fabricating a semiconductor device described with reference to FIG. 20, according to example embodiments of inventive concepts, may include some modified portions of the method of fabricating the semiconductor device described with reference to FIGS. 16 through 18G, according to example embodiments of inventive concepts. Hereinafter, the modified portions of the method described with reference to FIGS. 16 through 18G will be chiefly described with reference to FIGS. 21A and 21B.

Referring to FIGS. 17B, 20 and 21A, a substrate having the first active pattern 215$a$ and the first core pattern 218 described with reference to FIG. 18D may be prepared (operations S110 to S130). Thereafter, a second active layer 222 may be conformally formed on the substrate having the first active pattern 215$a$ (operation S135). The second active layer 222 may be formed to conformally cover the remaining portion of an opening 212 partially filled with the first active pattern 215$a$ and the first core pattern 218.

The first active pattern 215$a$ may be formed to a first thickness W1, while the second active layer 222 may be formed to a second thickness W2 smaller than the first thickness W1. That is, on the basis of a sidewall of the opening 212, the first active pattern 215$a$ may have a first horizontal width W1, and the second active layer 222 may have a second horizontal width W2 smaller than the first horizontal width W1.

Referring to FIGS. 17B, 20 and 21B, a second core pattern 227' may be formed on the second active layer 222 using substantially the same method as described with reference to FIG. 18F to partially fill the opening 212 (operation S140). Thereafter, a pad layer may be formed on the substrate having the second core pattern 227' using substantially the same method as described with reference to FIG. 18G (operation S145). Subsequently, the pad layer and the second active layer 222 may be planarized until an uppermost layer 210U of horizontal layers 208, 208$n$U, 208U, 210, 210$n$U, and 210U is exposed, thereby forming a second active pattern 225' and a pad pattern 230' within the opening 212 (operation S150).

Next, a method of fabricating the semiconductor device shown in FIG. 5 according to example embodiments of inventive concepts will be described with reference to FIG. 22.

Referring to FIG. 22, horizontal layers may be stacked on a substrate (operation S210). The horizontal layers may be patterned to form an opening (operation S215). A first active layer having a first thickness may be formed on the substrate having the opening (operation S220). The first active layer may be formed to a substantially uniform thickness on the substrate having the opening. A first core pattern may be formed on the first active layer to partially fill the opening and expose a portion of the first active layer (operation S225). The exposed portion of the first active layer may be removed to form a first active pattern (operation S230). A second active layer having a second thickness greater than the first thickness may be conformally formed on the substrate having the first active pattern (operation S235). The second active layer may be formed of a doped silicon layer.

A second core pattern may be formed on the second active layer to partially fill the remaining portion of the opening (operation S240). A pad layer may be formed on the second core pattern to fill the remaining portion of the opening (operation S245). Thereafter, the pad layer and the second active layer may be planarized until the horizontal layers are exposed, thereby forming a pad pattern and a second active pattern (operation S250).

The method of fabricating a semiconductor device described with reference to FIG. 22, according to example embodiments of inventive concepts, may include some modified portions of the method of fabricating the semiconductor device described with reference to FIGS. 16 through 18G, according to example embodiments of inventive concepts. Hereinafter, the modified portions of the method described with reference to FIGS. 16 through 18G will be chiefly described with reference to FIGS. 23A and 23B.

Referring to FIGS. 17C, 22 and 23A, a substrate having the first active pattern 215$a$ and the first core pattern 218 described with reference to FIG. 18D may be prepared (operations S210 to S230). Thereafter, a second active layer 223 may be conformally formed on the substrate having the first active pattern 215$a$ (operation S235). The second active layer 223 may be formed to conformally cover the remaining portion of the opening 212 partially filled with the first active pattern 215a and the first core pattern 218.

The first active pattern 215a may be formed to a first thickness W1, and the second active layer 223 may be formed to a second thickness W4 greater than the first thickness. That is, on the basis of a sidewall of the opening 212, a horizontal width W4 of the second active layer 223 may be greater than a horizontal width W1 of the first active pattern 215a.

Referring to FIGS. 17C, 22 and 23B, a second core pattern 227" may be formed on the second active layer 222 using substantially the same method as described with reference to FIG. 18F to partially fill the opening 212 (operation S240). Thereafter, a pad layer may be formed on the substrate having the second core pattern 227" using substantially the same method as described with reference to FIG. 18G (operation S245). Thereafter, the pad layer and the second active layer 223 may be planarized until an uppermost horizontal layer 210 of the horizontal layers 208, 208nU, 208U, 210, 210nU, and 210U is exposed, thereby forming a second active pattern 225" and a pad pattern 230" within the opening 212 (S250).

Hereinafter, methods of fabricating nonvolatile memory devices according to embodiments of the inventive concept by performing additional processes on the substrates formed using the methods of fabricating the semiconductor devices described with reference to FIGS. 16 through 23B according to example embodiments of inventive concepts will be described. The additional processes will now be described with reference to FIGS. 24 through 31B.

Figure 24:
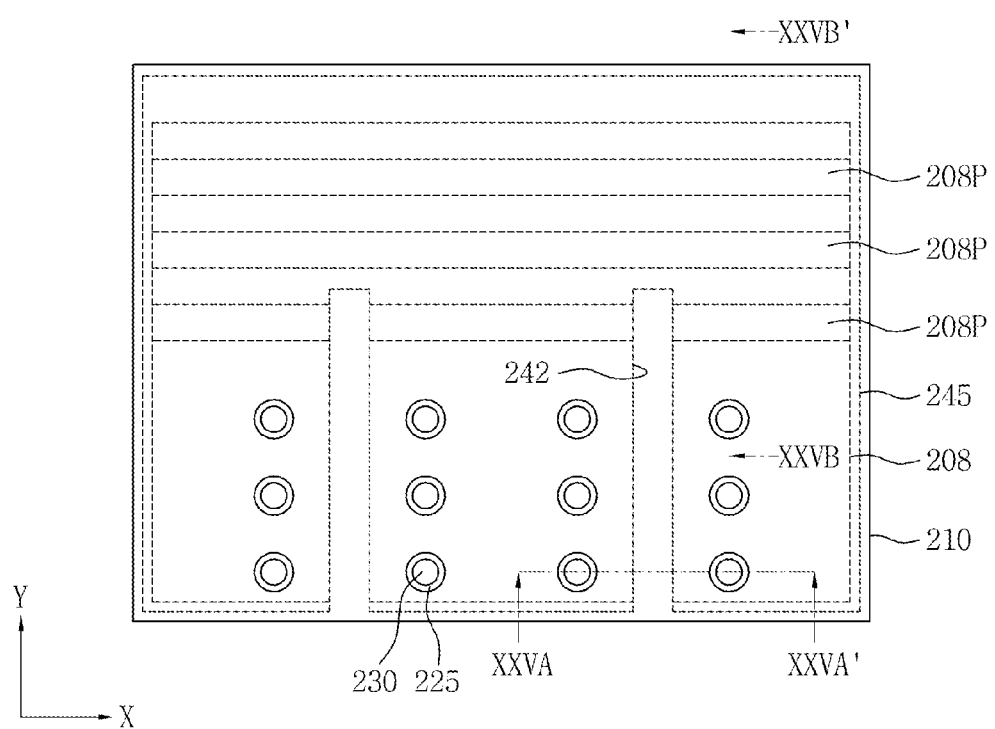
FIGS. 24 through 31B are diagrams illustrating methods of fabricating nonvolatile memory devices according to example embodiments of inventive concepts.
Figure 25A:
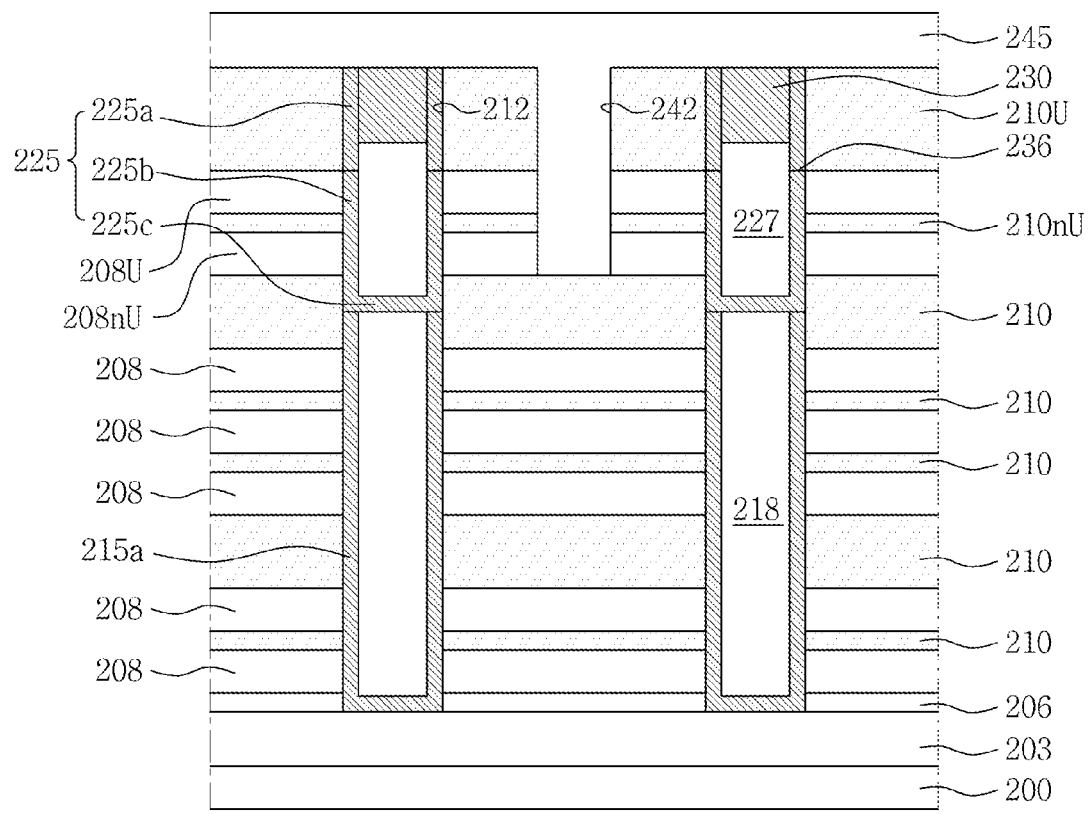
Figure 25B:
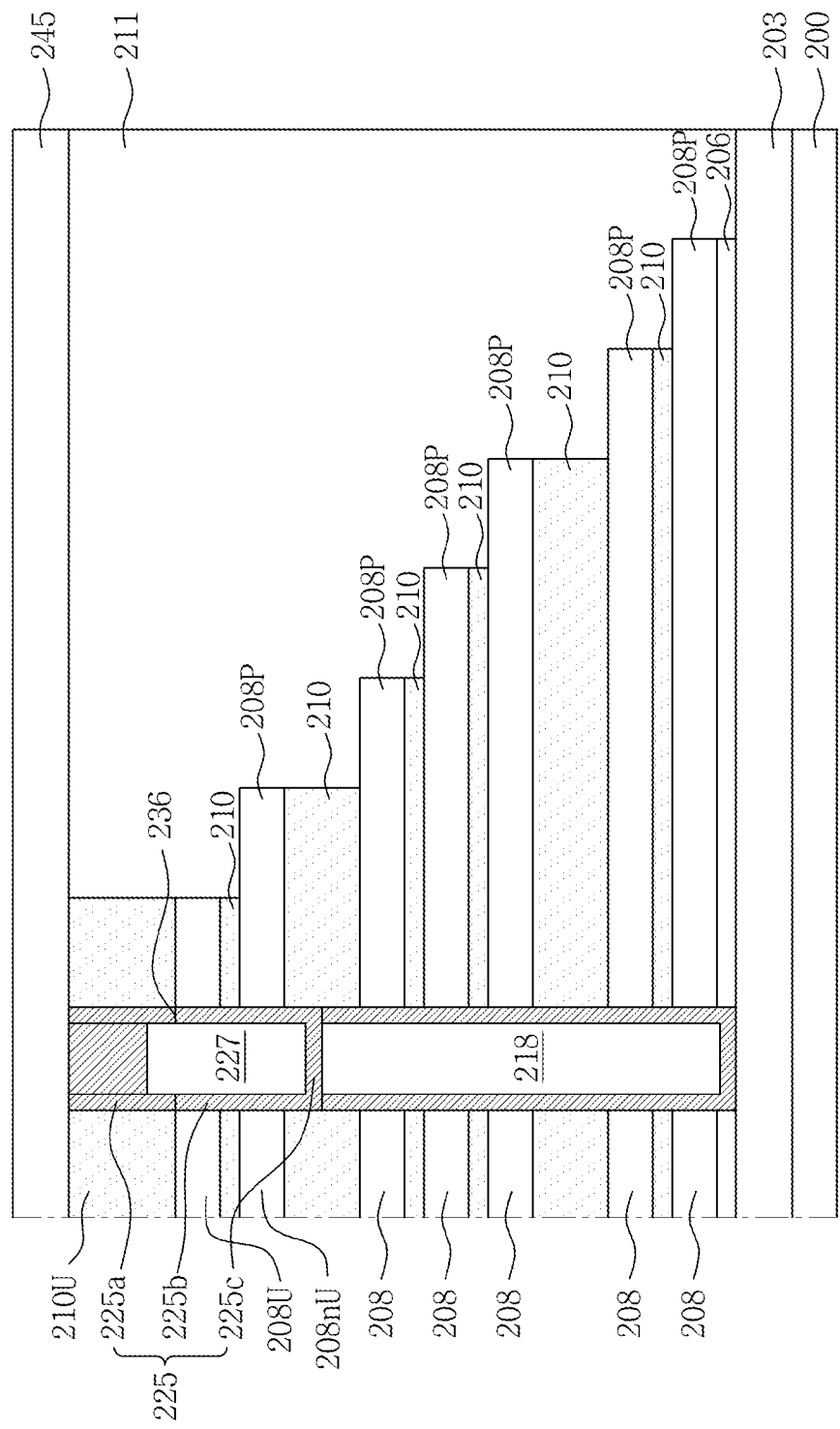
Figure 26A:
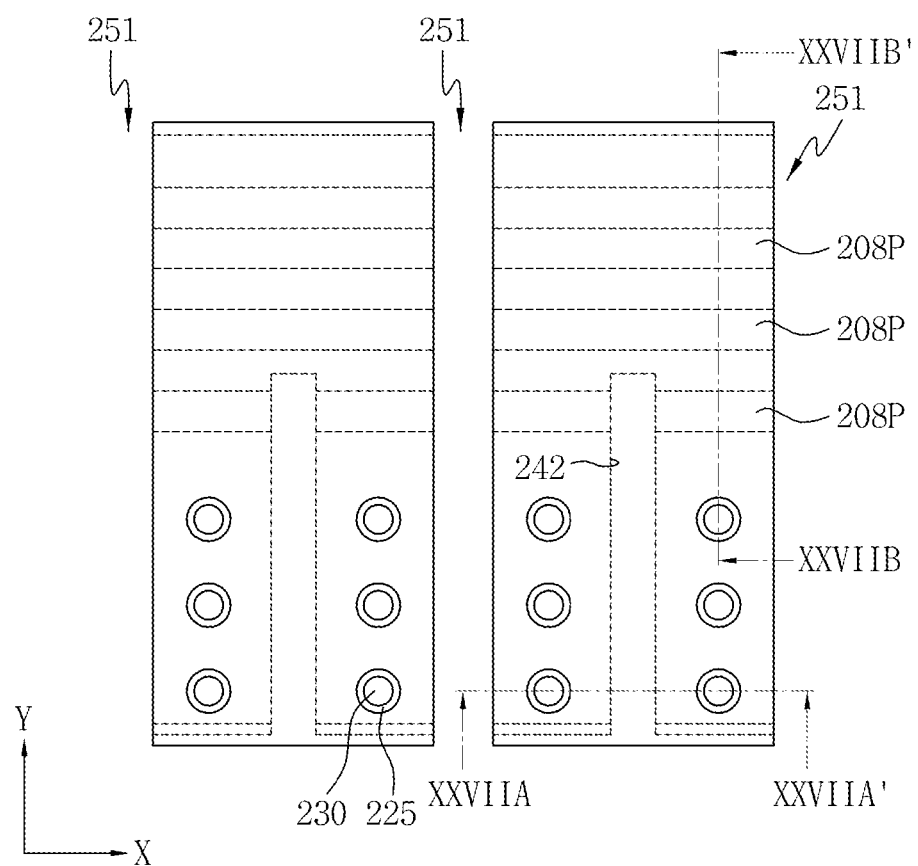
Figure 26B:
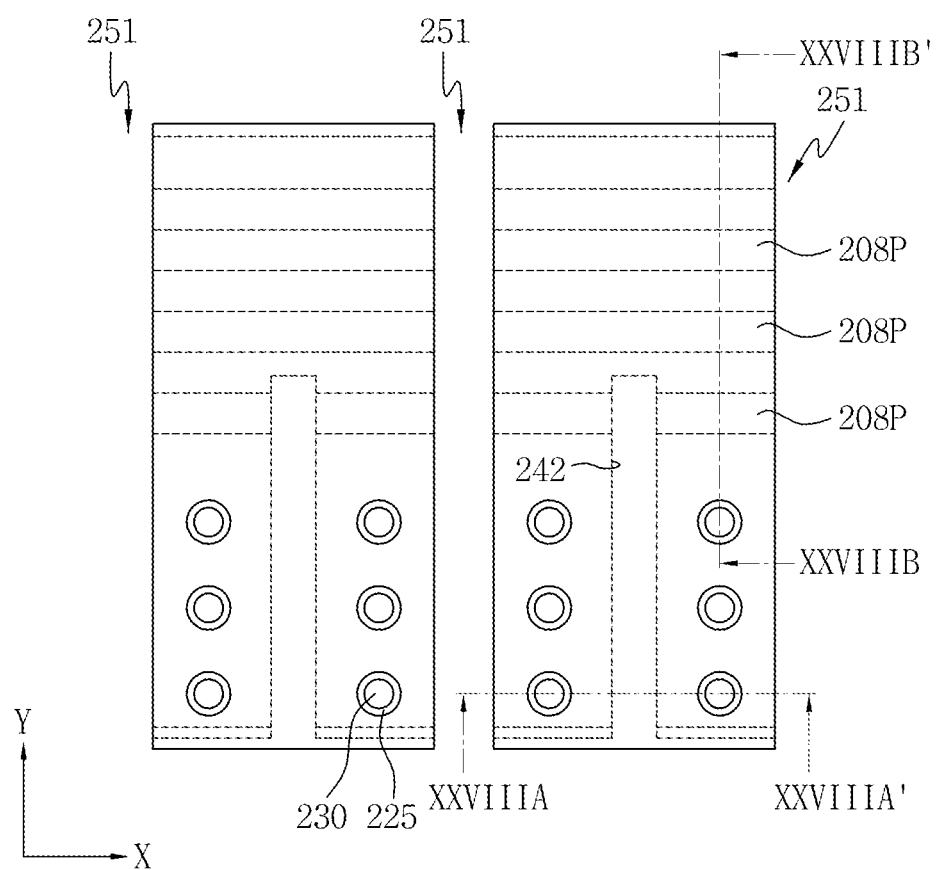
Figure 26C:
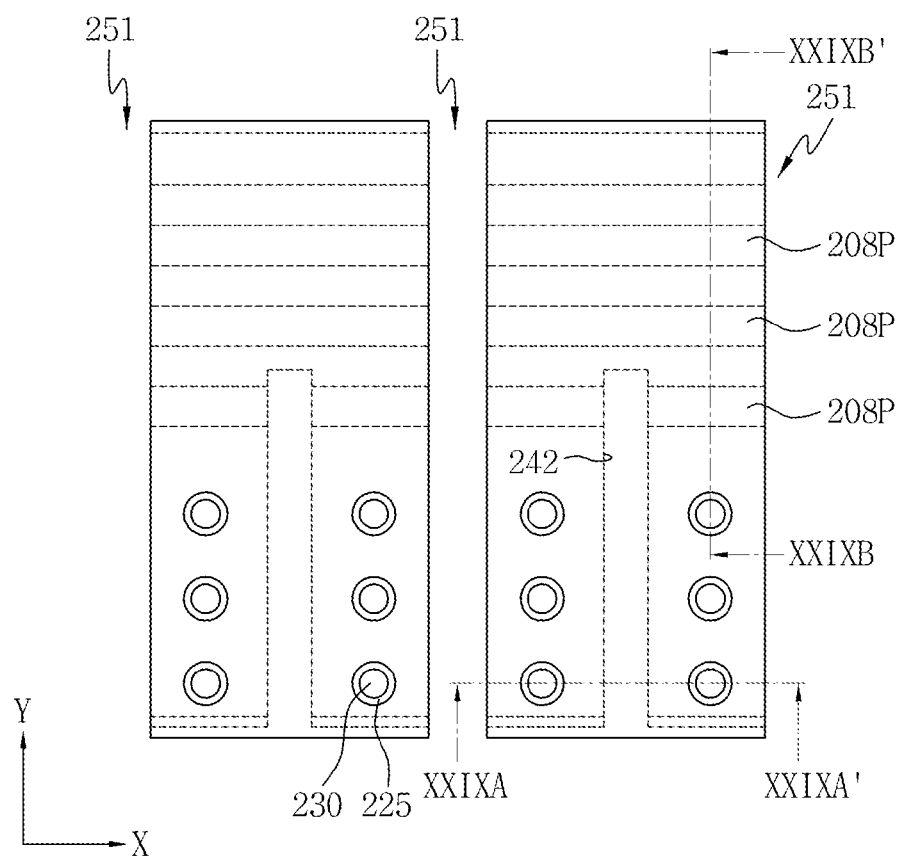
Figure 27A:
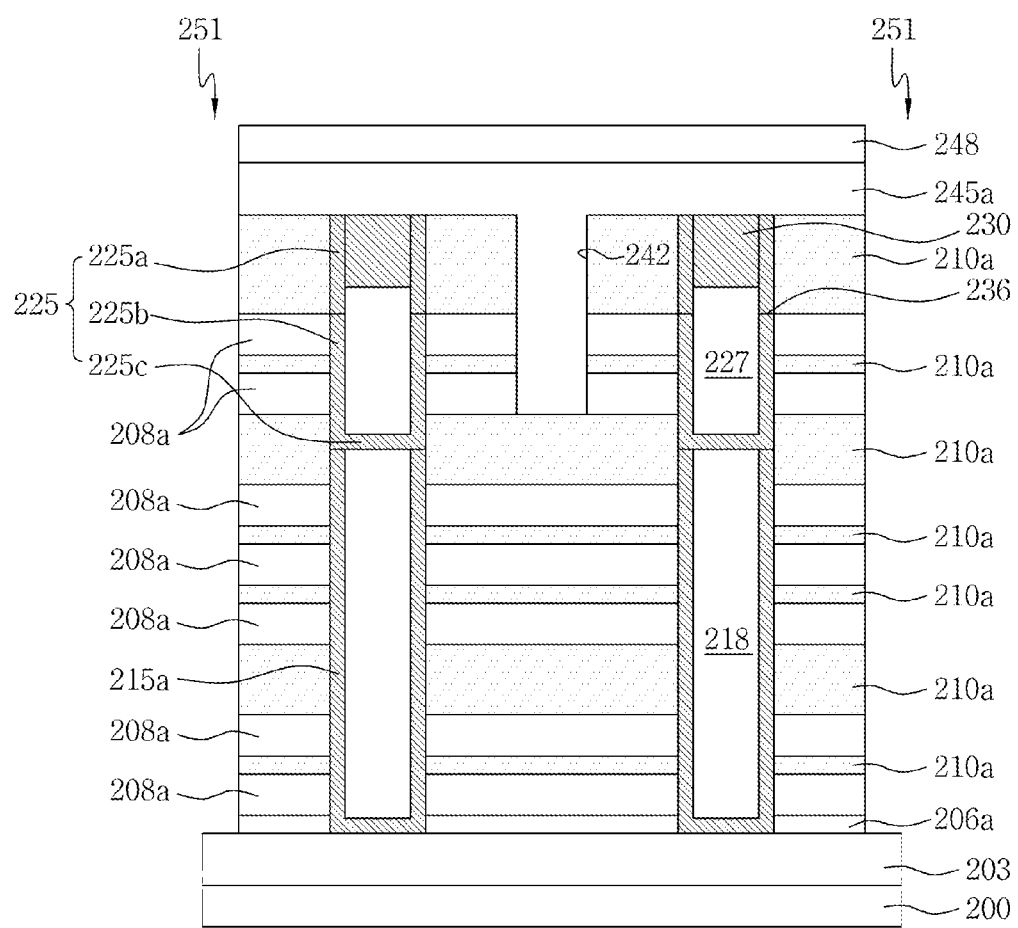
Figure 27B:
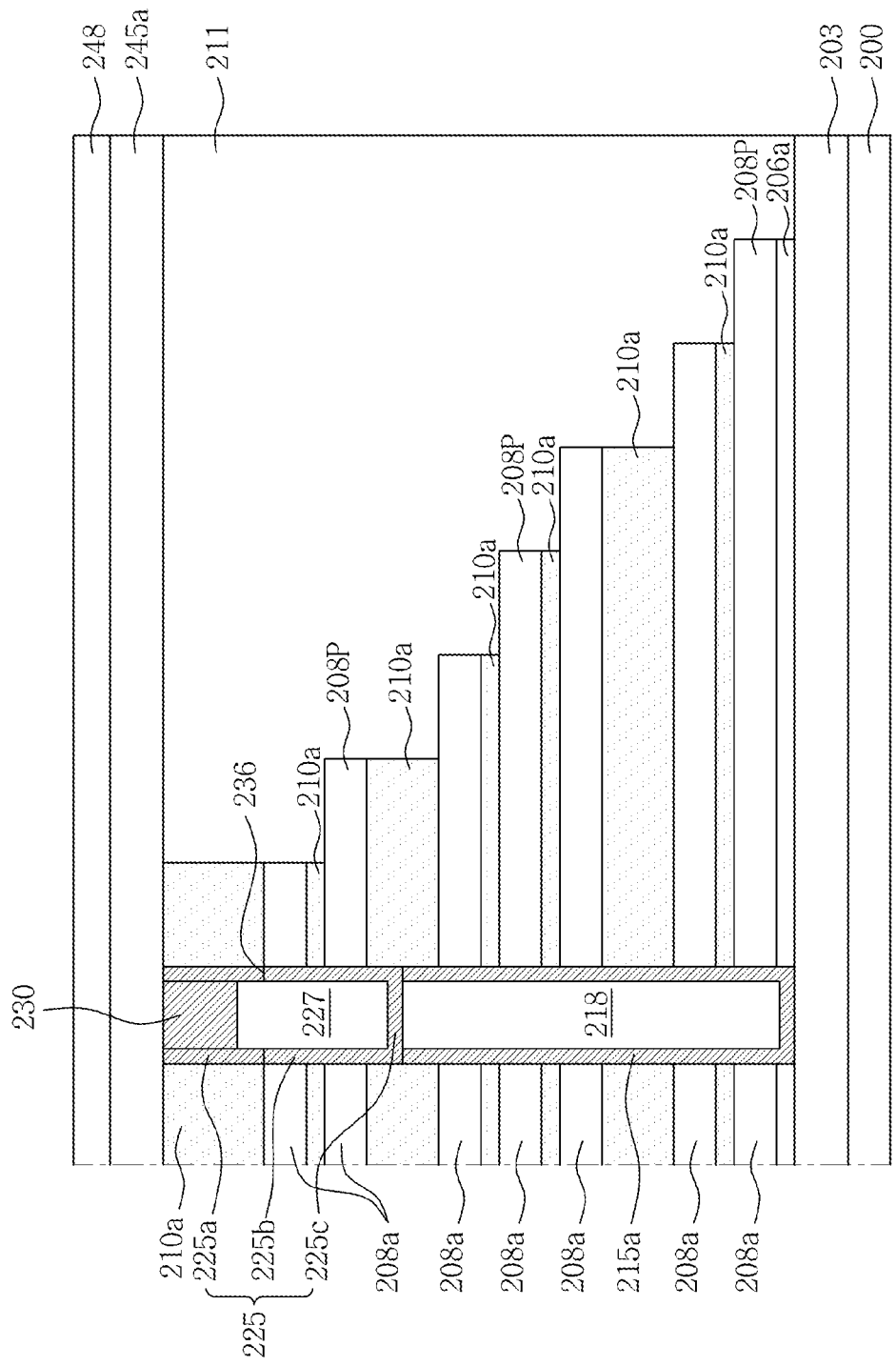
Figure 28A:
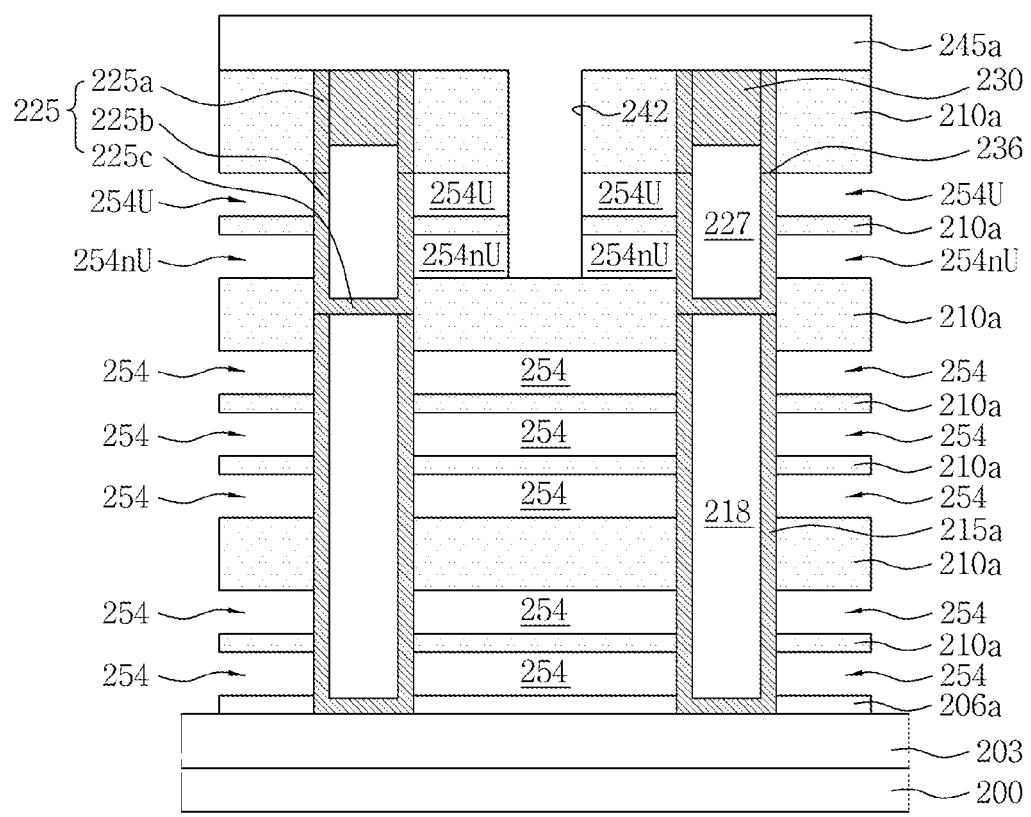
Figure 28B:
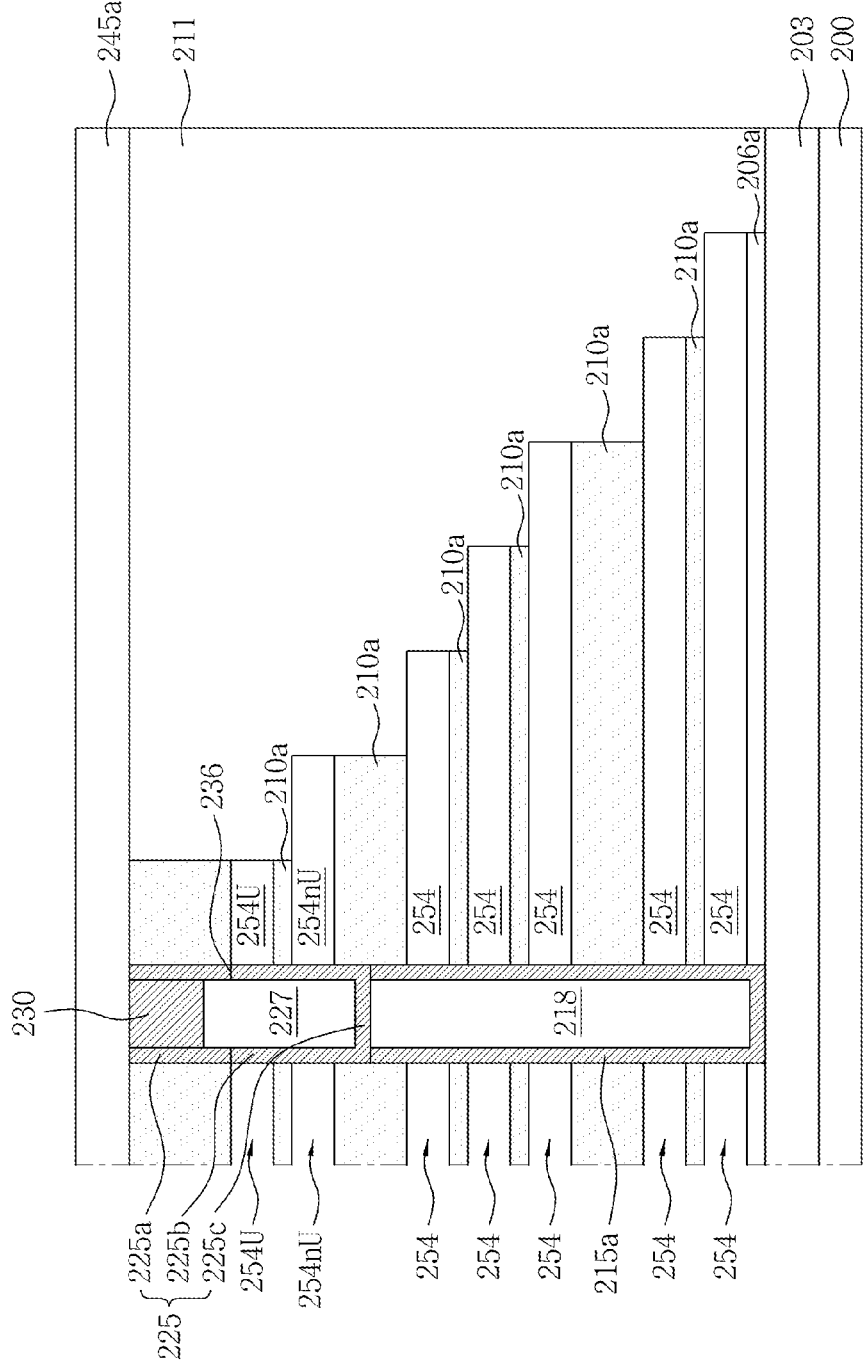
Figure 29A:
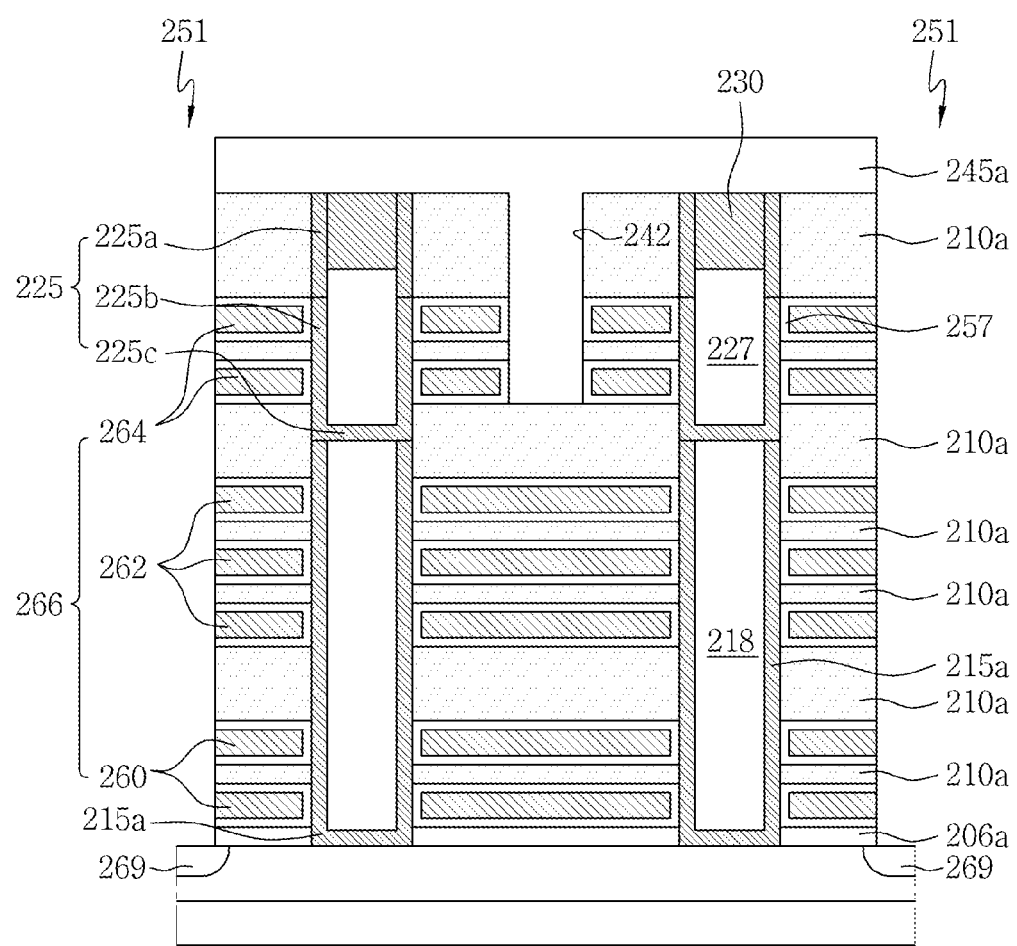
Figure 29B:
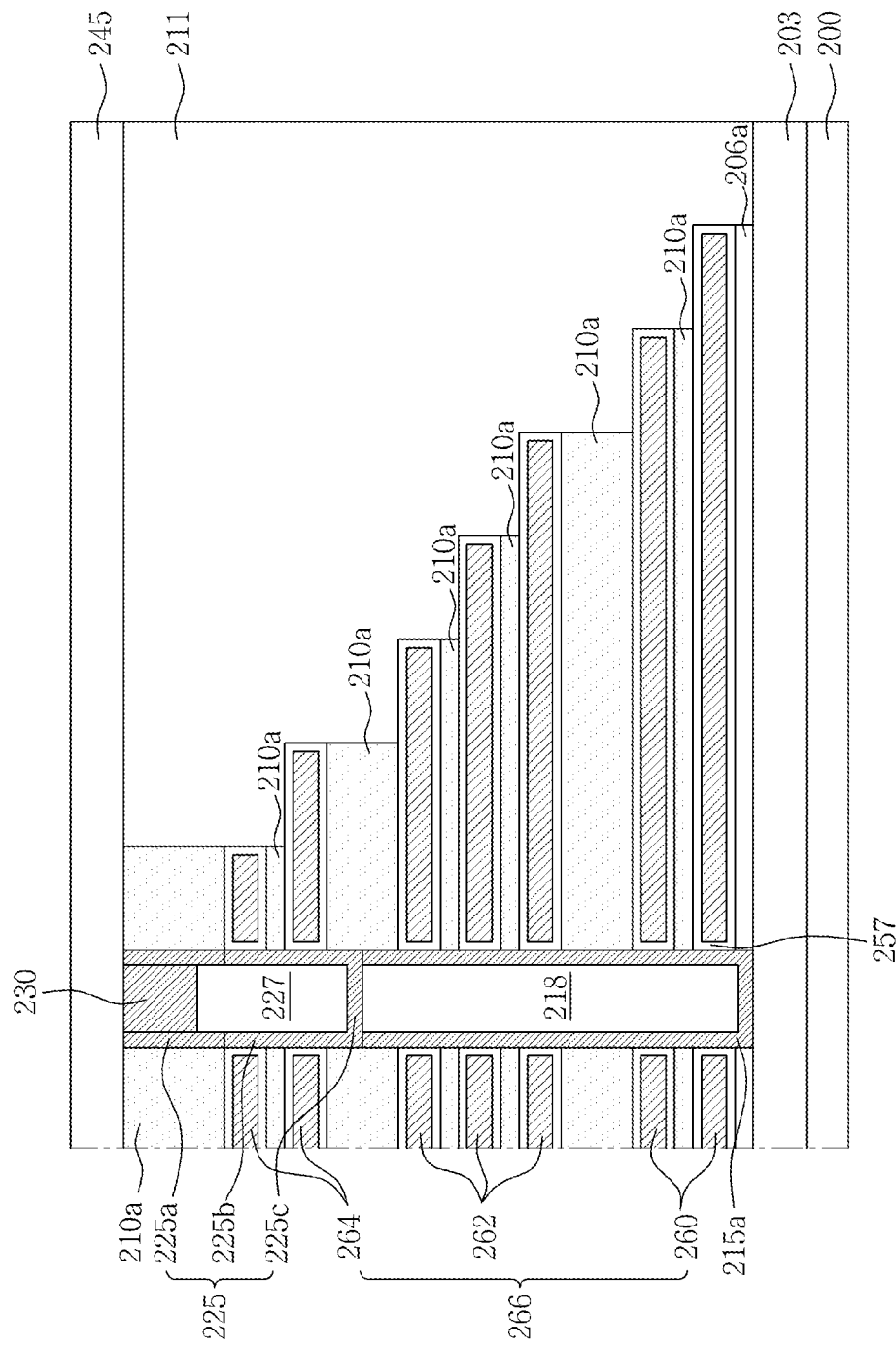
Figure 30:
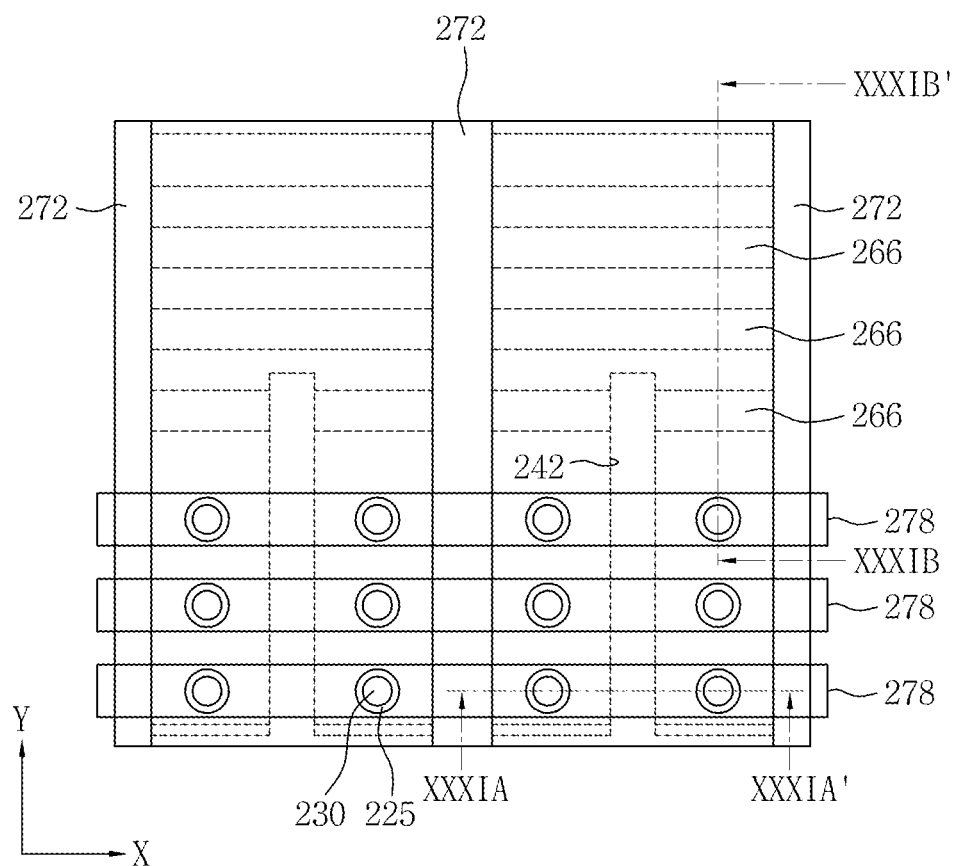
Figure 31A:
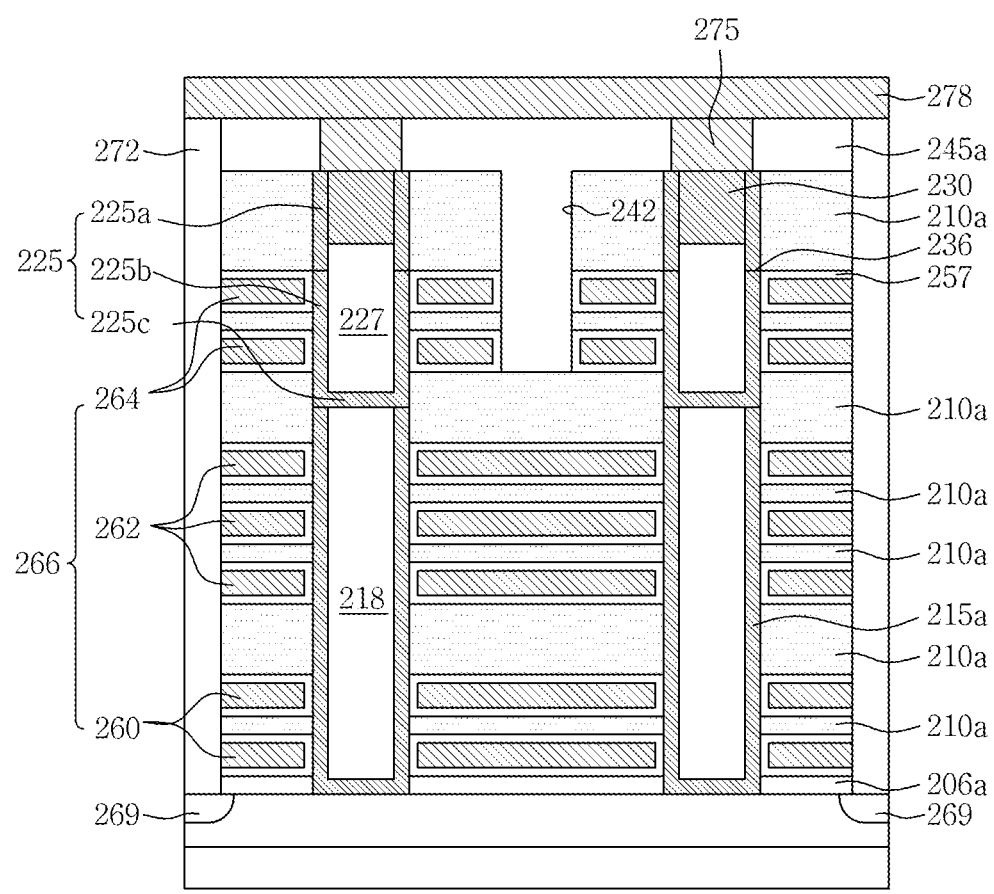
Figure 31B:
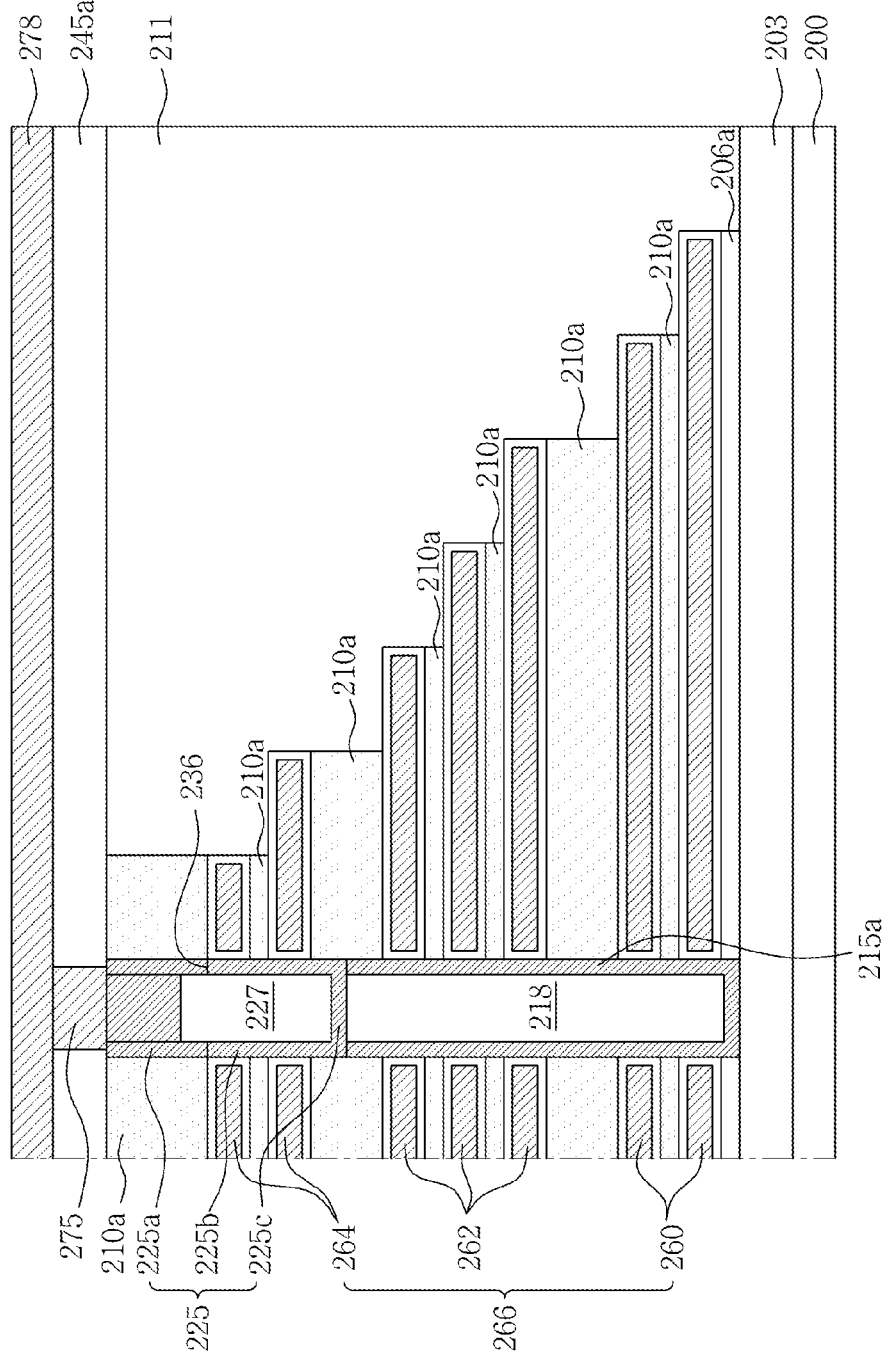

FIGS. 24, 26, and 30 are plan views of nonvolatile memory devices according to embodiments of the inventive concept. FIG. 25A is a cross-sectional view taken along line XXVA-XXVA' of FIG. 24, and FIG. 25B is a cross-sectional view taken along line taken along line XXVB-XXVB' of FIG. 24. FIGS. 27A, 28A, and 29A are cross-sectional views taken along line XXVIIA-XXVIIA' of FIG. 26A, XXVIIIA-XXVIIIA' of FIG. 26B, and XIXA-XIXA' of FIG. 26C respectively. FIGS. 27B, 28B, and 29B are cross-sectional views taken along line XXVIIB-XXVIIB' of FIG. 26A, XXVIIIB-XXVIIIB' of FIG. 26B, and XIXB-XIXB' of FIG. 26C respectively. Also, FIG. 31A is a cross-sectional view taken along line XXXIA-XXXIA' of FIG. 30, and FIG. 31B is a cross-sectional view taken along line XXXIB-XXXIB' of FIG. 30.

Referring to FIGS. 24, 25A, and 25B, a substrate 200, which is the same as that described with reference to FIGS. 18G and 19, may be prepared. Thereafter, an uppermost interlayer insulating layer 210U, an uppermost sacrificial layer 208U, a second uppermost interlayer insulating layer 210nU, and a second uppermost sacrificial layer 208nU may be sequentially patterned, thereby forming a cutting region 242. As shown in FIG. 24, the cutting region 242 may have a groove shape extending in a first direction Y. The cutting region 242 may cross sacrificial pads 208P of the uppermost and second uppermost sacrificial layers 208U and 208nU. However, the embodiments of the inventive concept are not limited thereto. For example, the cutting region 242 may cross the sacrificial pads 208P of all the stacked sacrificial layers 208, 208nU, and 208U.

An upper capping layer 245 may be formed on the substrate 200 having the cutting region 242 to fill the cutting region 242. The upper capping layer 245 may be formed of silicon oxide.

According to the above description, after the opening 212, the first and second core patterns 218 and 227, the first and second active patterns 215a and 225, the pad pattern 230, and the sacrificial pads 208P are formed, the cutting region 242 and the upper capping layer 245 may be formed. However, the inventive concept is not limited thereto. For example, after the cutting region 242 and the upper capping layer 245 are formed, the opening 212, the first and second core patterns 218 and 227, the first and second active patterns 215a and 225, the pad pattern 230, and the sacrificial pads 208P may be formed. In another case, after the sacrificial pads 208P are formed, the capping insulating layer 211 may be formed, the opening 212, the first and second core patterns 218 and 227, the first and second active patterns 215a and 225, and the pad pattern 230 may be formed, and the cutting region 242 and the upper capping layer 245 may be formed. In another case, after the sacrificial pads 208P are formed, the capping insulating layer 211 may be formed, the cutting region 242 and the upper capping layer 245 may be formed, and the opening 212, the first and second core patterns 218 and 227, the first and second active patterns 215a and 225, and the pad pattern 230 may be formed.

Referring to FIGS. 26A, 27A, and 27B, a mask 248 may be formed on the substrate 200 having the upper capping layer 245, and the upper capping layer 245, the interlayer insulating layer 110, the sacrificial layers 208, and the buffer insulating layer 206 may be sequentially etched using the mask 248 as an etch mask to form trenches 251.

The cutting region 241 may be disposed between a pair of adjacent ones of the trenches 251. A mold pattern may be formed between the pair of adjacent ones of the trenches 251. A plurality of mold patterns may be formed on the substrate 200 and separated from one another. Each of the mold patterns may include sacrificial patterns 208a and interlayer insulating patterns 210a stacked alternately. Also, each of the mold patterns may further include the cutting region 242 and an upper capping pattern 245a filling the cutting region 242. Furthermore, each of the mold patterns may further include a buffer insulating pattern 206a interposed between a lowermost sacrificial pattern and the substrate 200. As shown in FIG. 26, the trenches 251 may extend in the first direction Y parallel to one another. Sidewalls of the sacrificial patterns 208a may be exposed by the trenches 251. The mask 248 may be removed.

Referring to FIGS. 26B, 28A, and 28B, the sacrificial patterns 208a exposed by the trenches 251 may be removed to form vacant regions 254, 254U, and 254nU. Uppermost vacant regions 254U formed by removing uppermost sacrificial patterns 208a may be separated from each other by the upper capping pattern 245a. Similarly, second uppermost vacant regions 254nU formed by removing second uppermost sacrificial patterns 208nU may be separated from each other by the upper capping pattern 245a.

Referring to FIGS. 26C, 29A, and 29B, a dielectric material 257 may be conformally formed on the substrate 200 having the vacant regions 254, 254U, and 254nU. The dielectric material 257 may be formed on inner walls of the vacant regions 254, 254U, and 254nU to a substantially uniform thickness. The formation of the dielectric material 257 may include sequentially forming a tunnel dielectric material 47a, which is the same as the gate dielectric 47 described with reference to FIG. 1B, a data storage layer 47b, and a blocking layer 47c.

Subsequently, a conductive layer may be formed on the substrate 200 having the dielectric material 257 to fill the vacant regions 254, 254U, and 254nU. The conductive layer may be etched to form conductive patterns 266 filling the vacant regions 254, 254U, and 254nU, respectively. The conductive patterns 266 may include lower conductive patterns 260 corresponding to the lower conductive patterns 22 described with reference to FIG. 1A, middle conductive patterns 262 corresponding to the middle conductive patterns 24 described with reference to FIG. 1A, and upper conductive patterns 264 corresponding to the upper conductive patterns 26 described with reference to FIG. 1A.

The dielectric material 257 formed on inner sidewalls of the trenches 251 may be removed using an etching process. As a result, the dielectric material 257 may be interposed between the conductive patterns 262 and the interlayer insulating patterns 210a, between the conductive patterns 262 and the first active pattern 215a, and between the conductive patterns 262 and the second active pattern 225.

A common source region 269 may be formed using an ion implantation process within the substrate 200 under the trench 251. The common source region 269 may have an N conductivity type. The common source region 269 may be formed after the formation of the conductive patterns 266. In another case, after the mold pattern is formed and before the vacant regions 254, 254U, and 254nU are formed, the common source region 269 may be formed. In another case, after the vacant regions 254, 254U, and 254nU and before the conductive patterns 266 are formed, the common source region 269 may be formed.

In embodiments, the conductive patterns 266 and the interlayer insulating patterns 210a may be defined as horizontal patterns 266 and 210a.

Referring to FIGS. 30, 31A, and 31B, isolation patterns 272 may be formed to fill the trenches 251. The isolation patterns 272 may be formed of silicon oxide. Thereafter, a contact plug 275 may be formed through the upper capping pattern 245a and electrically connected to the pad pattern 230. An interconnection 278 may be formed on the upper capping pattern 245a and the isolation patterns 272 and electrically connected to the contact plug 275. The contact plug 275 and the interconnection 278 may be formed of a metal, such as tungsten (W).

Figure 32:
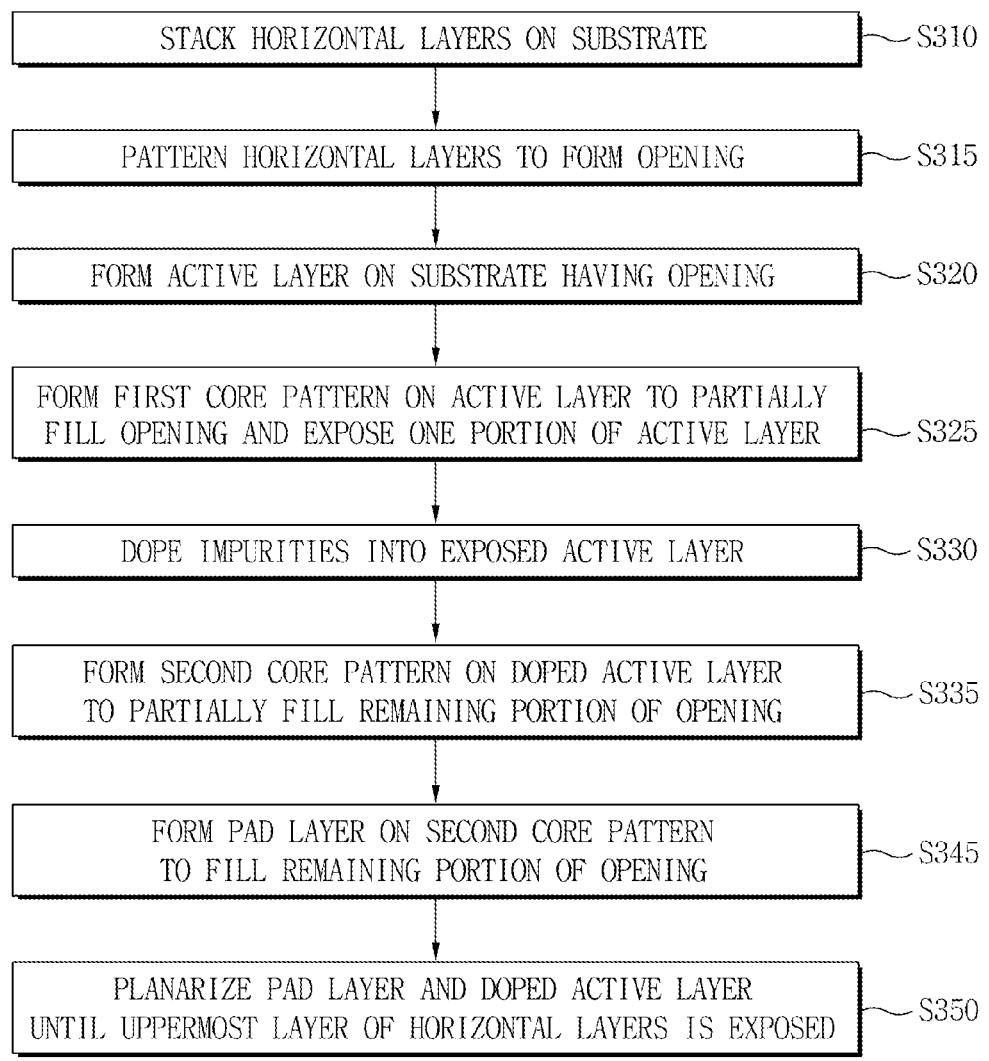
FIG. 32 is a flowchart illustrating a method of fabricating the semiconductor device according to example embodiments of inventive concepts.
Figure 33:
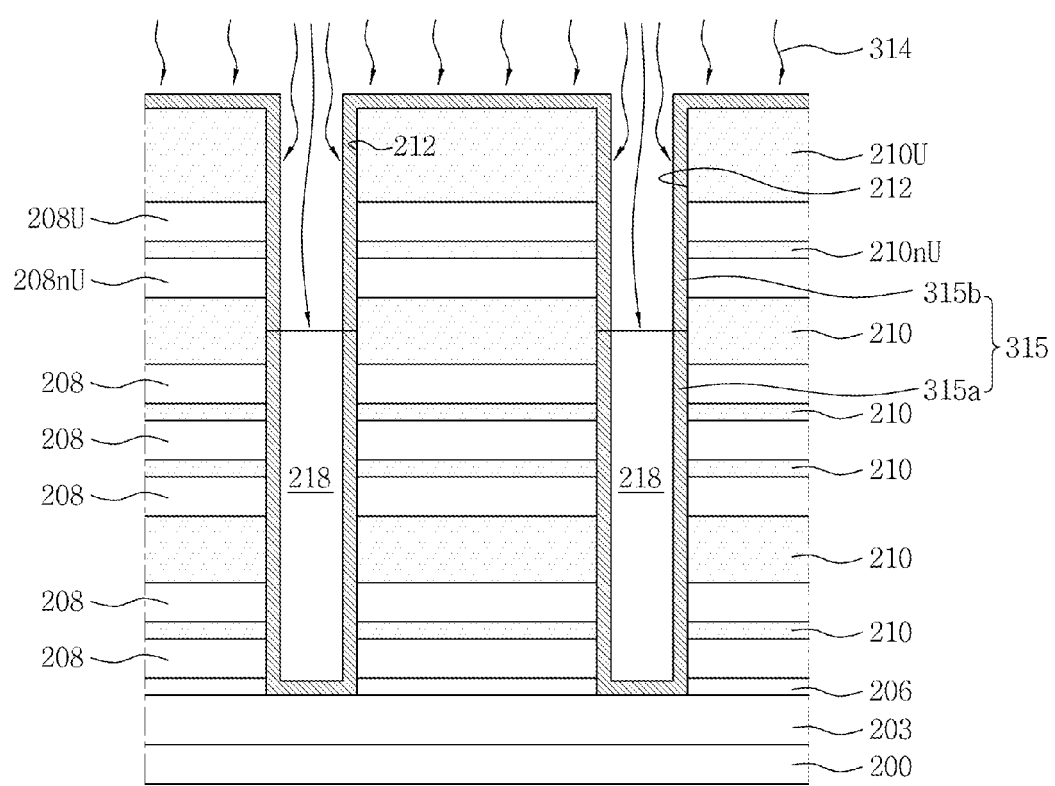
FIGS. 33 and 34 are cross-sectional views illustrating the method of fabricating the semiconductor device according to example embodiments of inventive concepts.
Figure 34:
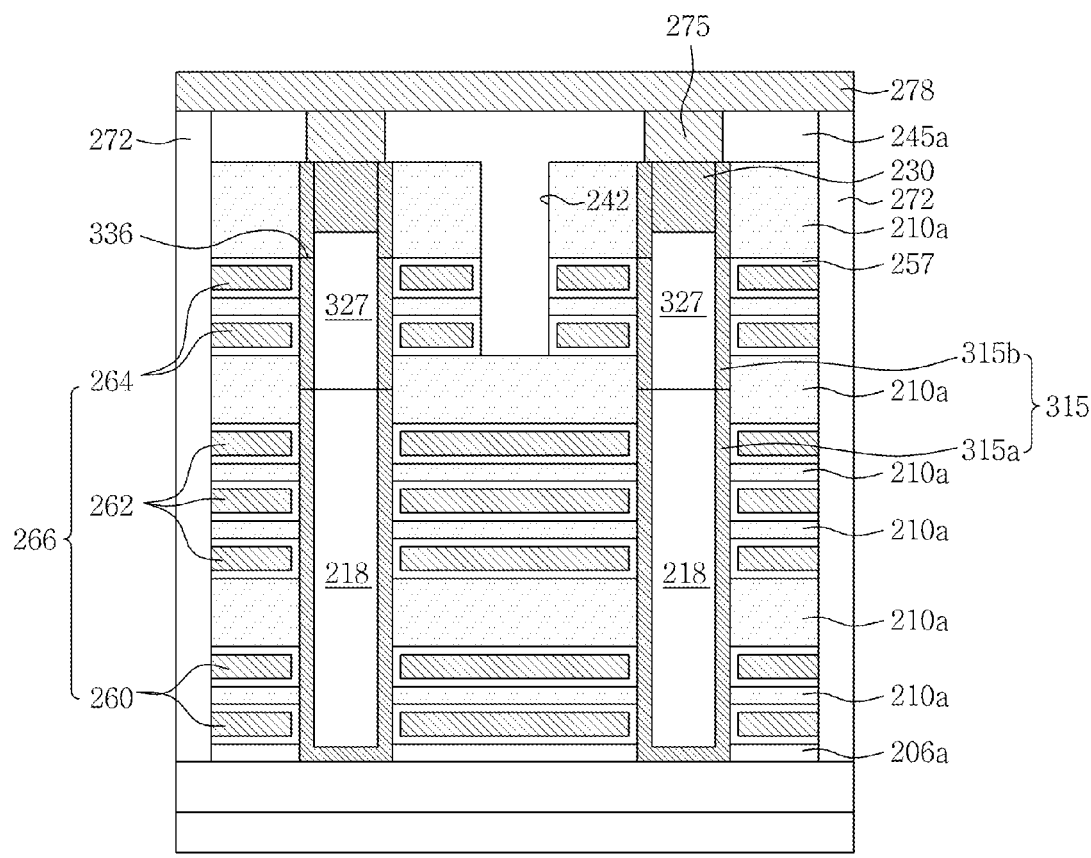

FIG. 32 is a flowchart illustrating a method of fabricating the semiconductor device shown in FIG. 7, and FIGS. 33 and 34 are cross-sectional views illustrating the method of fabricating the semiconductor device shown in FIG. 7.

Referring to FIG. 32, horizontal layers may be stacked on a substrate (operation S310). The horizontal layers may be patterned to form an opening (operation S315). An active layer may be formed on the substrate having the opening (S320). The active layer may be formed on the substrate having the opening to a substantially uniform thickness. A first core pattern may be formed on the active layer to partially fill the opening and expose a portion of the active layer (operation S325).

Impurities may be doped into the exposed portion of the active layer (operation S330). For example, a Group-III element may be implanted into the exposed portion of the active layer using a gas-phase doping process.

A second core pattern may be formed on the first core pattern to partially fill the remaining portion of the opening (operation S335). A pad layer may be formed on the second core pattern to fill the remaining portion of the opening (operation S345). Thereafter, the pad layer and the doped active layer may be planarized until an uppermost layer of the horizontal layers is exposed (operation S350).

The method of fabricating a semiconductor device described with reference to FIG. 32, according to example embodiments of inventive concepts, may include some modified portions of the method of fabricating the semiconductor device described with reference to FIGS. 16 through 18G, according to example embodiments of inventive concepts. Hereinafter, the modified portions of the method described with reference to FIGS. 16 through 18G will be chiefly described with reference to FIGS. 33 and 34.

Referring to FIGS. 32 and 33, a substrate 200 on which the active layer 215 and the first core pattern 218 are formed as described with reference to FIG. 18C may be prepared (operations S310 to S325). The first core pattern 218 may partially fill the opening 212 and expose a portion of the active layer 215. That is, the active layer 215 disposed in a portion of the opening 212, which is not filled with the first core pattern 218, may be exposed.

Thereafter, impurities may be doped into the exposed portion of the active layer 215 using a gas-phase doping process 314 (operation S330). For instance, a Group-III element, such as B, may be doped into the exposed portion of the active layer 215 using the gas-phase doping process 314. As a result, the partially doped active layer 315 may be formed.

Accordingly, the active layer 315 may include a first active region 315a, which is not doped due to the first core pattern 218 during the gas-phase doping process 314, and a second active region 315b, which is doped during the gas-phase doping process 314.

In some embodiments, due to the gas-phase doping process 314, a Group-III element may be doped into an upper region of the first core pattern 218. Thus, the upper region of the first core pattern 218 may contain the Group-III element.

Referring to FIGS. 32 and 34, a second core pattern 327 may be formed on the partially doped active layer 315 to partially fill the remaining portion of the opening 212 (operation S335). Thereafter, a pad layer may be formed on the substrate 200 having the second core pattern 327 (operation S345), and the pad layer and the active layer 315 may be planarized until an uppermost layer of the horizontal layers 210 and 208 is exposed (operation S350). As a result, the pad pattern 230 may be formed. Also, the planarized active pattern 315 may include the first active pattern 315a and the second active pattern 315b. Meanwhile, the doping process described with reference to FIG. 18G may be performed. As a result, a PN junction 336 may be formed within the second active pattern 315b.

Thereafter, a nonvolatile memory device may be formed using the method described with reference to FIGS. 19 and 24 through 31B.

Figure 35:
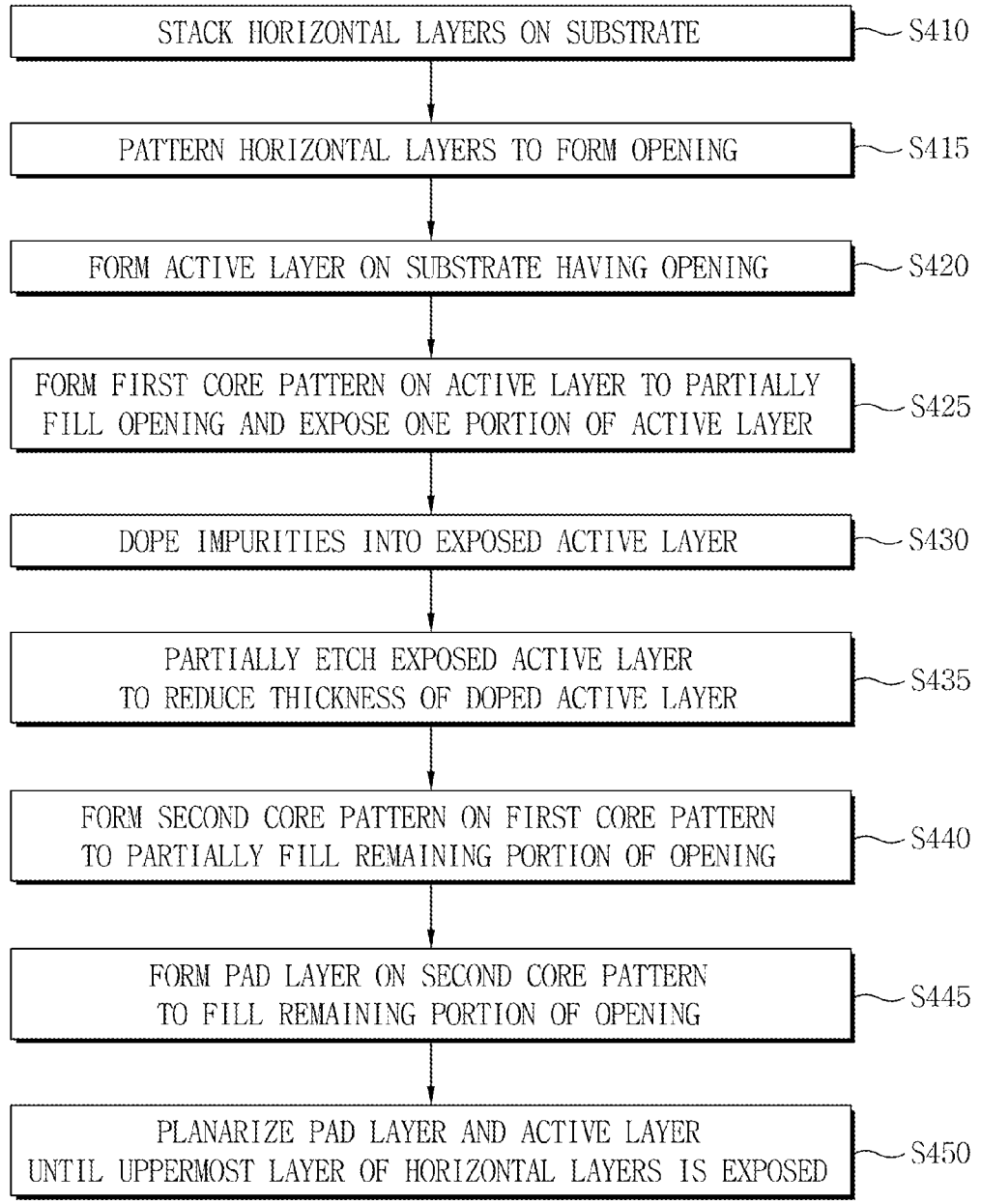
FIG. 35 is a flowchart illustrating a method of fabricating the semiconductor device according to example embodiments of inventive concepts.
Figure 36:
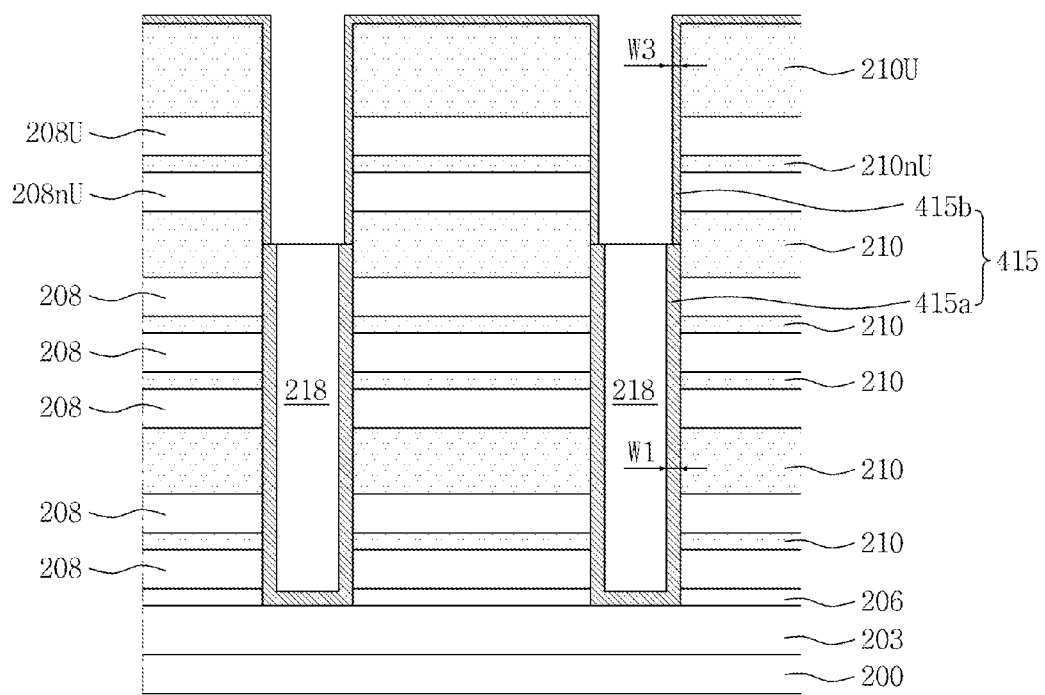
FIGS. 36 and 37 are cross-sectional views illustrating the method of fabricating the semiconductor device according to example embodiments of inventive concepts.
Figure 37:
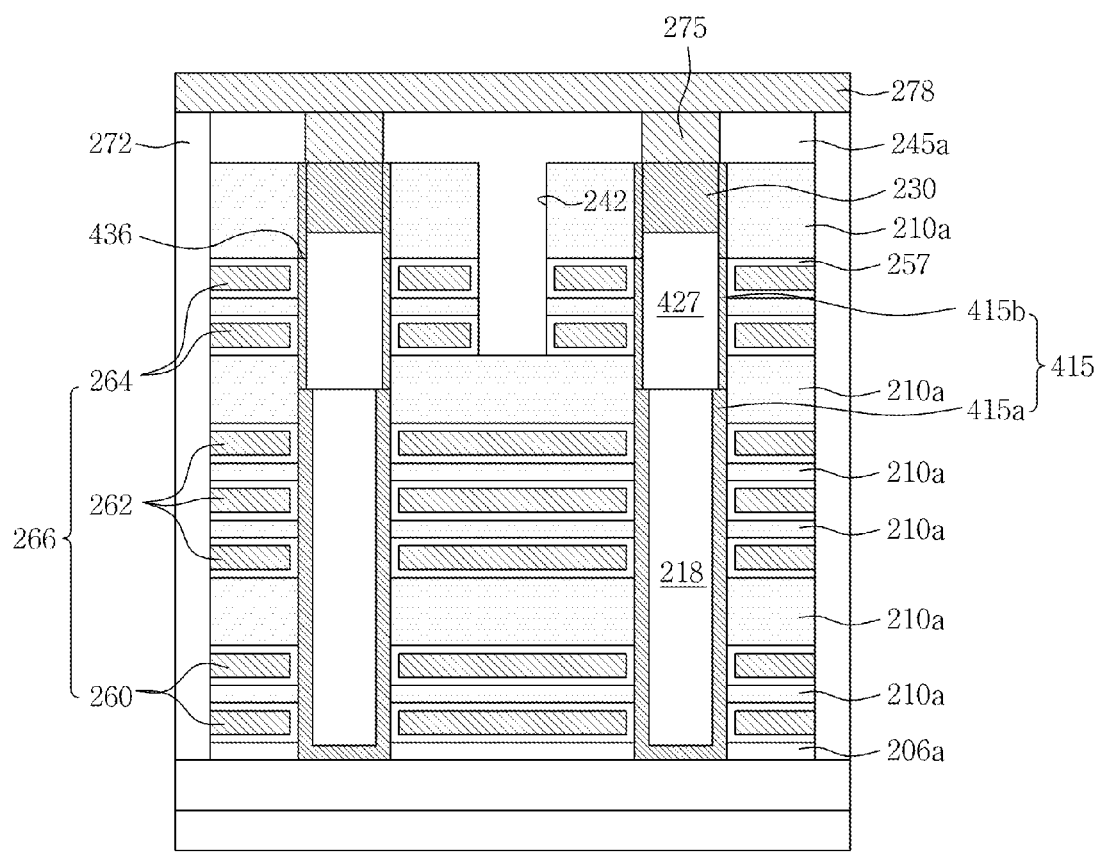

FIG. 35 is a flowchart illustrating a method of fabricating the semiconductor device shown in FIG. 9, and FIGS. 36 and 37 are cross-sectional views illustrating the method of fabricating the semiconductor device shown in FIG. 9.

To begin with, referring to FIG. 35, horizontal layers may be stacked on a substrate (operation S410). The horizontal layers may be patterned to form an opening (operation S415). An active layer may be formed on the substrate having the opening (operation S420). The active layer may be formed on the substrate having the opening to a substantially uniform thickness. A first core pattern may be formed on the active layer to partially fill the opening and expose a portion of the active layer (operation S425). Impurities may be doped into the exposed portion of the first active layer (operation S430). For example, a Group-III element may be implanted into the exposed portion of the active layer using a gas-phase doping process.

To reduce to the thickness of the doped active layer, the exposed portion of the active layer may be partially etched (operation S435). In this case, the partial etching process may be performed using an isotropic etching process.

A second core pattern may be formed on the first core pattern to partially fill the remaining portion of the opening (operation S440). A pad layer may be formed on the second core pattern to fill the remaining portion of the opening (operation S445). Thereafter, the pad layer and the active layer may be planarized until an uppermost layer of the horizontal layers is exposed (operation S450).

The method of fabricating a semiconductor device described with reference to FIG. 35, according to example embodiments of inventive concepts, may include some modified portions of the method of fabricating the semiconductor device described with reference to FIGS. 16 through 18G, according to example embodiments of inventive concepts. Hereinafter, the modified portions of the method described with reference to FIGS. 16 through 18G will be chiefly described with reference to FIGS. 36 and 37.

Referring to FIGS. 35 and 36, to begin with, a substrate 200 having an active layer 315 that is partially doped as described with reference to FIG. 33 may be prepared (operations S410 to S430).

Thereafter, to reduce the thickness of the doped active layer 315, an exposed portion of the active layer 315 may be partially etched to form an active layer 415 having a portion with a reduced thickness (operation S435). The partial etching process may be performed using an isotropic etching process.

Accordingly, a portion of the active layer 415 whose thickness is not reduced due to the first core pattern 218 may be defined as a first active region 415a, while a portion of the active layer 415 that is disposed within the opening 212 and has a reduced thickness may be defined as the second active region 415b. That is, on the basis of a sidewall of the opening 212, a horizontal width W3 of the second active region 415b may be smaller than a horizontal width W1 of the first active region 415a.

Referring to FIGS. 35 and 37, a second core pattern 427 may be formed on the substrate 200 having the active layer 415 having the portion with the reduced thickness to partially fill the opening 212 (operation S440). A pad layer may be formed on the second core pattern 427 to fill the remaining portion of the opening 212 (operation S445). Thereafter, the active layer 415 having the reduced thickness and the pad layer may be planarized until an uppermost layer of the horizontal layers 208, 208nU, 208U, 210, 210nU, and 210U is exposed (operation S450). Accordingly, a pad pattern 230 may be formed on the second core pattern 427.

The remaining active layer may include the first active pattern 415a configured to surround sidewalls and a bottom surface of the first core pattern 218 and the second active pattern 415b configured to surround sidewalls of the second core pattern 427 and sidewalls of the pad pattern 230. Thereafter, the doping process described with reference to FIG. 18G may be performed. As a result, a PN junction 436 may be formed within the second active pattern 415b. Subsequently, a nonvolatile memory device may be formed using the method described with reference to FIGS. 19 and 24 through 31B.

Figure 38:
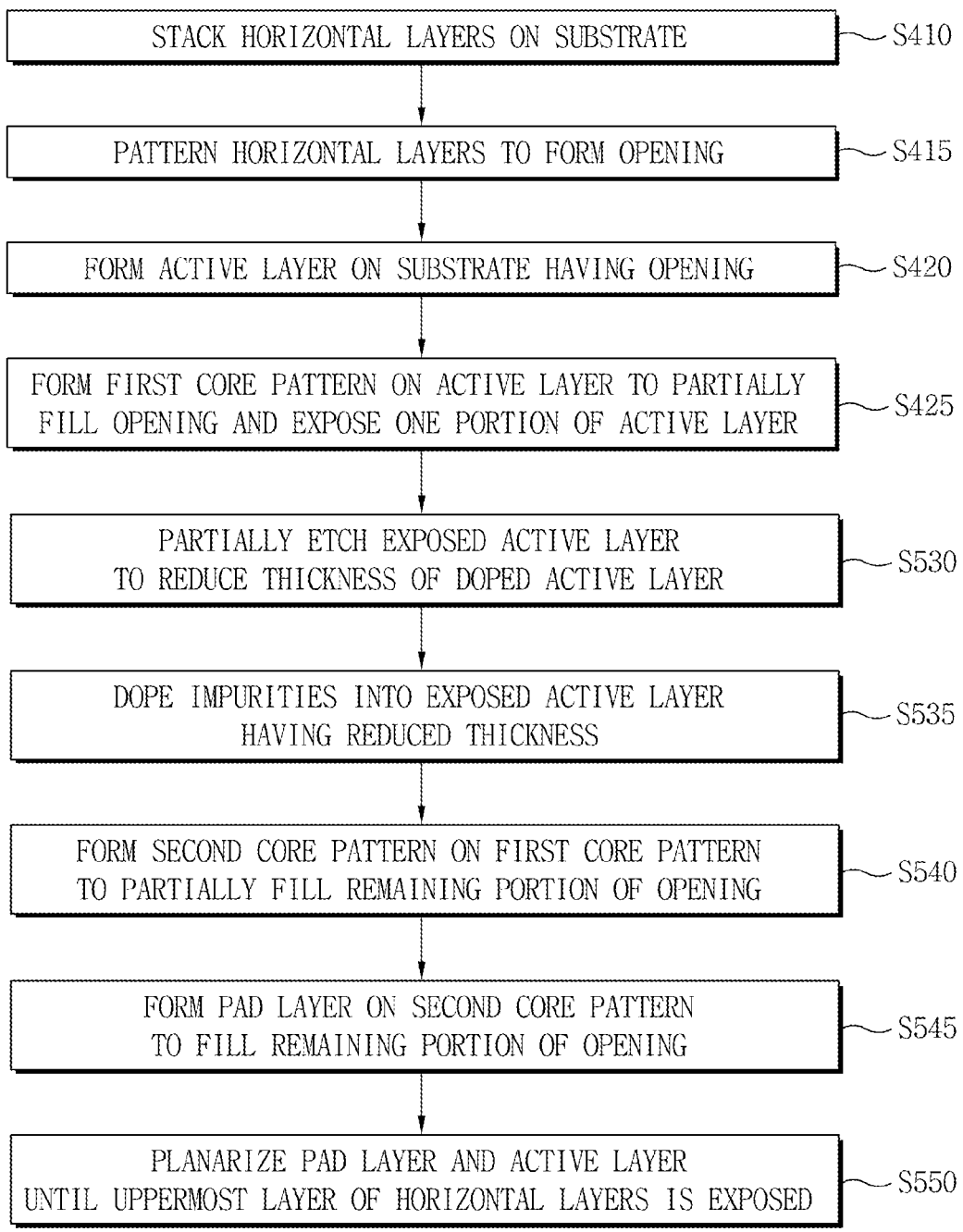
FIG. 38 is a flowchart illustrating a method of fabricating the semiconductor device according to example embodiments of inventive concepts.
Figure 39:
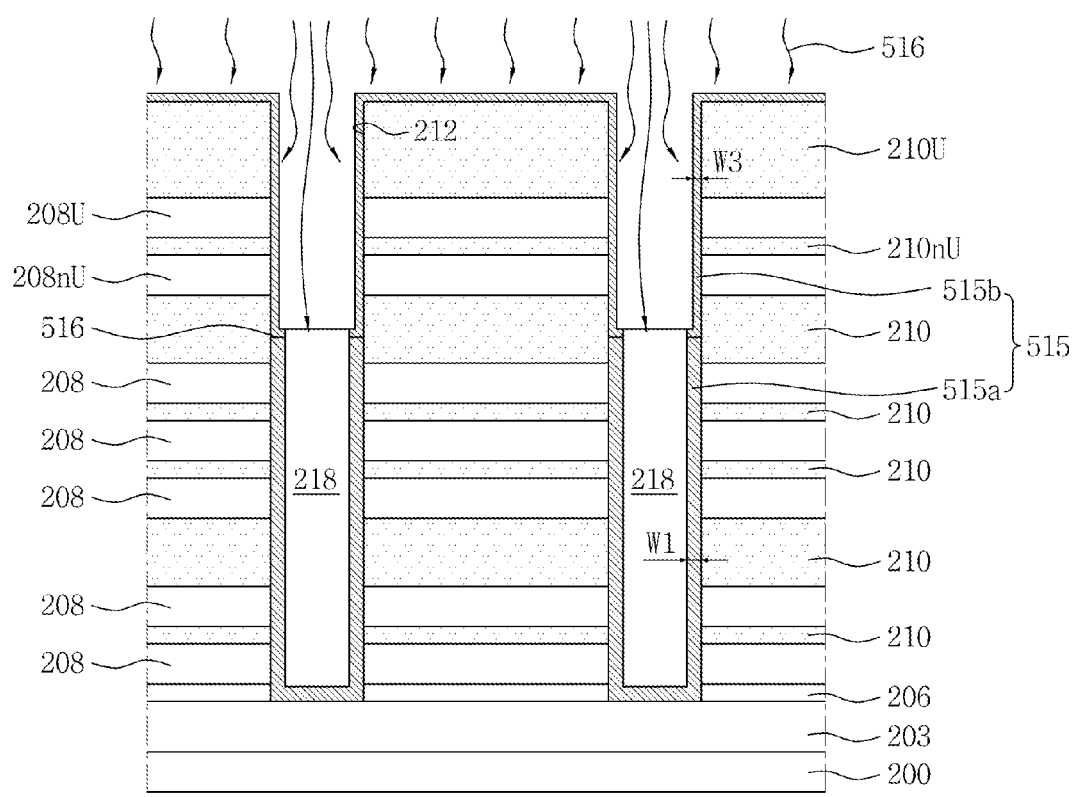
FIGS. 39 and 40 are cross-sectional views illustrating method of fabricating a semiconductor device shown according to example embodiments of inventive concepts.
Figure 40:
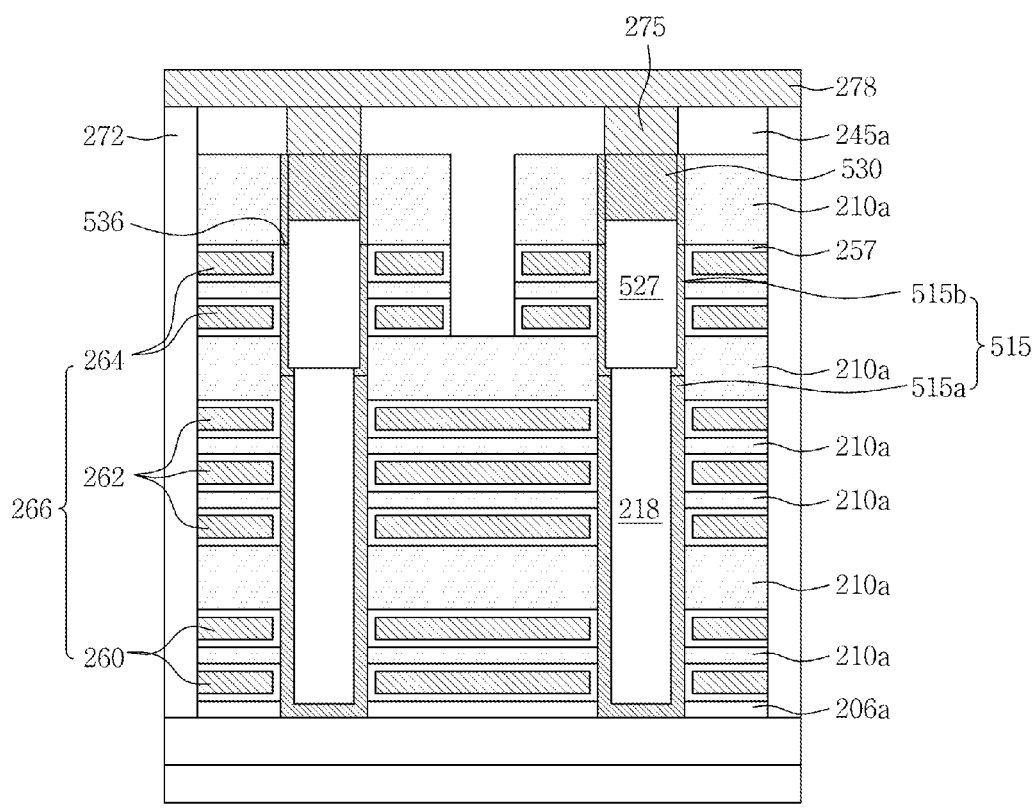

FIG. 38 is a flowchart illustrating a modified example of the method of fabricating the semiconductor device shown in FIG. 9, and FIGS. 39 and 40 are cross-sectional views illustrating the modified example of the method shown in FIG. 38.

To begin with, referring to FIG. 38, horizontal layers may be stacked on a substrate (operation S410), and patterned to form an opening (operation S415). An active layer may be formed on the substrate having the opening (operation S420). A first core pattern may be formed on the active layer to partially fill the opening and expose a portion of the active layer (operation S425).

To reduce the thickness of the exposed active layer, the exposed active layer may be partially etched (operation S530). The partial etching process may be performed using an isotropic etching process. Impurities may be doped into the active layer with a reduced thickness (operation S535). For example, a Group-III element may be implanted into the active layer with the reduced thickness using a gas-phase doping process.

To reduce the thickness of the doped active layer, the exposed active layer may be partially etched (operation S435). In this case, the partial etching process may be performed using an isotropic etching process.

A second core pattern may be formed on the first core pattern to partially fill the remaining portion of the opening (operation S440). A pad layer may be formed on the second core pattern to fill the remaining portion of the opening (operation S445). Thereafter, the pad layer and the active layer may be planarized until an uppermost layer of the horizontal layers is exposed (operation S450).

The method of fabricating a semiconductor device described with reference to FIG. 38, according to example embodiments of inventive concepts, may include some modified portions of the method of fabricating the semiconductor device described with reference to FIG. 36, according to example embodiments of inventive concepts. Hereinafter, the modified portions of the method described with reference to FIG. 36 will be chiefly described with reference to FIGS. 39 and 40.

Referring to FIGS. 38 and 39, a substrate 200 on which the active layer 215 and the first core pattern 218 are formed as described with reference to FIG. 18C may be prepared (operation S410 to S425). That is, a substrate 200 on which the first core pattern 218 is formed to partially fill the opening 212 and expose a portion of the active layer 215 may be prepared.

Thereafter, to reduce the thickness of the active layer 215, the exposed portion of the active layer 215 may be partially etched (operation S530). The partial etching process may be performed using an isotropic etching process. Thus, an active layer 515 having a portion with a reduced thickness may be formed. Here, a portion of an active layer, which is disposed within the opening 212 and whose thickness is not reduced due to the first core pattern 218, may be defined as a first active pattern 515a, while the remaining portion of the active layer, which is disposed within the opening 212 and has a reduced thickness, may be defined as a second active pattern 515b.

Thereafter, impurities may be doped into the active layer 515 having the reduced thickness using a gas-phase doping process 516. For example, a Group-III element, such as B, may be doped into the exposed active layer 515 having the reduced thickness using the gas-phase doping process 516. As a result, the active layer 515 having one portion with the reduced thickness and the other portion doped with impurities may be obtained.

Meanwhile, the impurities doped into the active layer 515 may diffuse into a region defined as the first active pattern 515a to form an impurity region. Accordingly, a PN junction 86 described with reference to FIG. 9 may be formed within the first active pattern 515a. That is, the PN junction 86 may be disposed at a lower level than a portion where the thicknesses of the first and second active patterns 515a and 515b are varied.

Referring to FIGS. 38 through 40, a second core pattern 527 may be formed on the substrate 200 having the portion with the reduced thickness and the other portion doped with impurities to partially fill the opening 212 (operation S540). A pad layer may be formed on the second core pattern 527 to fill the remaining portion of the opening 212 (operation S545). Thereafter, the active layer 515 and the pad layer may be planarized until an uppermost layer of the horizontal layers 208, 208nU, 208U, 210, 210nU, and 210U is exposed (operation S550). Thus, a pad pattern 530 may be formed on the second core pattern 527. Subsequently, a doping process described with reference to FIG. 18G may be performed. As a result, a PN junction 536 may be formed within the second active pattern 515b.

Thereafter, a nonvolatile memory device may be fabricated on the resultant structure using the method described with reference to FIGS. 24 through 31B.

Figure 41:
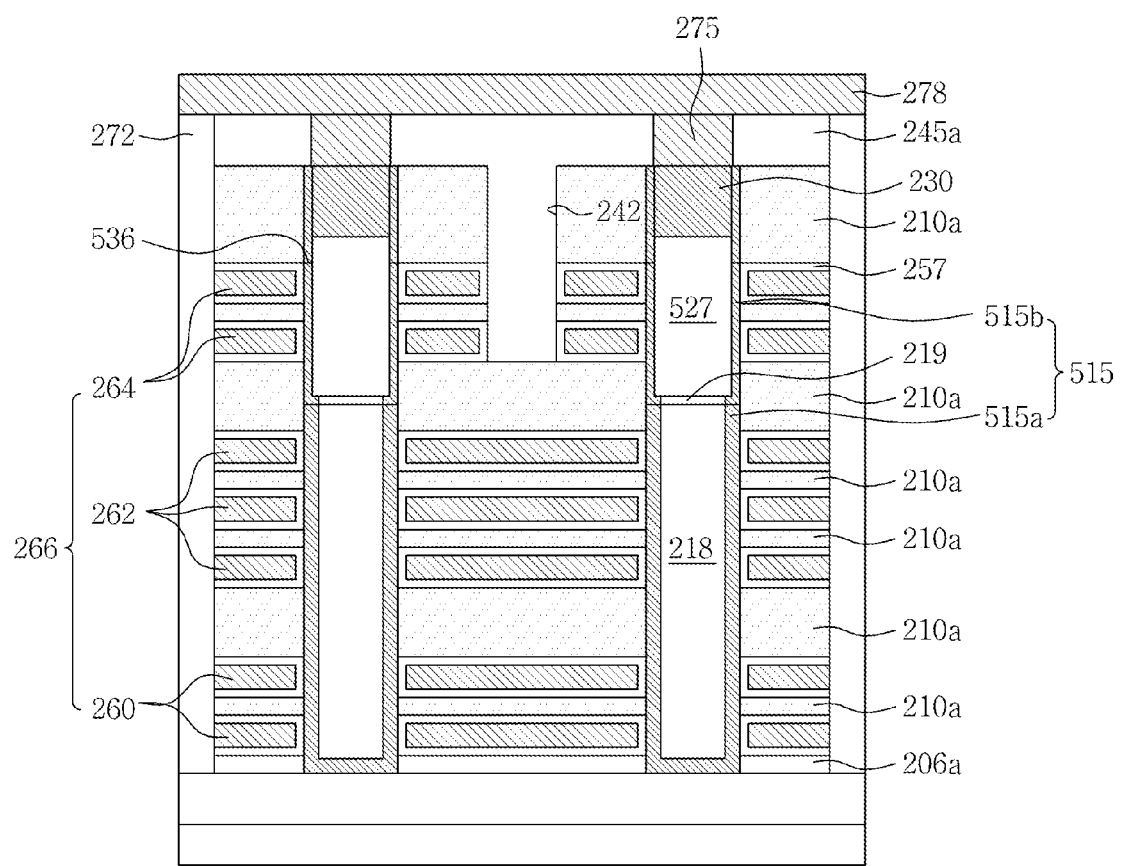
FIG. 41 is a cross-sectional view of a method of fabricating a semiconductor device according to example embodiments of inventive concepts.

In other embodiments, as shown in FIG. 41, an impurity-containing region 219 may be formed within an upper region of the first core pattern 218. That is, the impurity-containing region 219 may be provided within the upper region of the first core pattern 218 and may have an insulation characteristic. For example, the first core pattern 218 may be formed of a silicon oxide layer, and the impurity-containing region 219 may be formed of a silicon oxide layer containing a Group-III element.

The impurity-containing region 219 may be formed by doping a Group-III element into the upper region of the first core pattern 218 during the gas-phase doping process 516 described with reference to FIG. 39. Thus, the impurity-containing region 219 may contain the Group-III element at a higher content than the remaining portion of the first core pattern 218. Also, the impurity-containing region 219 may contain the Group-III element at a higher content than the second core pattern 527. That is, since the second core pattern 527 is formed after impurities are doped into the second active pattern 515b, the second core pattern 527 may not be coped with the same impurities as the impurities doped into the second active pattern 515b.

Methods of fabricating a semiconductor device according to other embodiments of the inventive concept will now be described with reference to FIGS. 42 and 43.

Figure 42:
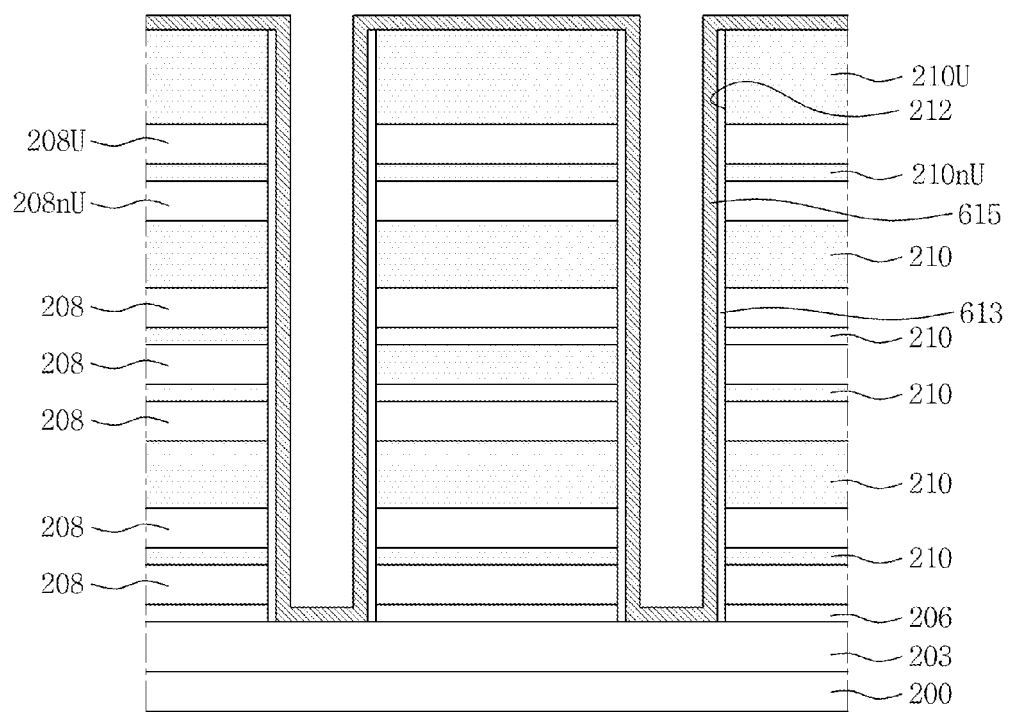
FIGS. 42 and 43 are cross-sectional views illustrating methods of fabricating a semiconductor device according to example embodiments of inventive concepts.

Referring to FIG. 42, a substrate having an opening 212 may be prepared as described with reference to FIG. 18A. Afterwards, after a dielectric material 613 is formed on a sidewall of the opening 212, a first active layer 215 may be conformally formed on the substrate having the dielectric material 613 as described with reference to FIG. 18B.

Figure 43:
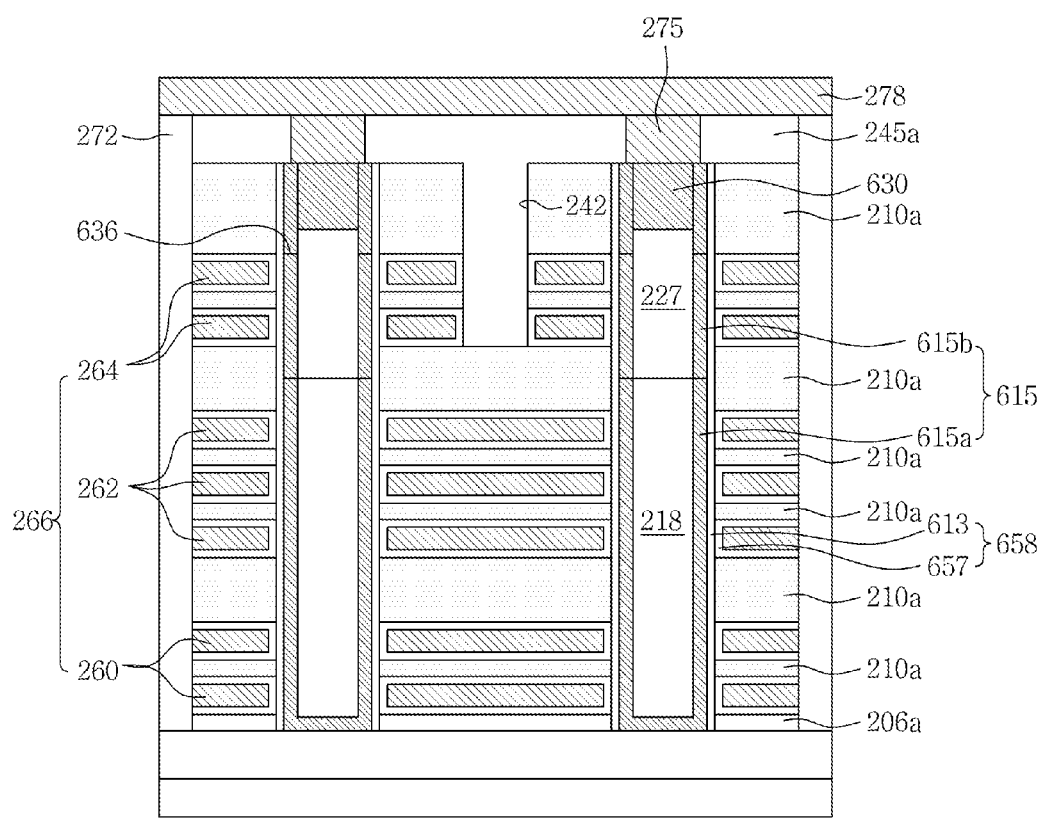

Referring to FIG. 43, a nonvolatile memory device may be fabricated on the resultant structure described with reference to FIG. 42 using the method described with reference to FIGS. 32 through 34. That is, a pad pattern 630 and an active pattern 615 including first and second active patterns 615a and 615b may be formed, and a PN junction 636 may be formed within the second active pattern 615b. In other embodiments, a nonvolatile memory device may be fabricated on the resultant structure described with reference to FIG. 42 using the method described with reference to FIGS. 35 through 41.

Figure 44:
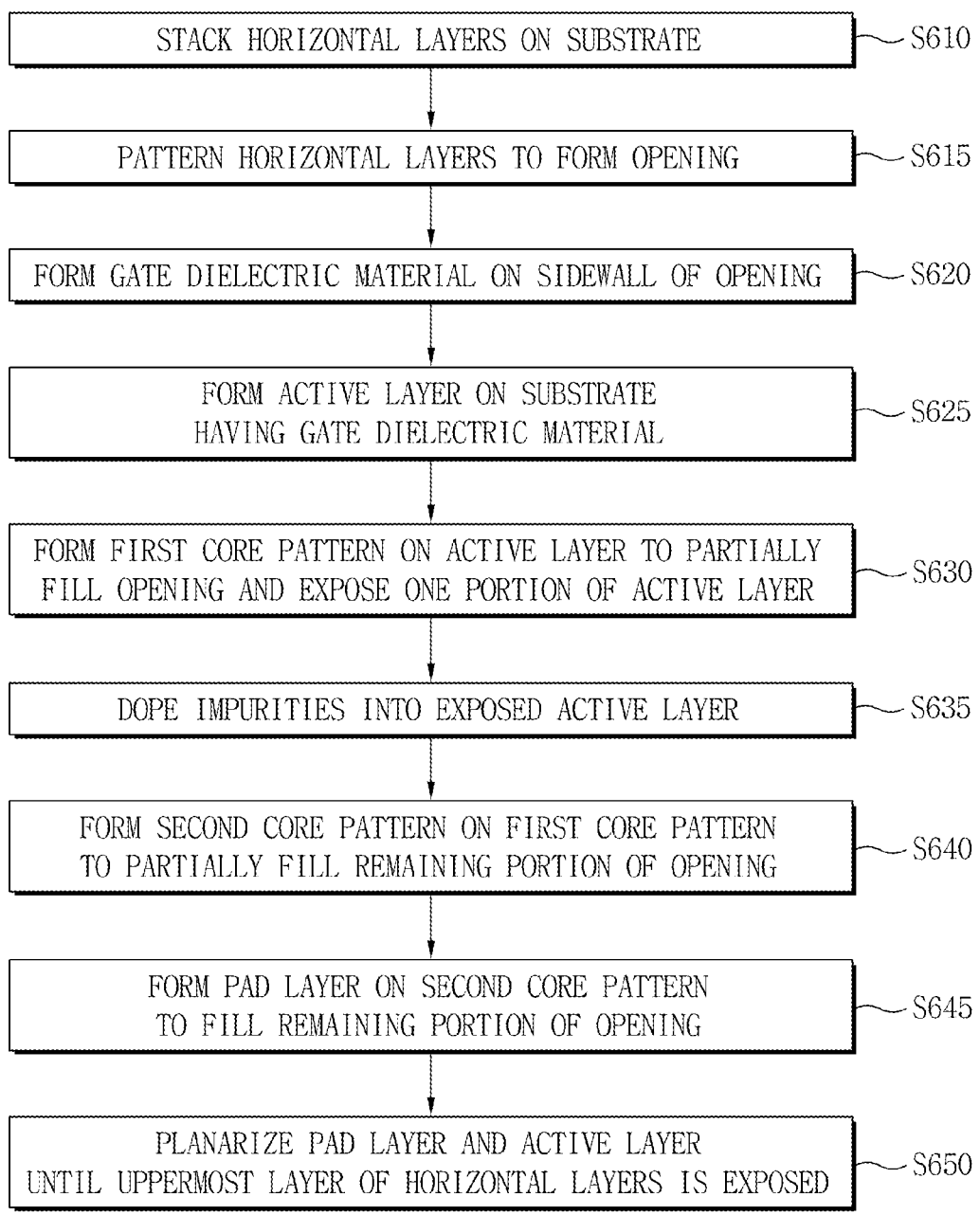
FIG. 44 is a flowchart illustrating a method of fabricating the semiconductor device according to example embodiments of inventive concepts.
Figure 45:
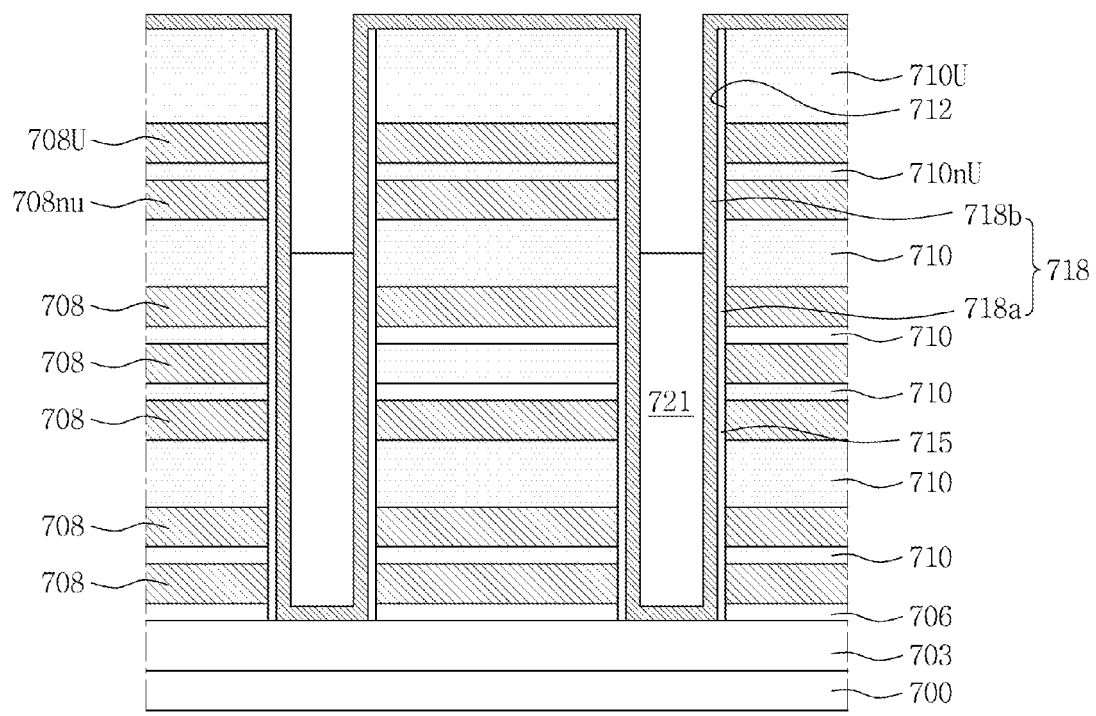
FIGS. 45 and 46 are cross-sectional views illustrating a method of fabricating the semiconductor device according to example embodiments of inventive concepts.
Figure 46:
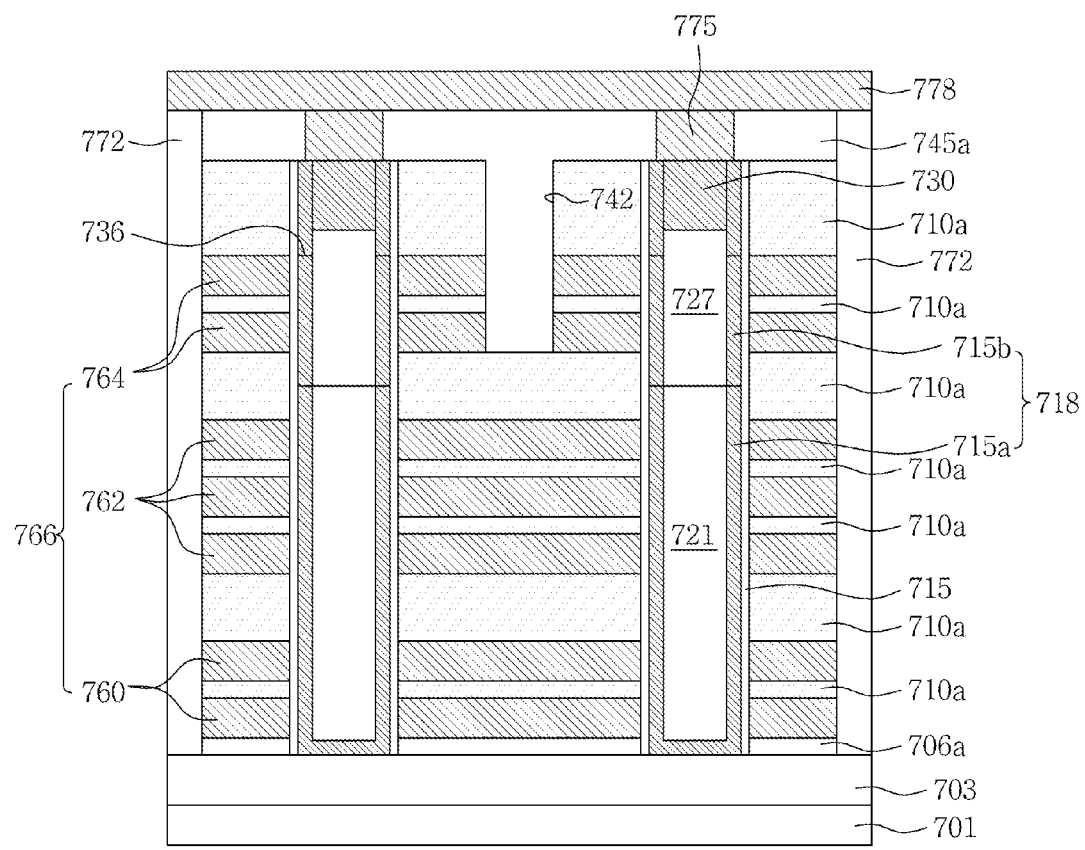

FIG. 44 is a flowchart illustrating a method of fabricating a semiconductor device according to example embodiments of inventive concepts, and FIGS. 45 and 46 are cross-sectional views illustrating the method of fabricating the semiconductor device shown in FIG. 44.

Referring to FIG. 44, horizontal layers may be stacked on a substrate (operation S610). The horizontal layers may be patterned to form an opening (operation S615). A gate dielectric may be formed on a sidewall of the opening (operation S620). An active layer may be conformally formed on the substrate having the gate dielectric (operation S625). A first core pattern may be formed on the active layer to partially fill the opening and expose a portion of the active layer (operation S630). Impurities may be doped into the exposed portion of the active layer (operation S635). A second core pattern may be formed on the first core pattern to partially fill the remaining portion of the opening (operation S640). A pad layer may be formed on the second core pattern to fill the remaining portion of the opening (operation S645). Thereafter, the pad layer and the active layer may be planarized until an uppermost layer of the horizontal layers is exposed (operation S650).

A method of fabricating the semiconductor device according to example embodiments of inventive concepts described with reference to FIG. 44 will now be described with reference to FIGS. 45 and 46.

Referring to FIGS. 44 and 45, a buffer insulating layer 706 may be formed on a substrate 700 having an impurity region 703. Thereafter, horizontal layers 708 and 710 may be formed by alternately and repeatedly stacking conductive layers 708 and interlayer insulating layers 710 on the buffer insulating layer 706 (operation S610). The conductive layers 708 may be spaced apart from one another by the interlayer insulating layers 710 and vertically stacked. The conductive layers 708 may be formed of a conductive material, such as a poly-Si layer, a metal layer, or a metal nitride layer, and patterned to form conductive patterns functioning as electrodes.

Thereafter, as described with reference to FIG. 18A, the interlayer insulating layer 710, the conductive layers 708, and the buffer insulating layer 706 may be patterned to form an opening 712 penetrating the interlayer insulating layers 710, the conductive layers 708, and the buffer insulating layer 706 (operation S615).

Afterwards, a gate dielectric 715 may be formed on a sidewall of the opening 712 (operation S620). The gate dielectric 715 may be formed of the same material layer as the gate dielectric 47 described with reference to FIG. 1B.

Subsequently, an active layer 718 may be conformally formed on the substrate 700 having the gate dielectric 715 (operation S625). A first core pattern 721 may be formed on the active layer 718 to partially fill the opening 712 and expose a portion of the active layer 718 (operation S630).

Thereafter, the doping process 314 described with reference to FIG. 33 may be performed, thereby implanting impurities into the exposed portion of the active layer 718 (operation S635). As a result, as shown in FIG. 33, a first active pattern 718a, which is an undoped pattern, and a second active pattern 718b, which is a doped pattern, may be formed due to the doping process 314. Thus, a similar structure to the structure shown in FIG. 33 may be formed.

Referring to FIGS. 44 and 46, a second core pattern 727 may be formed to partially fill the remaining portion of the opening 712 (operation S640). A pad layer may be formed on the second core pattern 727 to fill the remaining portion of the opening 712 (operation S645). The pad layer and the active layer may be planarized until an uppermost layer of the horizontal layers 708 and 710 is exposed (operation S650). Thus, the pad layer may be patterned to form a pad pattern 730. Thereafter, the doping process described with reference to FIG. 18G may be performed. As a result, a PN junction 736 may be formed within a second active pattern 715b.

Conductive pads may be formed using substantially the same method as described with reference to FIG. 19. That is, the conductive pads may be formed using substantially the same method as the method of forming the sacrificial pads 208P described with reference to FIG. 19.

A cutting region 742 may be formed using substantially the same method as described with reference to FIG. 25A, and an upper capping layer 745 may be formed to fill the cutting region 742. Also, the upper capping layer 743, the horizontal layers 708, and the buffer insulating layer 706 may be patterned using substantially the same method as described with reference to FIG. 27A, thereby forming trenches. Thereafter, isolation patterns 772 filling the trenches may be formed using the method described with reference to FIG. 31. Afterwards, a contact plug 775 may be formed through the upper capping layer 745 and electrically connected to the pad pattern 730, and an interconnection line 778 may be formed on the contact plug 775.

According to embodiments of the inventive concept, semiconductor devices having first and second active patterns formed within an opening penetrating horizontal patterns stacked on a substrate may be provided. The embodiments of the inventive concept provide methods of and structures for selectively doping P-type impurities (e.g., a Group-III element, such as B) into the second active pattern so that dispersion of a threshold voltage of a transistor using the second active pattern as a channel region can be controlled. Meanwhile, the first and second active patterns may be provided to different horizontal widths. Thus, the horizontal width of the second active pattern may be arbitrarily controlled according to required electrical properties of the transistor using the second active pattern as the channel region. For example, the horizontal width of the second active pattern may be reduced to improve the dispersion of the threshold voltage, or the horizontal width of the second active pattern may be increased to improve an on-current characteristic of the transistor.

Figure 47:
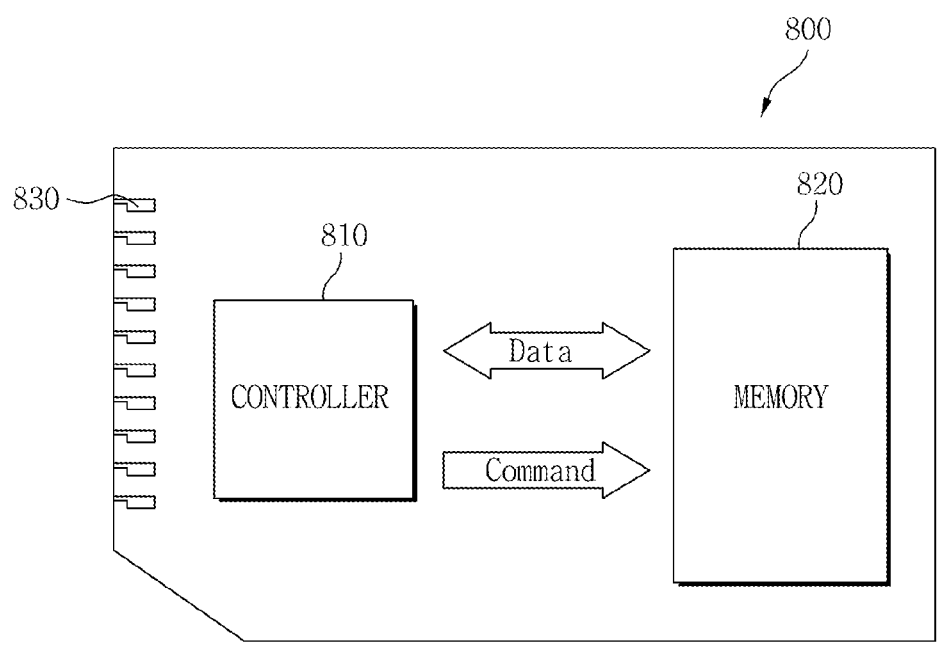
FIG. 47 is a schematic view of a memory card according to example embodiments of inventive concepts.

FIG. 47 is a schematic view of a memory card system including a semiconductor device according to one of embodiments of the inventive concept.

Referring to FIG. 47, a memory card system 800 may be provided. The memory card system 800 may include a controller 810, a memory 820, and an interface 830. The controller 810 and the memory 820 may be configured to transmit and receive commands and/or data. The memory 820 may be used to store commands executed by the controller 810 and/or user's data. Accordingly, the memory card system 800 may store data in the memory 820 or externally output data from the memory 820. The memory 820 may be one of semiconductor devices (e.g., a nonvolatile memory device) described with reference to FIGS. 1 through 46, according to the embodiments of the inventive concept.

The interface 830 may be used to externally input and output data. The memory card system 800 may be a multimedia card (MMC), a secure digital (SD) card, or a portable data storage device.

Figure 48:
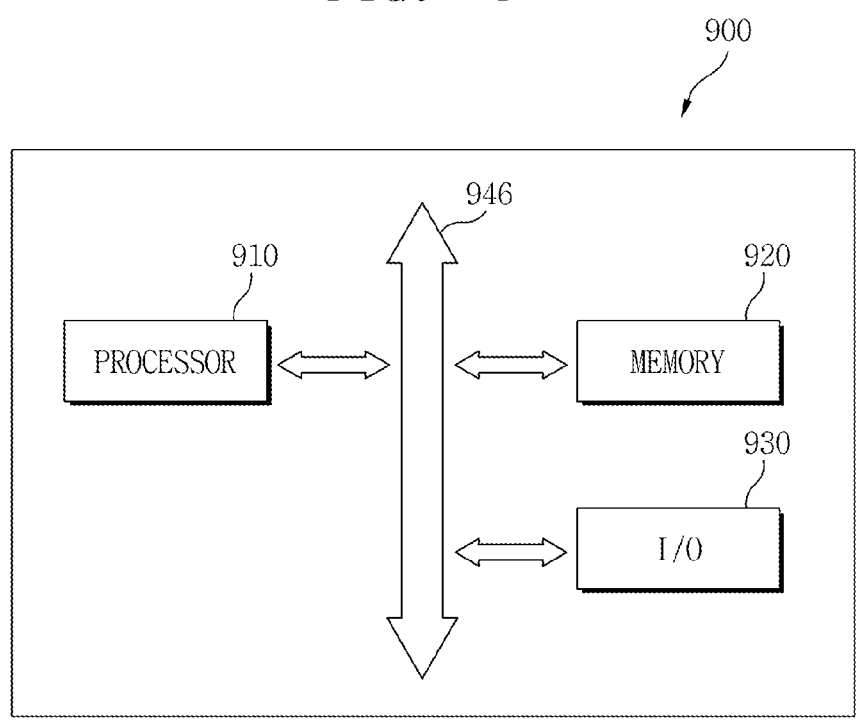
FIG. 48 is a block diagram of an electronic system according to example embodiments of inventive concepts.

FIG. 48 is a block diagram of an electronic device including a semiconductor device according to one of embodiments of the inventive concept.

Referring to FIG. 48, an electronic device 900 may be provided. The electronic device 900 may include a processor 910, a memory 920, and an I/O device 930. The processor 910, the memory 920, and the I/O device 930 may be connected to one another through a bus 940.

The memory 920 may receive control signals, such as RAS*, WE*, and CAS*, from the processor 910. The memory 920 may store codes and data for operations of the processor 910. The memory 920 may be used to store data to be accessed through the bus 940.

The memory 920 may include a semiconductor device (e.g., a nonvolatile memory device) according to one of the embodiments of the inventive concept described with reference to FIGS. 1 through 46. For specific realization and modification of the inventive concept, additional circuits and control signals may be provided.

The electronic device 900 may constitute various electronic control devices that may require the memory 920. For example, the electronic device 900 may be used for a computer system, a wireless communication system (e.g., a personal digital assistant (PDA), a laptop computer, a portable computer, a web tablet, a wireless phone, a portable phone, a digital music player, an MP3 player, a navigator, a solid-state disk (SSD), or a household appliance), or any device capable of transmitting and receiving information in wireless environments.

Specifically embodied and modified examples of the electronic device 900 will now be described with reference to FIGS. 49 and 50.

Figure 49:
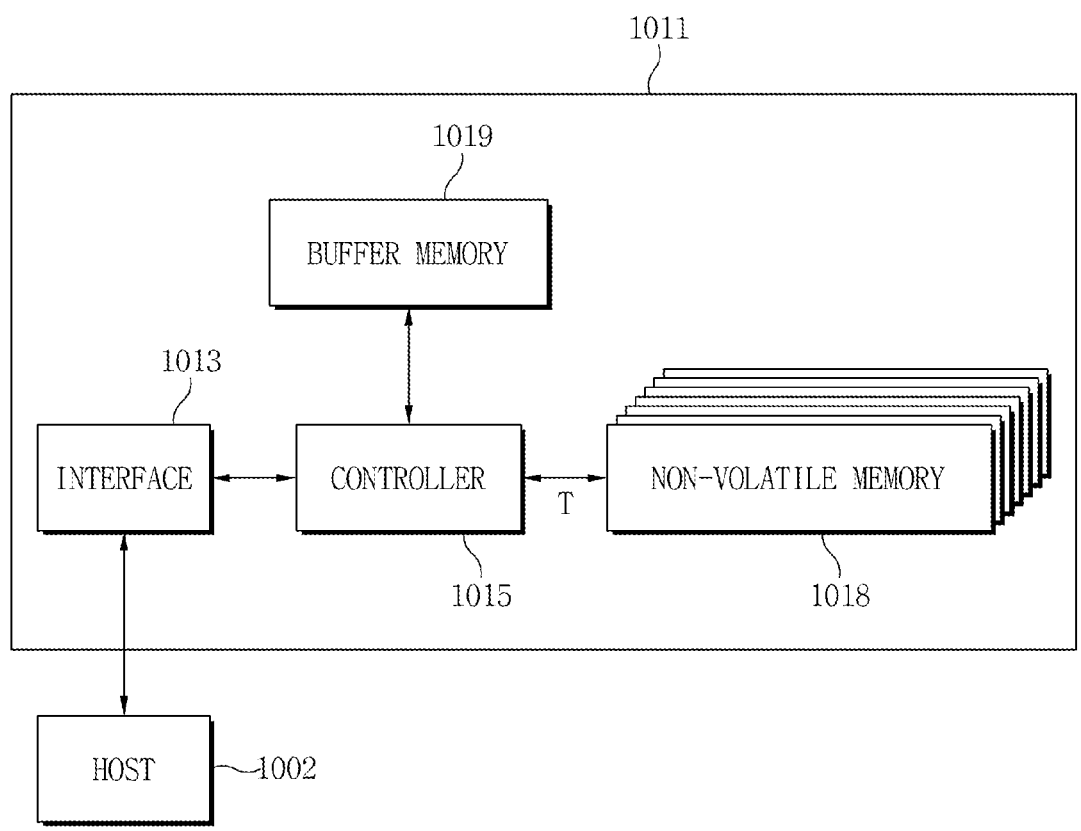
FIG. 49 is a block diagram of a data storage device according to example embodiments of inventive concepts.

FIG. 49 is a block diagram of an electronic device including a semiconductor device according to one of embodiments of the inventive concept.

Referring to FIG. 49, an electronic device may be a data storage device, such as an SSD 1011. The SSD 1011 may include an interface 1013, a controller 1015, a nonvolatile memory 1018, and a buffer memory 1019.

The SSD 1011 may store information using a semiconductor device. As compared with a hard disk drive (HDD), the SSD 1011 may operate at a high speed, reduce a mechanical delay, a failure rate, generation of heat, and noise, and be downscaled and made lightweight. The SSD 1011 may be widely used for laptop personal computers (laptop PCs), desktop PCs, MP3 players, or portable storage devices.

The controller 1015 may be formed adjacent to and electrically connected to the interface 1013. The controller 1015 may be a microprocessor (MP) including a memory controller and a buffer controller. The nonvolatile memory 1018 may be formed adjacent to and electrically connected to the controller 1015 through a connection terminal T. The SSD 1011 may have a data capacity corresponding to the nonvolatile memory 1018. The buffer memory 1019 may be formed adjacent to and electrically connected to the controller 1015.

The interface 1013 may be connected to a host 1002 and serve to transmit and receive electric signals, such as data. For example, the interface 1013 may be an apparatus using a standard such as serial advanced technology attachment (SATA), integrated drive electronics (IDE), small computer system interface (SCSI), and/or a combination thereof. The nonvolatile memory 1018 may be connected to the interface 1013 through the controller 1015.

The nonvolatile memory 1018 may function to store data received through the interface 1013. The nonvolatile memory 1018 may include any one of the semiconductor devices described with reference to FIGS. 1 through 46, according to the embodiments of the inventive concept.

Even if power supplied to the SSD 1011 is interrupted, the nonvolatile memory 1018 may be characterized by retaining the stored data.

The buffer memory 1019 may include a volatile memory device. The volatile memory device may be a dynamic random access memory (DRAM) and/or a static random access memory (SRAM). The buffer memory 1019 may operate at a higher speed than the nonvolatile memory device 1018.

A data processing speed of the interface 1013 may be higher than an operation speed of the nonvolatile memory device 1018. Here, the buffer memory 1019 may function to temporarily store data. After data received through the interface 1013 is temporarily stored in the buffer memory 1019 through the controller 1015, the received data may be permanently stored in the nonvolatile memory 1018 at a data write speed of the nonvolatile memory 1018. Also, among the data stored in the nonvolatile memory 1018, frequently used data may be previously read and temporarily stored in the buffer memory 1019. That is, the buffer memory 1019 may function to increase an effective operating speed of the SSD 1011 and reduce an error rate.

Figure 50:
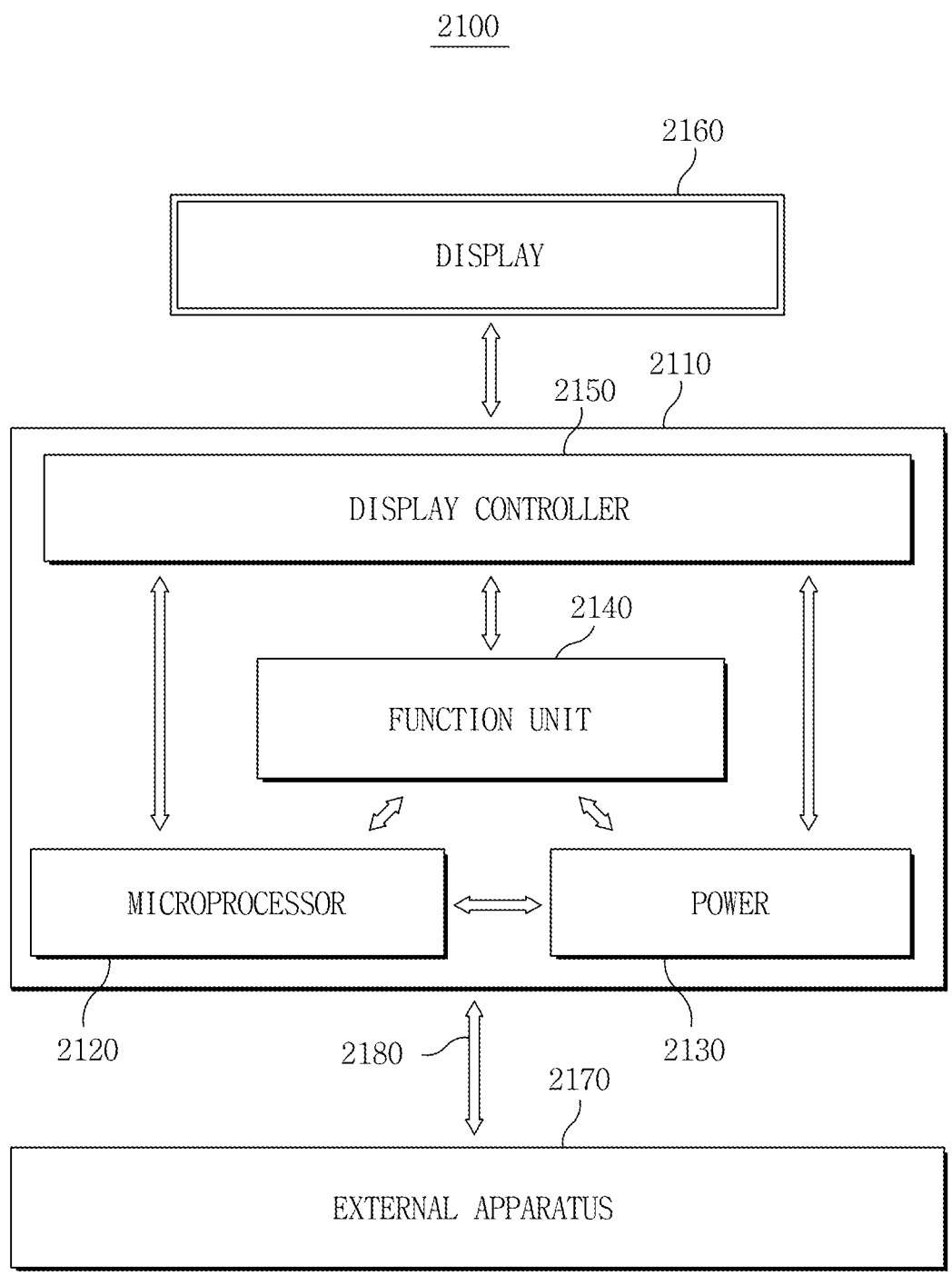
FIG. 50 is a block diagram of an electronic device according to example embodiments of inventive concepts.

FIG. 50 is a block diagram of an electronic system including a semiconductor device according to one of embodiments of the inventive concept.

Referring to FIG. 50, any one of the semiconductor devices described with reference to FIGS. 1 through 46, according to the embodiments of the inventive concept, may be applied to an electronic system 2100. The electronic system 2100 may include a body 2110, a Microprocessor unit 2120, a power unit 2130, a function unit 2140, and a display controller unit 2150. The body 2110 may include a mother board including a printed circuit board (PCB). The Microprocessor unit 2120, the power unit 2130, the function unit 2140, and the display controller unit 2150 may be mounted on the body 2110. The display unit 2160 may be disposed inside the body 2110 or on the surface of the body 2110. For example, the display unit 2160 may be disposed on the surface of the body 2110 and display an image processed by the display controller unit 2150.

The power unit 2130 may function to receive a desired (and/or alternatively predetermined) voltage from an external battery (not shown), divide the voltage into voltages having required voltage levels, and supply the divided voltages to the Microprocessor unit 2120, the function unit 2140, and the display controller unit 2150. The Microprocessor unit 2120 may receive a voltage from the power unit 2130 and control the function unit 2140 and the display unit 2160. The function unit 2140 may serve various functions of the electronic system 2100. For example, when the electronic system 2100 is a portable phone, the function unit 2140 may include several components capable of serving various functions of the portable phone, for example, outputting an image to the display unit 2160 or outputting a voice to a speaker, by dialing or communicating with an external apparatus 2170. When a camera is also mounted, the function unit 2140 may serve as a camera image processor.

In applied embodiments, when the electronic system 2100 is connected to a memory card to increase capacity, the function unit 2140 may be a memory card controller. The function unit 2140 may transmit and receive signals to and from the external apparatus 2170 through a wired or wireless communication unit 2180. Furthermore, when the electronic system 2100 requires a universal serial bus (USB) to increase functionality, the function unit 2140 may serve as an interface controller.

Any one of the semiconductor devices described with reference to FIGS. 1 through 46, according to the embodiments of the inventive concept, may be applied to at least one of the Microprocessor unit 2120 and the function unit 2140.

The foregoing is illustrative of embodiments and is not to be construed as limiting thereof. Although some example embodiments have been described, those skilled in the art will readily appreciate that many modifications are possible without materially departing from the spirit and scope of the claims. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor device comprising:
horizontal patterns stacked on a substrate,
the horizontal patterns defining at least one opening through the horizontal patterns, the horizontal patterns including a first conductive pattern and a second conductive pattern on the first conductive pattern;
a first core pattern in the at least one opening;
a second core pattern in the at least one opening on the first core pattern;
a first active pattern between the first core pattern and the first conductive pattern;
a first gate dielectric pattern between the first active pattern and the first conductive pattern;
a second active pattern between the second core pattern and the second conductive pattern; and
a second gate dielectric pattern between the second active pattern and the second conductive pattern,
the second active pattern containing a first element at a higher concentration than a concentration of the first element in the first active pattern,
wherein each of the first and second gate dielectric patterns includes a first dielectric layer, a second dielectric layer and a third dielectric layer,
wherein the first and second core patterns are formed of an insulating material.

2. The device of claim 1, wherein the first element is a Group-III element.

3. The device of claim 1, wherein the second active pattern contains the first element at a higher concentration than a concentration of the first element in the second core pattern.

4. The device of claim 1, wherein
the second active pattern includes a portion doped with the first element, and the second core pattern is not doped with the first element.

5. The device of claim 1, wherein the first and second active patterns are crystalline semiconductor patterns.

6. The device of claim 1, further comprising:
pad patterns on the second core pattern, wherein
each of the pad patterns is electrically connected to the second active pattern,
each of the pad patterns has an N conductivity type,
a first portion of the second active pattern adjacent to the pad patterns has an N conductivity type,
a second portion of the second active pattern has a P conductivity type, and
the second portion of the second active pattern is under the first portion of the second active pattern.

7. The device of claim 6, wherein
the first and second portions of the second active pattern form a PN junction at a lower level than the pad patterns.

8. The device of claim 1, wherein a vertical thickness of the first core pattern is greater than a vertical thickness of the second core pattern.

9. The device of claim 1, wherein the second active pattern further comprises: a portion between the first and second core patterns.

10. The device of claim 1, wherein
the first and second core patterns have non-equal horizontal widths;
the second active pattern is on the first active pattern; and
a horizontal width of the second active pattern is different than a horizontal width of the first active pattern.

11. The device of claim 10, wherein the horizontal patterns comprise:
an interlayer pattern and the first conductive pattern alternately stacked on the substrate;
a middle insulating pattern and the second conductive pattern alternately stacked on the first conductive pattern,
the middle insulating pattern including a vertical thickness that is greater than a vertical thickness of the interlayer pattern; and
an upper insulating pattern on the second conductive pattern, wherein
a vertical level of an interface between the first and second active patterns is between vertical levels of the first and second conductive patterns.

12. The device of claim 1, wherein a horizontal width of the second active pattern is different than a horizontal width of the first active pattern.

13. A semiconductor device comprising:
   at least one pillar extending through an opening defined by horizontal patterns on a substrate, each pillar including,
      a first core pattern,
      a first active pattern surrounding the first core pattern,
   a second core pattern on the first core pattern,
   a second active pattern surrounding the second core pattern,
      the second active pattern containing a first element at a higher concentration than the first active pattern, and
      a gate dielectric pattern between at least part of the horizontal patterns and the first and second active patterns,
   wherein the first and second core patterns are formed of an insulating material,
   the horizontal patterns include a first conductive pattern and a second conductive pattern on the first conductive pattern,
   the gate dielectric pattern includes a first gate dielectric pattern and a second gate dielectric pattern,
   the first gate dielectric pattern is between the first core pattern and the first conductive pattern,
   the second gate dielectric pattern is between the second core pattern and the second conductive pattern, and
   each of the first and second gate dielectric patterns includes a first dielectric layer, a second dielectric layer and a third dielectric layer.

14. The semiconductor device of claim 13, wherein
   the horizontal patterns include alternating conductive and interlayer patterns stacked on the substrate, and
   each pillar further includes a pad on the second core pattern.

15. The semiconductor device of claim 13, wherein
   a horizontal width of the first active pattern is different than a horizontal width of the second active pattern.

16. A semiconductor system comprising:
   one of a processor and a controller; and
   at least one semiconductor device of claim 13 connected to the one of the processor and the controller.

17. The semiconductor device of claim 2, wherein
   an upper region of the first core pattern includes the Group-III element, and
   the second core pattern is on top of the upper region of the first core pattern.

18. The semiconductor device of claim 13, wherein
   the first element is a Group-III element,
   an upper region of the first core pattern includes the Group-III element; and
   the second core pattern is on top of the upper region of the first core pattern.

19. The device of claim 1, wherein the first dielectric layer is a tunnel dielectric layer,
   wherein the second dielectric layer is a data storage layer,
   wherein the third dielectric layer is a blocking layer,
   wherein the second dielectric layer is interposed between the first dielectric layer and the third dielectric layer, and
   wherein the third dielectric layer is interposed between the second dielectric layer and the horizontal patterns.

20. The device of claim 13, wherein the first dielectric layer is a tunnel dielectric layer,
   wherein the second dielectric layer is a data storage layer,
   wherein the third dielectric layer is a blocking layer,
   wherein the second dielectric layer is interposed between the first dielectric layer and the third dielectric layer, and
   wherein the third dielectric layer is interposed between the second dielectric layer and the horizontal patterns.

* * * * *